United States Patent [19]

Nakagawa et al.

[11] Patent Number: 4,959,106
[45] Date of Patent: Sep. 25, 1990

[54] PHOTOVOLTAIC ELEMENT WITH A SEMICONDUCTOR LAYER COMPRISING NON-SINGLE CRYSTAL MATERIAL CONTAINING AT LEAST ZN, SE AND H IN AN AMOUNT OF 1 TO 4 ATOMIC %

[75] Inventors: Katsumi Nakagawa, Nagahama; Masahiro Kanai, Tokyo; Shunichi Ishihara; Kozo Arao, both of Hikone; Yasushi Fujioka, Nagahama; Akira Sakai, Nagahama; Tsutomu Murakami, Nagahama, all of Japan

[73] Assignee: Canon Kabushiki Kaisha, Tokyo, Japan

[21] Appl. No.: 399,396

[22] Filed: Aug. 28, 1989

Related U.S. Application Data

[63] Continuation of Ser. No. 222,093, Jul. 20, 1988, abandoned.

[30] Foreign Application Priority Data

Jul. 21, 1987 [JP] Japan ............... 62-179927
Aug. 19, 1987 [JP] Japan ............... 62-205916
Aug. 19, 1987 [JP] Japan ............... 62-205917

[51] Int. Cl.$^5$ ............... H01L 31/06; H01L 31/0392; H01L 31/0368
[52] U.S. Cl. ............... 136/258; 136/260; 136/264; 136/265; 357/16; 357/30; 357/59
[58] Field of Search ............... 136/258 PC, 260, 264, 136/265; 357/30 B, 30 E, 30 J, 30 K, 16, 61, 63, 59 D

[56] References Cited

U.S. PATENT DOCUMENTS 4,596,645  6/1986  Stirn ............... 204/192.25

*Primary Examiner*—Aaron Weisstuch
*Attorney, Agent, or Firm*—Fitzpatrick, Cella Harper & Scinto

[57] ABSTRACT

A photovoltaic element which generates photoelectromotive force by the contact of a p-type semiconductor layer and an n-type semiconductor layer, characterized in that at least one of said semiconductor layers is made up from a deposited film composed of zinc atoms, selenium atoms, optional tellurium atoms, and at least hydrogen atoms, said deposited film containing a p-type or n-type doping agent, containing 1 to 4 atomic % of hydrogen atoms, containing selenium atoms and tellurium atoms in a ratio of 1:9 to 3:7 (in terms of number of atoms), and also containing crystal grains in a ratio of 65 to 85 vol % per unit volume.

9 Claims, 21 Drawing Sheets (A)

(B)

(C)

Dark conductivity of n-type doped film (when the hydrogen(H) content is 2 atomic %)

PHOTOVOLTAIC ELEMENT WITH A SEMICONDUCTOR LAYER COMPRISING NON-SINGLE CRYSTAL MATERIAL CONTAINING AT LEAST ZN, SE AND H IN AN AMOUNT OF 1 TO 4 ATOMIC %

This application is a continuation of application Ser. No. 222,093, filed July 20, 1988, now abandoned.

FIELD OF THE INVENTION

The present invention relates to an improved photovoltaic element which is usable as a power source for electric appliances and also as a power generator. More particularly, it is concerned with an improved photovoltaic element with PN junction which exhibits a high photoelectric conversion efficiency, particularly for short-wavelength light.

BACKGROUND OF THE INVENTION

There have been proposed a variety of photovoltaic elements for solar cells and for power sources in electric appliances. They utilize the pn junction formed by ion implantation or thermal diffusion of impurities into a substrate of single crystal of silicon (Si) or gallium arsenide (GaAs), or by epitaxial growth of an impurity-doped layer on a substrate of such single crystal. However, there is a disadvantage for these photovoltaic elements that their production cost unavoidably becomes high because of using a single crystal substrate. Because of this, they have not yet gained general acceptance for use as a solar cell or as a power source in electric appliances.

Recently, there has been proposed a photovoltaic element in which there is utilized a pin junction of amorphous silicon (hereinafter referred to as "A-Si") deposited film formed on an inexpensive substrate of non-single crystal material such as glass, metal, ceramics, and synthetic resin by way of the glow discharge decomposition method. This photovoltaic element has a nearly satisfactory performance and is of low production cost and because of this, it has been recognized as usable as a power source for some kinds of appliances such as electronic calculators and wrist watches.

However, for this photovoltaic element, there is a disadvantage that the output voltage is low because the band gap of the A-Si film constituting the element is 1.7 eV, which is not large enough. There is another disadvantage that its photoelectric conversion efficiency is low for a light source such as fluorescent light which contains more short-wavelength light, so that its application is limited to appliances with very small power consumption.

There is a further disadvantage for said photovoltaic element that the constituent A-Si film is often affected by the so-called Staebler-Wronski effect, in which the film characteristics are deteriorated upon continuous irradiation with intense light for a long period of time.

For a photovoltaic element to be utilized as a power supplying solar cell, it is necessary to convert efficiently and continuously the light energy of sunlight into electric energy, and hence, it is desired to have such a layer structure that permits photoelectric conversion for sunlight over as broad a spectrum range as possible.

Now, in the case where a photovoltaic element is made of a semiconductor material having a small band gap energy, the wavelength region of light to be absorbed by the layer will be extended from the short wavelength side to the long wavelength side. However, in this case, it is the long-wavelength component of sunlight alone that contributes to photoelectric conversion, and the energy of the short-wavelength component is not utilized for photoelectric conversion. This is because the amount of energy to be taken out by the photoelectric conversion is determined by the band gap energy of the semiconductor material as used.

On the other hand, in the case where a photovoltaic element is made of a semiconductor material with a large band gap energy, the wavelength component which is absorbed by the layer and contributes to photoelectric conversion is the short wavelength light having an energy greater than the band gap energy of the semiconductor material, and the long-wavelength component is not utilized for photoelectric conversion.

In a photovoltaic element, the maximum voltage or open-circuit voltage (Voc) to be supplied is determined by the band gap energy of the semiconductor materials utilized. In order to obtain a high Voc, semiconductor materials having a large band gap energy are desirable.

Therefore, there is eventually a limit for the photoelectric conversion efficiency for a photovoltaic element prepared by using a single semiconductor material.

The foregoing led to the idea of forming a plurality of photovoltaic elements using a plurality of semiconductor materials each having a different band gap energy, so that the individual photovoltaic elements become responsible for utilizing the different wavelength regions of sunlight. This idea was expected to contribute to an improvement in the photoelectric conversion efficiency.

However, there is a disadvantage for the solar cell having such a structure as mentioned above in that overall high photoelectric conversion is possible only in the case where the individual photovoltaic elements have good characteristics, because it is of such structure that a plurality of photovoltaic elements are stacked to form an electrically serial structure Unfortunately, for the photovoltaic element having the foregoing structure, there has not yet been realized any desirable one wherein the respective constituent elements as stacked have satisfactory values of band gap energy and satisfactory characteristics as desired and provides a high Voc as the photovoltaic element.

There have been proposed direct transition-type semiconductor films having a wide band gap, such as ZnSe (having a band gap of 2.67 eV) and ZnTe (having a band gap of 2.26 eV) and mixed crystals thereof $ZnSe_{1-x}Te_x$ (where $0<x<1$). Public attention has been focused on these semiconductor films. These semiconductor films are, in general, formed on a substrate of single crystal by way of epitaxial growth. The as grown film of ZnSe exhibits n-type conductivity and the as-grown film of ZnTe exhibits p-type conductivity. However, for any of these films, it is generally recognized that it is difficult for the film to exhibit opposite type conductivity. Further, in order to carry out the epitaxial growth for the film formation, it is required to use a specific substrate of single crystal and to maintain the substrate at elevated temperature. And in this film formation, the deposition rate is low. Because of this, it is impossible to perform epitaxial growth on a commercially available substrate which is inexpensive and low heat-resistant such as glass and synthetic resin These factors make it difficult to develop practically applicable semiconductors films using the foregoing commercially available substrates.

Even in the case where a semiconductor film should be fortunately formed on such commercially available substrate, the film will be such that is usable only in very limited applications.

In fact, there have been various proposals to form a direct transition-type semiconductor film on a non-single crystal substrate such as glass, metal, ceramics and synthetic resin. However, under any of such proposals, it is difficult to obtain a desired direct transition-type semiconductor film having satisfactory electrical characteristics because the resulting film is accompanied with defects of various kinds which make the film poor in electrical characteristics and on account of this, it is difficult for the film to be controlled by doping it with an impurity.

In the meantime, an amorphous film composed of Zn and Se elements is described in U.S. Pat. No. 4,217,374 (called "literature 1"hereinafter) and also in U.S. Pat. No. 4,226,898 (called "literature 2"hereinafter). And ZnSe compound is described in Japanese Patent Laid-open No. 189649/1986 (called "literature 3"hereinafter) and Japanese Patent Laid-open No. 189650/1986 (called "literature 4"hereinafter).

Now, literature 1 discloses amorphous semiconductor films containing selenium (Se), zinc (Zn), hydrogen (H) and lithium (Li); but the principal subject is amorphous selenium semiconductor films, and the Zn described therein is merely an additive, as are Li and H. And as for the Zn and the Li, likewise in the case of the H, they are used for reducing the localized state density in the band gap energy without changing the inherent characteristics of the film. In other words, the addition of Zn to the amorphous Se film mentioned in literature 1 is not intended to positively form a ZnSe compound. Incidentally, literature 1 mentions nothing about the ZnSe compound and the formation of ZnSe crystal grains. Regarding the addition of Li, it should be noted that it is not added as a dopant.

Literature 2 does mention amorphous semiconductor films containing Se, Zn, and H. However, it deals mainly with amorphous silicon, and it defines Se as an element which forms a compound with said silicon. As for the Zn, it is defined as an element which sensitizes the photoconductivity and reduces the localized state density in the energy gap. In other words, the additions of Zn and Se are not intended to form a ZnSe compound. Incidentally, literature 2 mentions nothing about the ZnSe compound and the formation of ZnSe crystal grains.

Literature 3 and literature 4 are concerned with the deposition of a ZnSe film by the HR-CVD method (hydrogen radical assisted CVD method). That is, they disclose methods of improving the deposition rate and the productivity of a deposited film; but they merely mention deposited films of non-doped ZnSe.

Against this background, there is an increased social demand to provide an inexpensive photovoltaic element having a high photoelectric conversion efficiency, particularly, for short-wavelength light which may be practically usable as a solar cell and also as a power source in various electric appliances.

SUMMARY OF THE INVENTION

The present invention is aimed at solving the aforementioned problems relating to photovoltaic elements for use in solar cells and other appliances and satisfying the foregoing social demand.

It is therefore an object of the present invention to provide an improved photovoltaic element usable in devices typified by a solar cell having an improved functional deposited film which may be desirably formed even on a commercially available inexpensive non-single crystal substrate of glass, metal, ceramics or synthetic resin and which may form a pn junction with another film formed on such substrate.

Another object of the present invention is to provide an improved photovoltaic element with a pn junction which provides a high photoelectric conversion particularly for short-wavelength light and which is usable in devices typified by a solar cell.

DETAILED DESCRIPTION OF THE INVENTION

Figure 1:
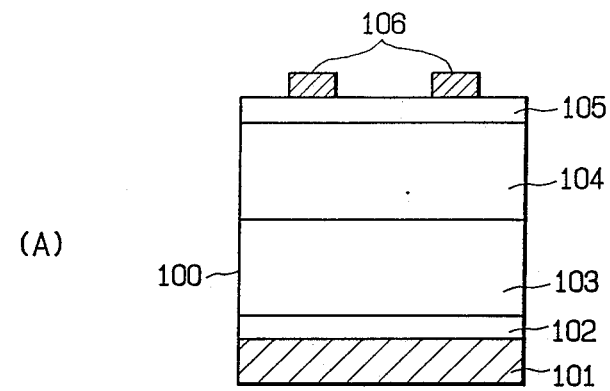
FIGS. 1(A) and 1(B) are schematic representations showing the typical layer structure of the photovoltaic element of the present invention.
FIG. 1(C) is a schematic representation showing the layer structure of a photovoltaic element prepared in a Comparative Example.
Figure 1:
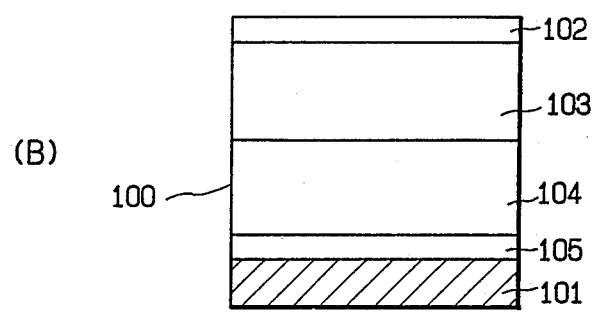
Figure 1:
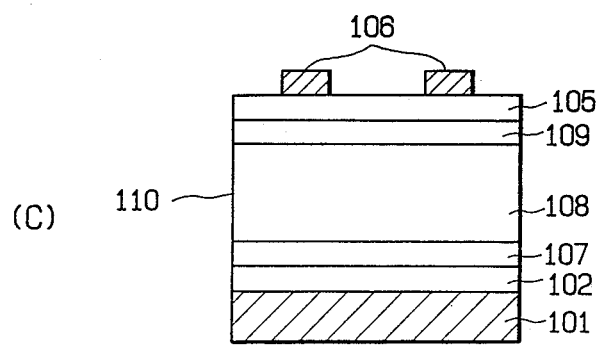

The present inventors have made extensive studies for overcoming the foregoing problems not only of the known ZnSe films but also the known $ZnSe_{1-x}Te_x$ films for use in various devices such as solar cells and attaining the objects as described above and as a result, have accomplished the present invention based on the findings obtained through various experiments as below described.

That is, as a result of preparing a ZnSe deposited amorphous film in which a specific amount of hydrogen atoms was incorporated and the proportion of crystal grains per unit volume being controlled to a specific value (this deposited film is hereinafter referred to as "ZnSe:H film"), the present inventors have found that (a) the ZnSe:H film may be formed in a desired state even on a non-single crystal substrate of glass, metal, ceramics or synthetic resin: (b) the ZnSe:H film formed on such non-single crystal substrate is accompanied with very few defects: (c) it can be easily and efficiently doped with a dopant of p-type or n-type: and (d) when doped with a p-type dopant, it becomes a desirable p-type ZnSe:H semiconductor film.

Then, as a result of preparing a $ZnSe_{1-x}Te_x$ deposited amorphous film in which the ratio between the amount of Se and the amount of Te was controlled to a specific value, a specific amount of hydrogen atoms being incorporated and the proportion of crystal grains per unit volume was controlled to a specific value (this deposited film is hereinafter referred to as "$ZnSe_{1-x}Te_x$:H film"), the present inventors have found that (e) the $ZnSe_{1-x}Te_x$:H film may be formed in a desired state even on a non-single crystal substrate of glass, metal, ceramics or synthetic resin: (f) the $ZnSe_{1-x}Te_x$ film formed on such non-single crystal substrate is accompanied with very few defects: (g) it can be easily and efficiently doped with a dopant of p-type or n-type: and (h) when doped with a p-type dopant, it becomes a desirable p-type $ZnSe_{1-x}Te_x$:H semiconductor film.

The present inventors further found that the foregoing ZnSe:H films and the foregoing $ZnSe_{1-x}Te_x$:H films have a wealth of practically applicable semiconductor characteristics and in the case where one or more of the foregoing films is employed in the pn junction in the preparation of a photovoltaic element, there is obtained a photovoltaic element which generates a desired photoelectromotive force.

The present invention has been completed on the basis of these findings.

The gist of the present invention resides in the following three kinds of photovoltaic elements:

(1) a photovoltaic element which generates photoelectromotive force by the contact of a p-type semiconductor layer with an n-type semiconductor layer, characterized in that one of said semiconductor layers is made from a deposited film comprising zinc atoms, selenium atoms, and at least hydrogen atoms, said deposited film containing an element belonging to Group I or Group V of the periodic table as a p-type dopant, containing 1 to 4 atomic % of hydrogen atoms, and also containing crystal grains in a ratio of 65 to 85 vol % per unit volume, and the other of said semiconductor layers is made from a deposited film represented by the general formula ZnA (where A denotes an oxygen atom, sulfur atom, or selenium atom) or any one of the general formulas ZnTe, $ZnSe_{1-y}Te_y$ (where $0<y<1$), and CdTe;

(2) a photovoltaic element which generates photoelectromotive force by the contact of a p-type semiconductor layer with an n-type semiconductor layer, characterized in that one of said semiconductor layers is made from a deposited film comprising zinc atoms, selenium atoms, tellurium atoms, and at least hydrogen atoms, said deposited film containing an element belonging to Group I or Group V of the periodic table as a p-type dopant, containing selenium atoms and tellurium atoms in a ratio of 1:9 to 3:7 (in terms of number of atoms), containing 1 to 4 atomic % of hydrogen atoms, and also containing crystal grains in a ratio of 65 to 85 vol % per unit volume, and the other of said semiconductor layers is made from a deposited film represented by the general formula ZnA (where A denotes an oxygen atom, sulfur atom, or selenium atom) or any one of the general formulas ZnTe, $ZbSe_{1-y}Te_y$ (where $0<y<1$), and CdTe; and (3) a photovoltaic element which generates photoelectromotive force by the contact of a p-type semiconductor layer with an n-type semiconductor layer, characterized in that one of said semiconductor layers is made from a deposited film composed of zinc atoms, selenium atoms, and at least hydrogen atoms, said deposited film containing a p-type dopant or n-type dopant, containing 1 to 4 atomic % of hydrogen atoms, and also containing crystal grains in a ratio of 65 to 85 vol % per unit volume, and the other of said semiconductor layers is made from a deposited film composed of zinc atoms, selenium atoms, tellurium atoms, and at least hydrogen atoms, said deposited film containing selenium atoms and tellurium atoms in a ratio of 1:9 to 3:7 (in terms of number of atoms), and also containing crystal grains in a ratio of 65 to 85 vol % per unit volume.

The experiments carried out by the present inventors are explained in the following.

Experiment A: Investigation of the ratio of crystal grain domain formed when hydrogen atoms are introduced into the ZnSe film (1) Preparation of samples (i) A first substrate is a round silicon wafer, 0.5 mm thick and 1 inch in diameter, having a resistivity ($\rho$) of about $10^{-1}$ $\Omega$-cm), on which is formed an $SiO_2$ film, about 5000 Å thick, by thermal oxidation treatment in an oxygen gas stream at 1000° C. A second substrate is a square quartz glass measuring 2.5 cm by 2.5 cm.

Figure 2:
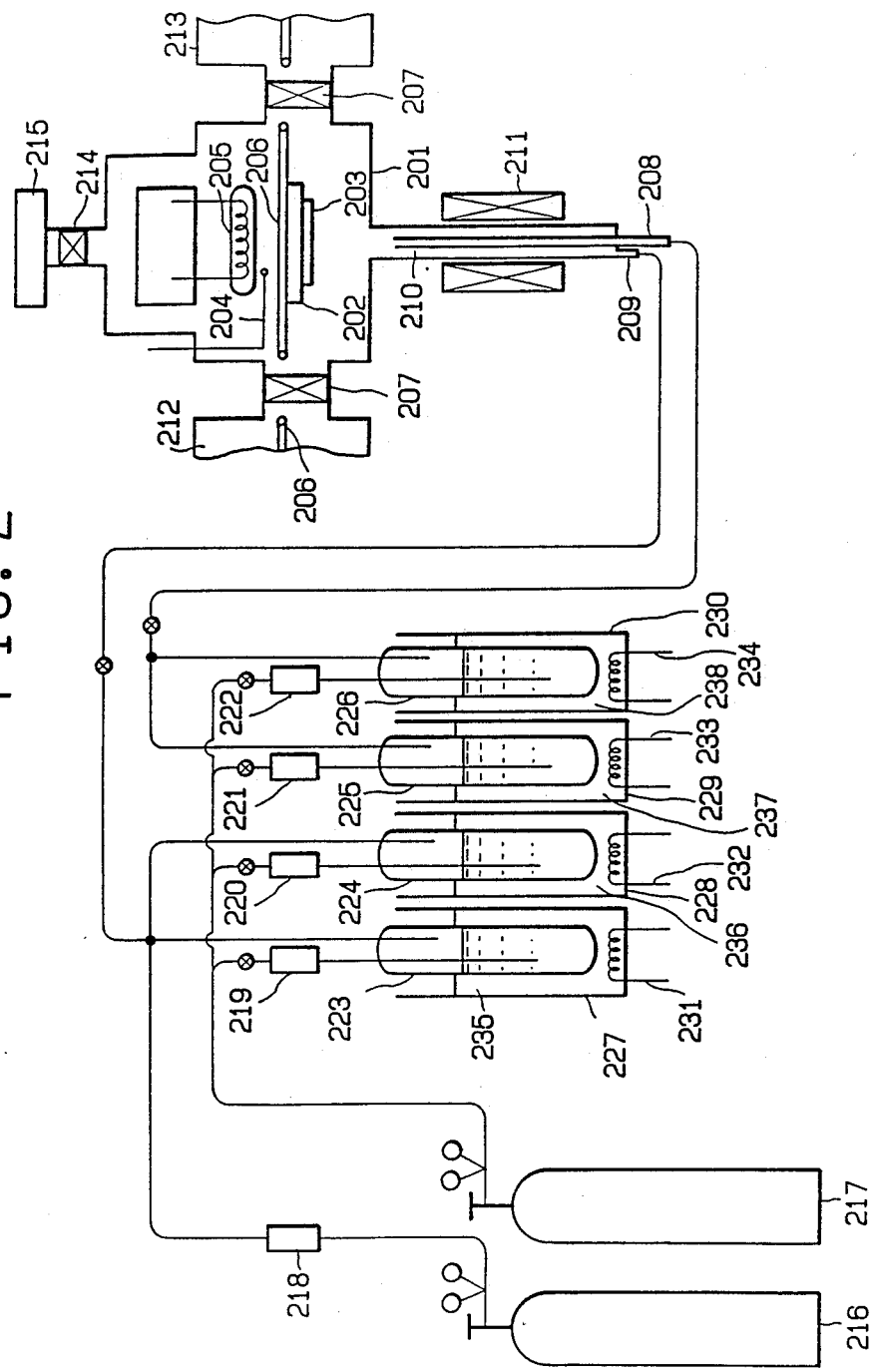
FIG. 2 is a schematic diagram showing the apparatus for forming a deposited film according to process (1) of the present invention.

(ii) The above-mentioned two substrates were placed side by side on the substrate holder 202 of the known apparatus as shown in FIG. 2. On the substrates were formed a ZnSe:H film under the conditions shown in Table 1. Thus there were obtained samples Nos. 1~12 and samples Nos. 1'~12'.

(iii) Each of samples Nos. 1~12 (deposited on silicon wafers) was cut in half. Each of the cut halves was cut to a 5 mm square size which matches the holder of a transmission electron microscope (TEM). The cut piece was fixed to a glass plate, measuring 50 mm by 50 mm and 1 mm thick, by the aid of wax, with the deposited film in contact with the glass surface so that the deposited film is visible through the opposite side of the glass plate.

(iv) The exposed part (silicon single crystal wafer) of the sample as prepared in (iii) was etched with an aqueous solution of HF, $HNO_3$, and $CH_3COOH$. The etching rate was properly controlled by changing the concentration of HF in the etching solution. Etching was continued until the silicon single crystal wafer was completely removed. The progress of etching was confirmed by observing the light passing through the deposited film.

(v) After etching, the wax was removed by the aid of an organic solvent (toluene), and the deposited film was separated from the glass plate, followed by rinsing and air drying. Thus there was obtained a film specimen composed of an $SiO_2$ film and a ZnSe:H film.

(2) Examination of film specimen prepared in (1)

Each film specimen of samples Nos. 1~12 formed on silicon wafers in step (1) was examined by means of a TEM (with an acceleration voltage of 200 keV). The transmission image contained a lattice image with very few lattice defects in that part of the ZnSe:H film where the crystal grain domains exist. It was found that the lattice images are uniformly distributed throughout the ZnSe:H film.

The lattice image was utilized to estimate the number of crystal grain domains present in a certain area of the film specimen. Thus the ratio in terms of vol % of the crystal grain domains in the deposited film was calculated.

For the reference purpose, the direction of the crystal grain and the size of the crystal grain domain were measured by the aid of X-ray diffraction.

(3) Determination of hydrogen in the deposited film (i) Each of samples Nos. 1'~12' deposited on quartz substrates in the above-mentioned step (1)-(i) was cut in half. Each of the cut halves was placed in a vacuum chamber and heated therein from room temperature to 1000° C. During the heating period, the amount of hydrogen (H) released from the specimen was determined by means of a mass spectrometer. The resulting data were compared with these of the standard sample prepared by implanting a known amount of hydrogen into a hydrogen-free sample.

(ii) Each deposited film of samples Nos. 1~12 used for TEM observation was examined for the distribution of Zn atoms and Se atoms by the aid of an X-ray microanalyzer ("XMA"for short), made by Shimadzu Seisakusho Ltd., and was also subjected to elemental analysis. The results are shown in Table 2.

The data obtained from all of samples Nos. 1~12 indicate that Zn atoms and Se atoms are uniformly distributed in the deposited film and Zn atoms and Se atoms constitute the deposited film at a stoichiometric ratio close to 1:1.

(4) Results

The results of the measurements in steps (2) and (3) mentioned above are graphically represented in FIG. 5.

Figure 5:
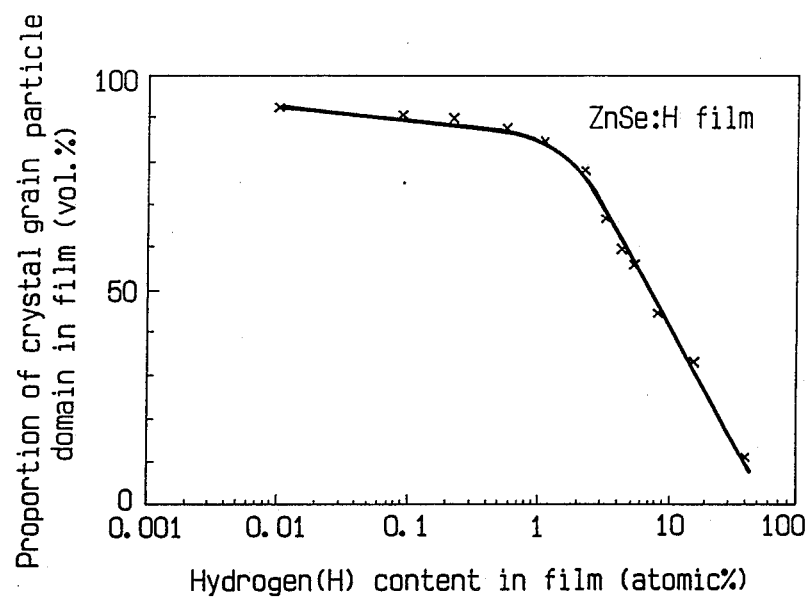
FIG. 5 is a graph showing the relation between the ratio of crystal grain domains and the content of hydrogen (H) in films formed in Experiments A(2) and A(3).

It is noted from FIG. 5 that as the content (atomic%) of hydrogen atoms (H) in the ZnSe:H film increases, the ratio of the crystal grain domains per unit volume in the deposited film decreases. With the content of hydrogen atoms in the range of 0.1 to 10 atomic%, the ratio of crystal grain domains per unit volume in the film ranges from 90 to 40 vol%.

In the sample preparation step (1) mentioned above, the flow rate of hydrogen gas should be properly controlled. With a flow rate lower than 0.05 sccm, the deposited film is composed mainly of Zn; and with a flow rate in excess of 2 slm, no film is deposited.

Experiment B: Investigation of the relation between the electrical characteristics of the deposited film and the content of hydrogen atoms in the deposited film and also the ratio of crystal grain domains per unit volume in the deposited film The deposited film formed on the quartz substrate in A-(1)-(ii) mentioned above was examined for dark conductivity. The experiment was carried out using the remaining cut halves of samples Nos. 1'~12'. Prior to measurements, a comb-shaped aluminum electrode was formed on the specimen by vacuum deposition. The results are shown in FIG. 6.

Figure 6:
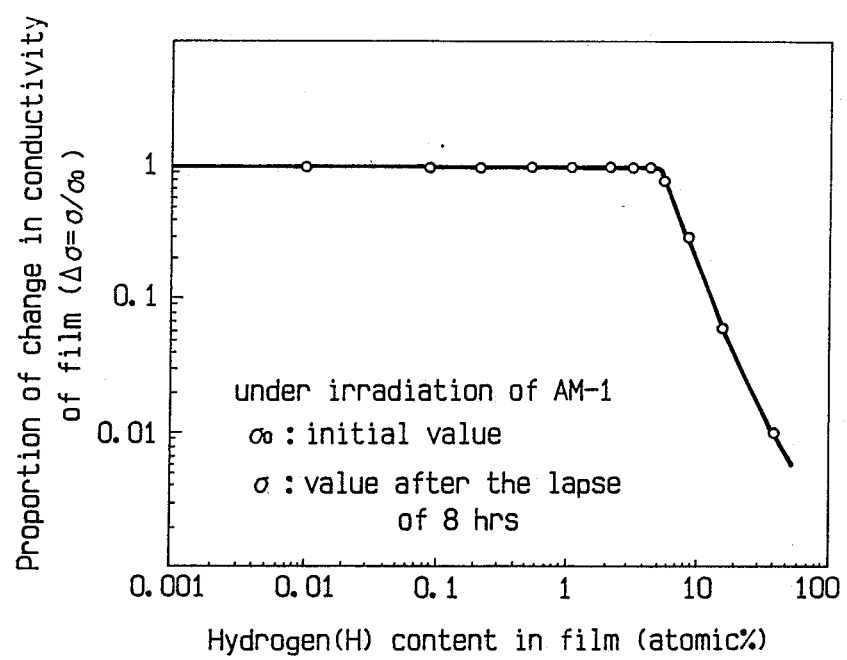
FIG. 6 is a graph showing the relation between the content of hydrogen and the change in conductivity of the films formed in Experiment B.

It is noted from FIG. 6 that the change of dark conductivity ($\sigma$) which occurs after irradiation with AM-1 for 8 hours varies depending on the content of hydrogen atoms (H) in the film. With 4 atomic% or less, almost no change occurs, and with 8 atomic% and above, a significant change occurs. (The ratio of change $\Delta\sigma$ is expressed by $\sigma/\sigma_0$, where $\sigma_0$ is an initial value and $\sigma$ is a value measured after irradiation for 8 hours.)

The relation between the drift mobility of holes and the hydrogen content in the deposited film was investigated using the remaining cut halves of samples Nos. 1~12 prepared in A-(1)-(ii) mentioned above. (The ZnSe:H film was deposited on an $SiO_2$ film formed on an Si-wafer.) Prior to measurements, each specimen was provided with an aluminum semitransparent film by vacuum deposition. The specimen was irradiated with UV light pulses (about 1 nsec) while a pulse voltage was being applied across the aluminum film and the silicon wafer, with the aluminum film being negative. The drift mobility was measured by the time-of-flight method. The results are shown in FIG. 7.

Figure 7:
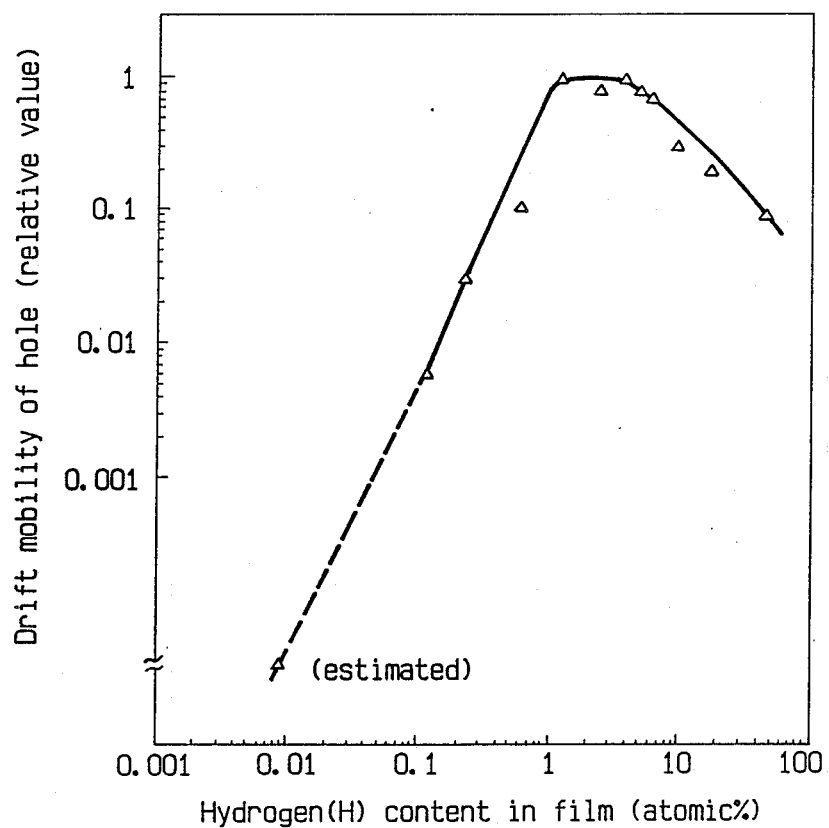
FIG. 7 is a graph showing the relation between the content of hydrogen and the drift mobility of holes in films formed in Experiment B.

The following is noted from FIG. 7. With a hydrogen content less than 0.5 atomic%, the drift mobility of holes is very small. With a hydrogen content in the range of 1 to 8 atomic%, the drift mobility of holes is very high. With a hydrogen content in excess of 8 atomic%, the drift mobility of holes gradually decreases.

The above-mentioned results suggest that the content of hydrogen atoms in the deposited film should be 8 atomic% or less, preferably 4 atomic% or less, from the standpoint of change in characteristics induced by the irradiation of light, and 0.5 atomic% or more, preferably 1 atomic% or more, from the standpoint of the mobility of holes.

According to FIG. 5, the ratio of the crystal grain domains per unit volume in the ZnSe:H deposited film is in the range of 65 to 85 vol% if the deposited film contains 1 to 4 atomic% of hydrogen atoms.

It is concluded from the foregoing that the electrical characteristics of the ZnSe:H deposited film depend largely on the content of hydrogen atoms (H) in the film and also on the ratio of crystal grain domains per unit volume in the film. For example, if the deposited film is to have the electrical characteristics suitable for use as solar cells or similar devices, the hydrogen content should be in the range of 1 to 4 atomic% and the ratio of crystal grain domains should be in the range of 65 to 85 vol%.

Experiment C: Investigation of the relation between the doping characteristics of the deposited film and the content of hydrogen atoms in the deposited film and also the ratio of crystal grain domains per unit volume in the deposited film (1) The procedure of Experiment A was repeated, except that $LiCH_3H_7$ ($1.0 \times 10^{-10}$ mol/min) was added to the raw material gas (A), to form a ZnSe:H:Li film on a silicon wafer (with an $SiO_2$ film formed thereon) and a quartz glass substrate. Thus there were obtained samples Nos. 13~24 and samples Nos. 13'~24'.

(2) Each of samples Nos. 13'~24' (deposited on quartz glass substrates) was cut in half. One half was used for the measurement of dark conductivity after the formation of a comb-shaped aluminum electrode by vacuum deposition. The other half was used for the measurement of hydrogen content in the same manner as in Experiment A mentioned above.

Figure 8:
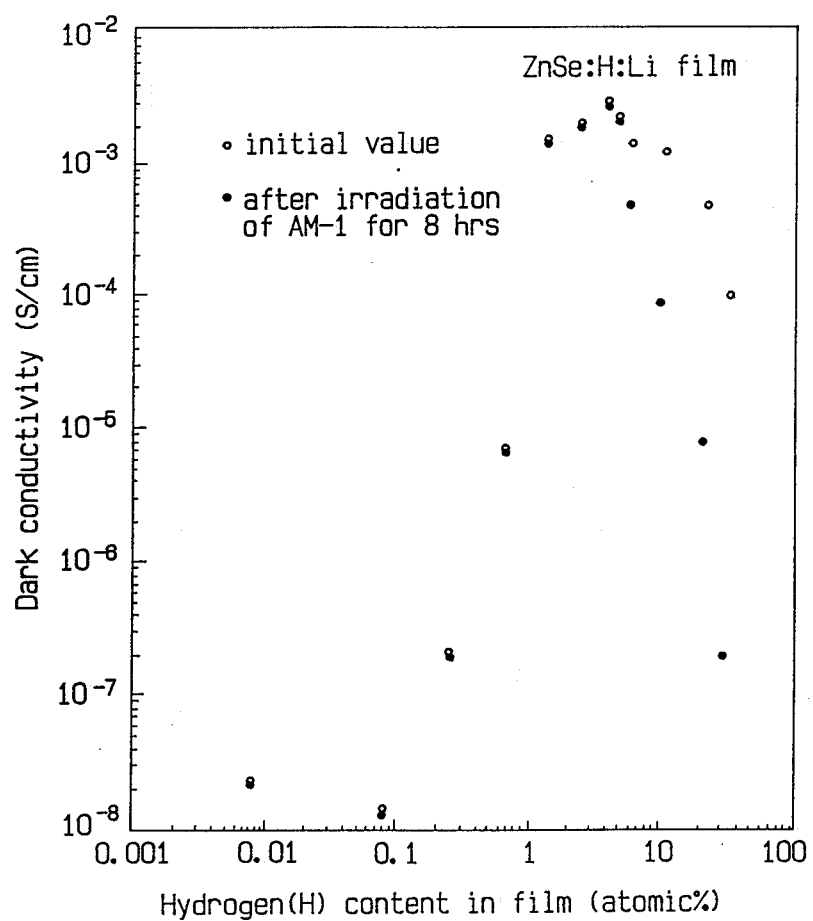
FIG. 8 is a graph showing the relation between the content of hydrogen and the dark conductivity of films formed in Experiment C.

The results of measurements are shown in FIG. 8. In the figure, white circles (○) represent the dark conductivity of the ZnSe:H:Li film which was not irradiated with light more intense than the room light. Black circles (●) represent the dark conductivity of the ZnSe:H:Li film which was measured after continuous irradiation with AM-1 (100 mW/cm$^2$) for 8 hours.

The specimens, with a comb-shaped aluminum electrode formed thereon by vacuum deposition, were examined for conductivity type by the aid of thermoelectromotive force. It was found that they exhibit the p-type conductivity if they contain more than 0.25 atomic% of hydrogen, and they exhibit the weak n-type conductivity if they contain less than 0.08 atomic% of hydrogen.

Figure 9:
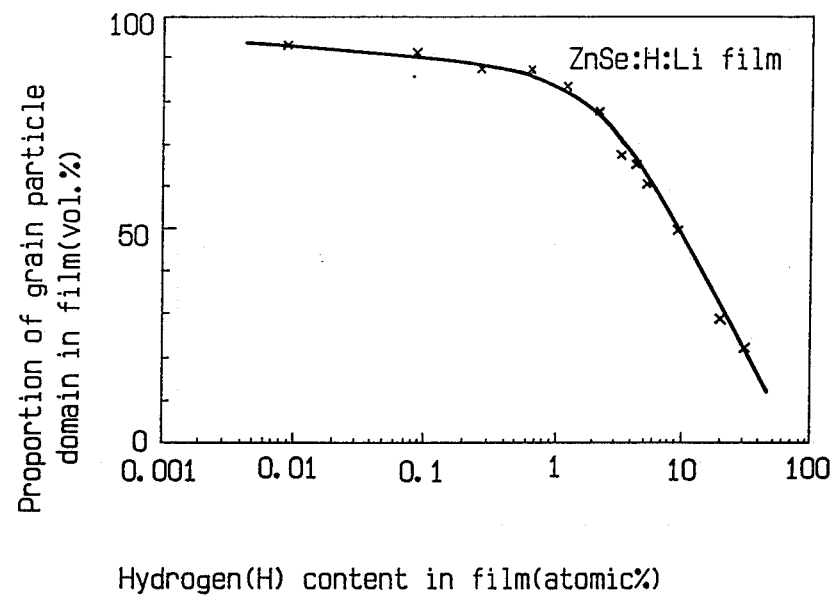
FIG. 9 is a graph showing the relation between the content of hydrogen and the ratio of crystal grain domains in films formed in Experiment C.

(3) Samples Nos. 13~24 were examined for the ratio of crystal grain domains per unit volume in the film according to the same procedure as in Experiment A mentioned above. The results are shown in FIG. 9. The relation between the ratio of crystal grain domains per unit volume in the film and content of hydrogen atoms in the film is almost identical with that of an undoped film.

(4) It is noted from FIGS. 8 and 9 that the film that can be doped efficiently contains more than 15 vol% of non-crystal grain domains. In other words, for the film to be doped efficiently, it is necessary that the film contain more than 15 vol% of non-crystal grain domains.

The foregoing suggests that the deposited film should contain a certain amount of non-crystal grains. With too small an amount of non-crystal grains, the deposited film lacks the flexible structure. Insufficient structural relief at the crystal grain boundaries lead to defects such as dangling bonds. When a film of such structure is doped, the dopant does not enter the crystal grains but collects at the crystal grain boundaries. Even though the dopant is introduced into the film, it is impossible to control the valence electrons and the dark conductivity as desired.

In the case of a film containing 15 vol% or more of non-crystal grains in the crystal grain boundaries or in the intercrystal space, with the dangling bonds terminated with hydrogen atoms (H), the structure is flexible and the defects at the crystal grain boundaries decrease. For this reason, the deposited film according to this invention is by far superior in doping efficiency to that which does not have non-crystal grain domains. Incidentally, with non-crystal grain domains less than 15 vol%, the deposited film is easily peeled off from the substrate on account of its insufficient flexibility in structure.

The foregoing suggests that the deposited film should contain more than 15 vol% of non-crystal grain domains.

(5) The procedure of (1) mentioned above was repeated to prepare samples Nos. 25~36, samples Nos. 37~48, and samples Nos. 49~60 (on $SiO_2$ film) and also to prepare samples Nos. 25'~36', samples Nos. 37'~48', and samples Nos. 49'~60' (on quartz substrate).

Figure 10:
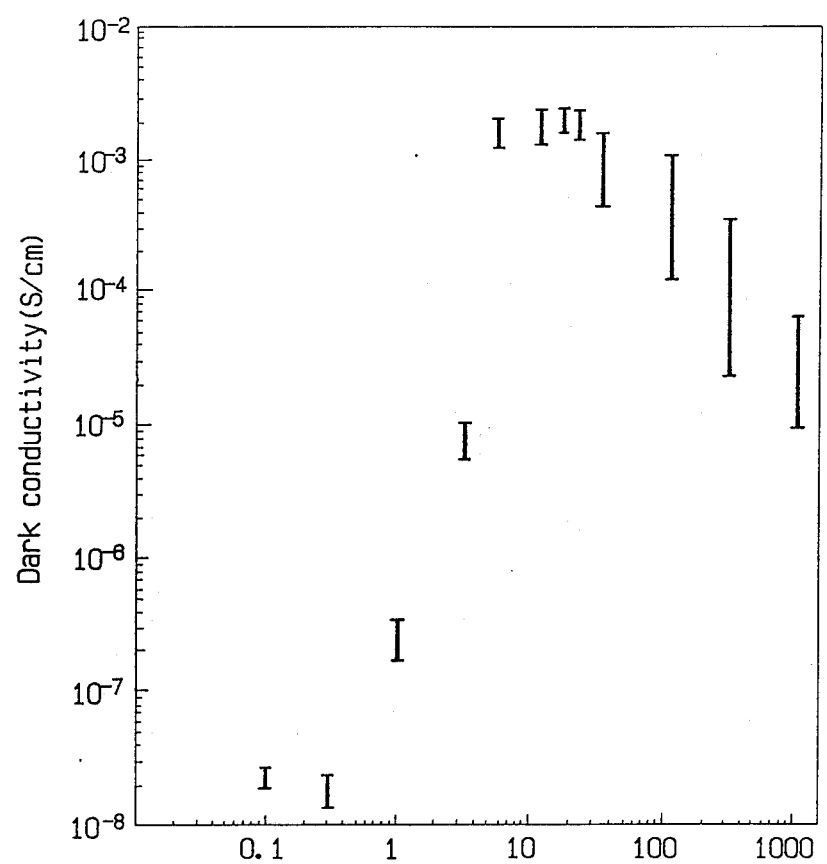
FIG. 10 is a graph showing the relation between the dark conductivity and the flow rate of hydrogen gas at the time of film formation in Experiment C.

Each of samples Nos. 25~60 which were not irradiated with intense light was examined for dark conductivity in the same manner as mentioned above. The results are shown in FIG. 10. It is noted from FIG. 10 that the value of dark conductivity greatly varies depending on the film forming conditions, and that the degree of variation is great in the case where the flow rate of hydrogen gas is high.

It was found that samples Nos. 25'~60' are almost uniform in the content of hydrogen atoms in the film and also in the ratio of crystal grain domains.

In the case of samples Nos. 25'~60', those which were prepared with a hydrogen flow rate higher than 30 sccm gave greatly varied values of dark conductivity. In such cases, the content of hydrogen atoms in the film is more than 4 atomic% and the ratio of crystal grain domains is less than 65 vol%.

The foregoing suggests that where the ratio of non-crystal grain domains per unit volume in the film is greater than 30 vol%, the crystal grains are electrically separated from one another and the conduction is determined by the non-crystal grain domains, which leads to a low dark conductivity. This restricts the application areas of the deposited film.

The control of valence electrons by dopants and the change of dark conductivity depending on dopants greatly differ from the crystal grain domains to the non-crystal grain domains; therefore, it is difficult to obtain the desired control of valence electrons and the desired change of dark conductivity. In the case where dopants enter the non-crystal grain domains, but not the crystal grain domains, the resulting deposited film greatly varies in its characteristics. This makes it impossible to obtain the dark conductivity as desired.

The dark conductivity greatly varies as shown in FIG. 8 if the deposited film is irradiated with intense light. This may be elucidated as follows: In the case where the ratio of the non-crystal grain domains exceeds 35 vol%, the content of hydrogen atoms in the deposited film is very high. This brings about a situation in which the hydrogen atoms are easily released from the film as the film changes with time and the boundaries change. The release of hydrogen atoms deteriorates the characteristics of the film.

The foregoing suggests the following. For the ZnSe:H film to be reproducible and stable, it is necessary that the content of hydrogen atoms (H) in the film be less than 4 atomic% and the ratio of the crystal grain domains per unit volume in the film be more than 65 vol%.

(6) The procedure (1) mentioned above was repeated to form ZnSe:H films and ZnSe:H:Li films on quartz glass substrates under varied conditions. Thus prepared samples were examined for the relation between the content of hydrogen atoms in the film and the ratio of crystal grain domains in the film, and the relation between the content of hydrogen atoms in the film and the electrical characteristics (such as the ratio of change in conductivity after irradiation with AM-1, the drift mobility of holes, and the dark conductivity) in the same manner as mentioned above. It was found that the content of hydrogen atoms in the film and the ratio of crystal grain domains in the film almost coincide with those specified in the above-mentioned experiments, and that there is a close correlation between the content of hydrogen atoms in the film and the electrical characteristics of the film. Thus it was found that the optimum content of hydrogen atoms is in the range of 1 to 4 atomic%. It was also found that the ratio of crystal grain domains in the film which satisfies the specific content of hydrogen atoms in the film is 65 to 85 vol%, preferably 70 to 80 vol%.

Experiment D: Investigation of the ratio of crystal grain domain formed when hydrogen atoms are introduced into the $ZnSe_{1-x}Te_x$ film (1) Preparation of samples (i) A first substrate is a round silicon wafer, 0.5 mm thick and 1 inch in diameter, having a resistivity ($\rho$) of about $10^{-1}$ $\Omega$-cm), on which is formed an $SiO_2$ film, about 5000 Å thick, by thermal oxidation treatment in an oxygen gas stream at 1000° C. A second substrate is a square quartz glass measuring 2.5 cm by 2.5 cm.

(ii) The above-mentioned two substrates were placed side by side on the substrate holder 202 of the known apparatus as shown in FIG. 2. On the substrates were formed a $ZnSe_{1-x}Te_x$:H film under the conditions shown in Table 3. Thus there were obtained samples Nos. 1~12 and samples Nos. 1'~12'.

(iii) Each of samples Nos. 1~12 (deposited on silicon wafers) was cut in half. Each of the cut halves was cut to a 5 mm square size which matches the holder of a transmission electron microscope (TEM). The cut piece was fixed to a glass plate, measuring 50 mm by 50 mm and 1 mm thick, by the aid of wax, with the deposited film in contact with the glass surface so that the deposited film is visible through the opposite side of the glass plate.

(iv) The exposed part (silicon single crystal wafer) of the sample as prepared in (iii) was etched with an aqueous solution of HF, $HNO_3$, and $CH_3COOH$. The etching rate was properly controlled by changing the concentration of HF in the etching solution. Etching was continued until the silicon single crystal wafer was completely removed. The progress of etching was confirmed by observing the light passing through the deposited film.

(v) After etching, the wax was removed by the aid of an organic solvent (toluene), and the deposited film was separated from the glass plate, followed by rinsing and air drying. Thus there was obtained a film specimen composed of an $SiO_2$ film and a $ZnSe_{1-x}Te_x$:H film.

(2) Examination of film specimen prepared in (1)

Each film specimen of samples Nos. 1~12 formed on silicon wafers in step (1) was examined by means of a TEM (with an acceleration voltage of 200 keV). The transmission image contained a lattice image with very few lattice defects in that part of the $ZnSe_{1-x}Te_x$:H film where the crystal grain domains exist. It was found that the lattice images are uniformly distributed throughout the $ZnSe_{1-x}Te_x$:H film.

The lattice image was utilized to estimate the number of crystal grain domains present in a certain area of the film specimen. Thus the ratio in terms of vol% of the crystal grain domains in the deposited film was calculated.

For the purpose of reference, the direction of the crystal grain and the size of the crystal grain domain were measured by the aid of X-ray diffraction.

(3) Determination of hydrogen in the deposited film (i) Each of samples Nos. 1'~12' deposited on quartz substrates in the above-mentioned step (1)-(i) was cut in half. Each of the cut halves was placed in a vacuum chamber and heated therein from room temperature to 1000° C. During the heating period, the amount of hydrogen (H) released from the specimen was determined by means of a mass spectrometer. The resulting data were compared with those of the standard sample prepared by implanting a known amount of hydrogen into a hydrogen-free sample.

(ii) Each deposited film of samples Nos. 1~12 used for TEM observation was examined for the distribution of Zn atoms, Se atoms, and Te atoms by the aid of an X-ray microanalyzer ("XMA"for short), made by Shimadzu Seisakusho Ltd., and was also subjected to elemental analysis. The results are shown in Table 4. The analysis was carried out on the assumption that the matrix is composed of Zn, Se, and Te alone, and hydrogen in the film was excluded from calculations.

The data obtained from all of samples Nos. 1~12 indicate that Zn atoms, Se atoms, and Te atoms are uniformly distributed in the deposited film and that the ratio of Zn atoms to the total of Se atoms and Te atoms is stoichiometrically about 1:1 and the ratio of Se atoms to Te atoms is 2:8.

(4) Results

The results of the measurements in steps (2) and (3) mentioned above are graphically represented in FIG. 11. It is noted from FIG. 11 that as the content (atomic%) of hydrogen atoms (H) in the $ZnSe_{1-x}Te_x$:H film increases, the ratio of the crystal grain domains per unit volume in the deposited film decreases. With the content of hydrogen atoms in the range of 0.1 to 10 atomic%, the ratio of crystal grain domains per unit volume in the film ranges from 90 to 40 vol%.

In the sample preparation step (1) mentioned above, the flow rate of hydrogen gas should be properly controlled. With a flow rate lower than 0.05 sccm, the deposited film is composed mainly of Zn; and with a flow rate in excess of 2 slm, no film is deposited Experiment E: Investigation of the relation between the electrical characteristics of the deposited film and the content of hydrogen atoms in the deposited film and also the ratio of crystal grain domains per unit volume in the deposited film The deposited film formed on the quartz substrate in step (1)-(ii) mentioned above was examined for dark conductivity. The experiment was carried out using the remaining cut halves of samples Nos. 1'~12'. Prior to measurements, a comb-shaped aluminum electrode was formed on the specimen by vacuum deposition. The results are shown in FIG. 12.

Figure 12:
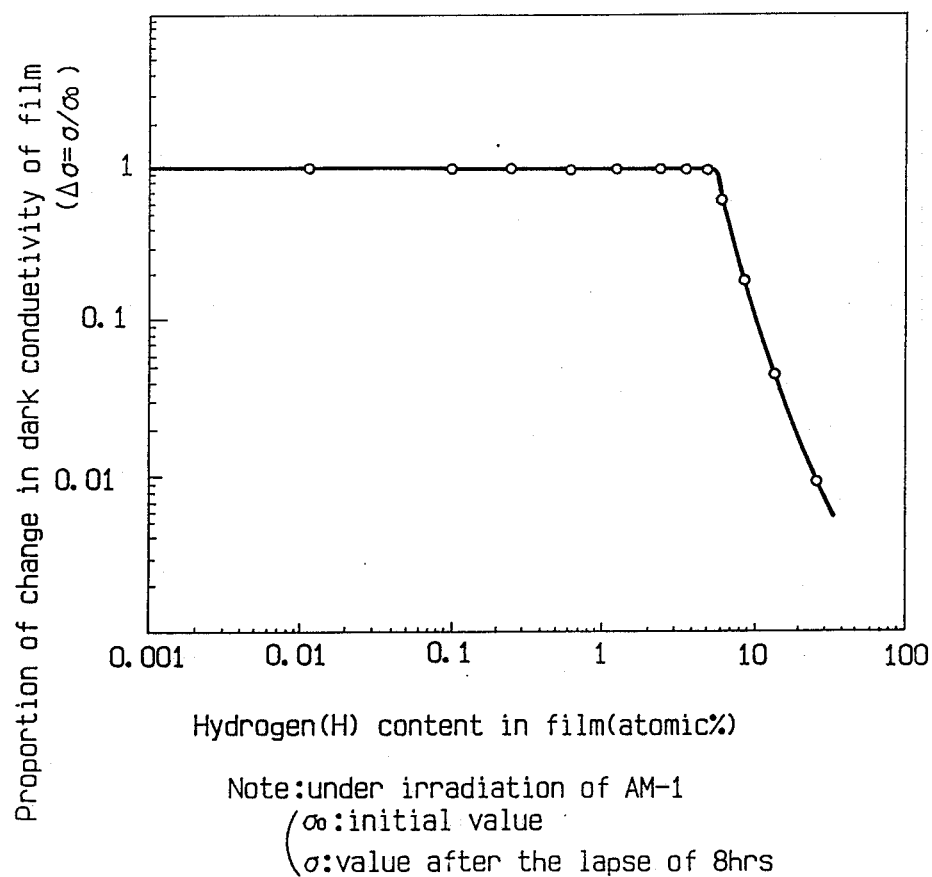
FIG. 12 is a graph showing the relation between the content of hydrogen and the change in conductivity of films formed in Experiment E.

It is noted from FIG. 12 that the change of dark conductivity ($\sigma$) which occurs after irradiation with AM-1.5 for 8 hours varies depending on the content of hydrogen atoms (H) in the film. With 4 atomic% or less, almost no change occurs, and with 8 atomic% and above, a significant change occurs. (The ratio of change $\Delta\sigma$ is expressed by $\sigma/\sigma_0$, where $\sigma_0$ is an initial value and $\sigma$ is a value measured after irradiation for 8 hours.)

The relation between the drift mobility of holes and the hydrogen content in the deposited film was investigated using the remaining cut halves of samples Nos. 1~12 prepared in step (1)-(ii) mentioned above. (The ZnSe$_{0.2}$Te$_{0.8}$:H film was deposited on an SiO$_2$ film formed on an Si-wafer.) Prior to measurements, each specimen was provided with an aluminum semitransparent film by vacuum deposition. The specimen was irradiated with UV light pulses (about 1 nsec) while a pulse voltage was being applied across the aluminum film and the silicon wafer, with the aluminum film being negative. The drift mobility was measured by the time-of-flight method. The results are shown in FIG. 13.

Figure 13:
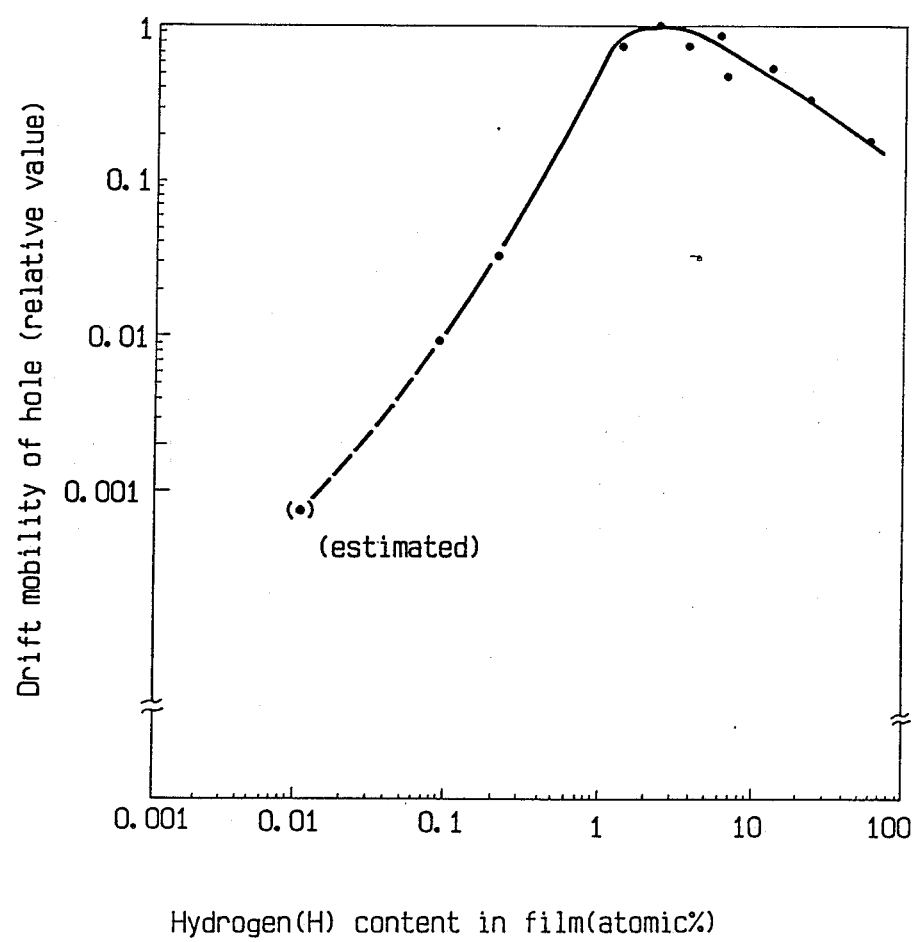
FIG. 13 is a graph showing the relation between the content of hydrogen and the drift mobility of holes in films formed in Experiment E.

The following is noted from FIG. 13. With a hydrogen content less than 0.5 atomic%, the drift mobility of holes is very small. With a hydrogen content in the range of 1 to 8 atomic%, the drift mobility of holes is very high. With a hydrogen content in excess of 8 atomic%, the drift mobility of holes gradually decreases.

The above-mentioned results suggest that the content of hydrogen atoms in the deposited film should be 8 atomic% or less, preferably 4 atomic% or less, from the standpoint of change in characteristics induced by the irradiation of light, and 0.5 atomic% or more, preferably 1 atomic% of more, from the standpoint of the mobility of holes.

Figure 11:
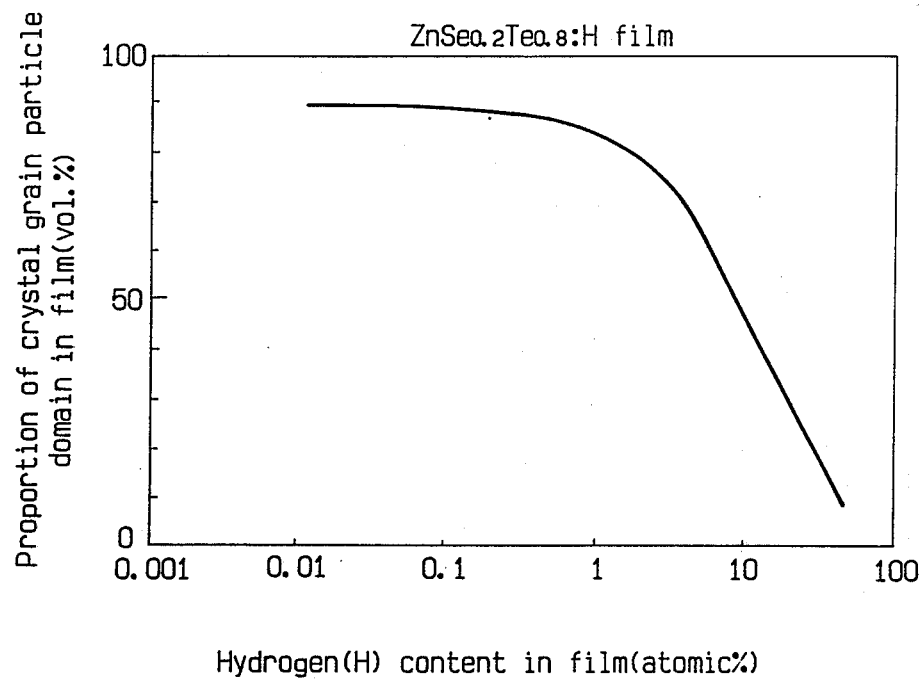
FIG. 11 is a graph showing the relation between the content of hydrogen and the ratio of crystal grain domains in films formed in Experiments D(2) and D(3).

According to FIG. 11, the ratio of the crystal grain domains per unit volume in the ZnSe$_{1-x}$Te$_x$:H deposited film is in the range of 65 to 85 vol% if the deposited film contains 1 to 4 atomic% of hydrogen atoms It is concluded from the foregoing that the electrical characteristics of the ZnSe$_{1-x}$Te$_x$:H deposited film depend largely on the content of hydrogen atoms (H) in the film and also on the ratio of crystal grain domains per unit volume in the film. For example, if the deposited film is to have the electrical characteristics suitable for use as solar cells or similar devices, the hydrogen content should be in the range of 1 to 4 atomic% and the ratio of crystal grain domains should be in the range of 65 to 85 vol%.

Experiment F: Investigation of the relation between the doping characteristics of the deposited film and the content of hydrogen atoms in the deposited film and also the ratio of crystal grain domains per unit volume in the deposited film (1) The procedure of Experiment A was repeated, except that LiC$_3$H$_7$ ($1.0 \times 10^{-10}$ mol/min) was added to the raw material gas (A), to form a ZnSe$_{1-x}$Te$_x$:H:Li film on a silicon wafer (with an SiO$_2$ film formed thereon) and a quartz glass substrate. Thus there were obtained samples Nos. 13~24 and samples Nos. 13'~24'.

(2) Each of samples Nos. 13'~24' (deposited on quartz glass substrates) was cut in half. One half was used for the measurement of dark conductivity after the formation of a comb-shaped aluminum electrode by vacuum deposition. The other half was used for the measurement of hydrogen content in the same manner as in Experiment A mentioned above.

Figure 14:
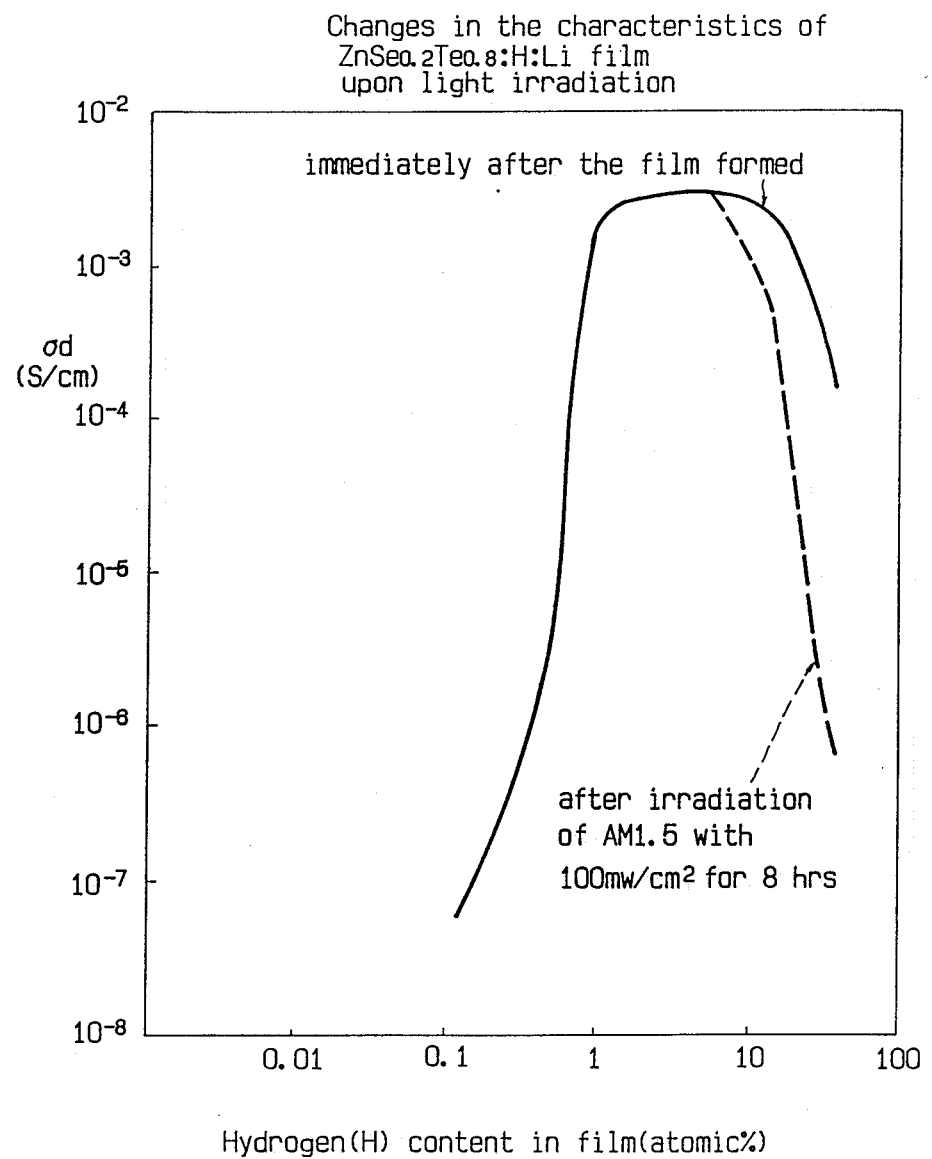
FIG. 14 is a graph showing the relation between the content of hydrogen and the dark conductivity of films formed in Experiment F.

The results of measurements are shown in FIG. 14. In the figure, the solid line represents the dark conductivity of the ZnSe$_{1-x}$Te$_x$:H:Li film which was not irradiated with light more intense than the room light. The broken line represents the dark conductivity of the ZnSe$_{1-x}$Te$_x$:H:Li film which was measured after continuous irradiation with AM-1.5 (100 mW/cm$^2$) for 8 hours.

The specimens, with a comb-shaped aluminum electrode formed thereon by vacuum deposition, were examined for conductivity type by the aid of thermoelectromotive force. It was found that they exhibit the p-type conductivity if they contain more than 0.25 atomic% of hydrogen, and they exhibit the weak n-type conductivity if they contain less than 0.08 atomic% of hydrogen.

Figure 15:
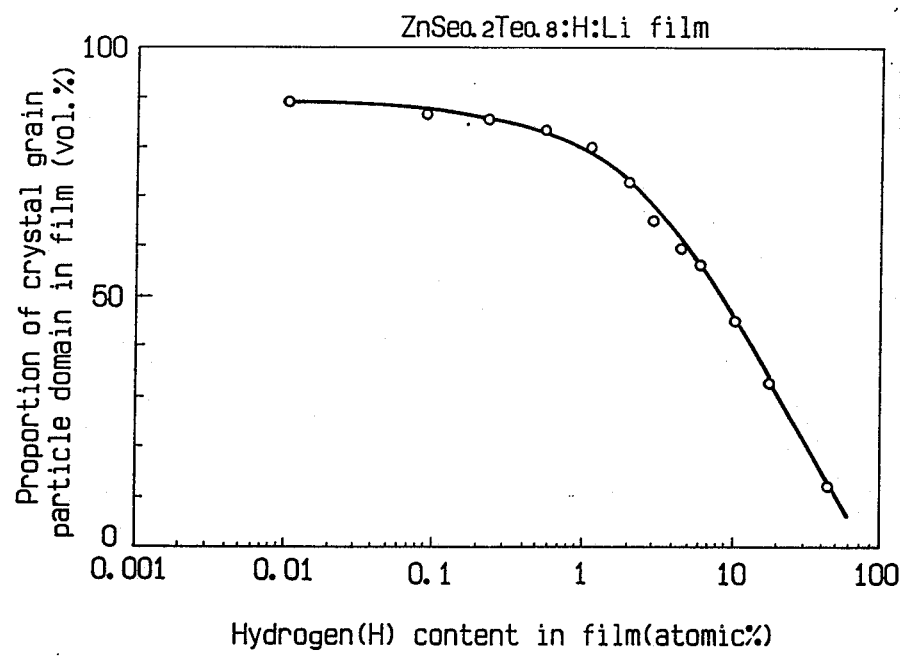
FIG. 15 is a graph showing the relation between the content of hydrogen and the ratio of crystal grain domains in films formed in Experiment F.

(3) Samples Nos. 13~24 were examined for the ratio of crystal grain domains per unit volume in the film according to the same procedure as in Experiment A mentioned above. The results are shown in FIG. 15. The relation between the ratio of crystal grain domains per unit volume in the film and content of hydrogen atoms in the film is almost identical with that of an undoped film.

(4) It is noted from FIGS. 14 and 15 that the film that can be doped efficiently contains more than 15 vol% of non-crystal grain domains. In other words, for the film to be doped efficiently, it is necessary that the film contain more than 15 vol% of non-crystal grain domains.

The foregoing suggests that the deposited film should contain a certain amount of non-crystal grains. With too small an amount of non-crystal grains, the deposited film lacks the flexible structure. Insufficient structural relief at the crystal grain boundaries lead to defects such as dangling bond. When a film of such structure is doped, the dopant does not enter the crystal grains but collects at the crystal grain boundaries. Even though the dopant is introduced into the film, it is impossible to control the valence electrons and the dark conductivity as desired.

In the case of a film containing 15 vol% or more of non-crystal grains in the crystal grain boundaries or in the intercrystal space, with the dangling bonds terminated with hydrogen atoms (H), the structure is flexible and the defects at the crystal grain boundaries decrease. For this reason, the deposited film according to this invention is by far superior in doping efficiency to that which does not have non-crystal grain domains. Incidentally, with non-crystal grain domains less than 15 vol%, the deposited film is easily peeled off from the substrate on account of its insufficient flexibility in structure.

The foregoing suggests that the deposited film should contain more than 15 vol% of non-crystal grain domains.

(5) The procedure of (1) mentioned above was repeated to prepare samples Nos. 25~36, samples Nos. 37~48, and samples Nos. 49~60 (on SiO$_2$ film) and also to prepare samples Nos. 25'~36', samples Nos. 37'~48', and samples Nos. 49'~60' (on quartz substrate).

Figure 16:
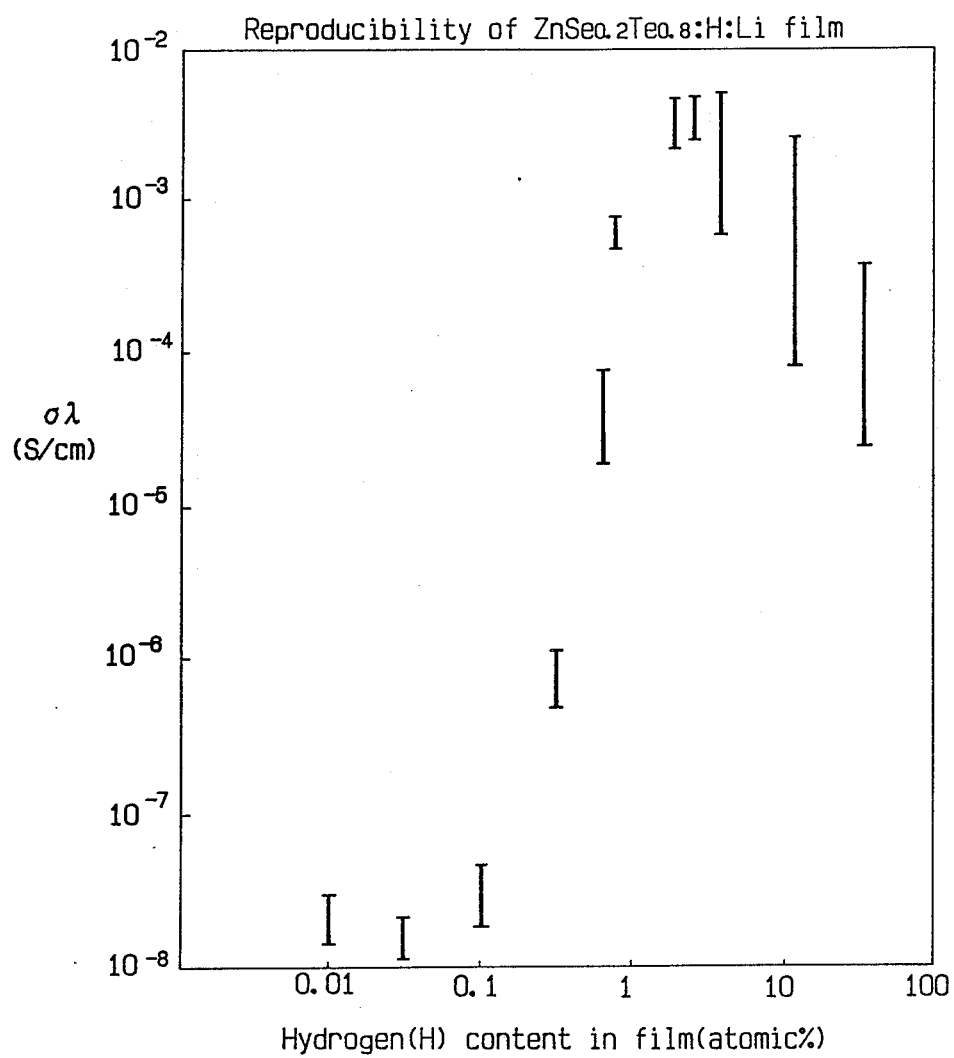
FIG. 16 is a graph showing the relation between the hydrogen content and the dark conductivity in Experiment F.

Each of samples Nos. 25~60 which were not irradiated with intense light was examined for dark conductivity in the same manner as mentioned above. The results are shown in FIG. 16. It is noted from FIG. 16 that the value of dark conductivity greatly varies depending on the film forming conditions, and that the degree of variation is great in the case where the flow rate of hydrogen gas is high.

It was found that samples Nos. 25'~60' are almost uniform in the content of hydrogen atoms in the film and also in the ratio of crystal grain domains.

In the case of samples Nos. 25'~60', those which were prepared with a hydrogen flow rate higher than 30 sccm gave greatly varied values of dark conductivity. In such cases, the content of hydrogen atoms in the film is more than 5 atomic% and the ratio of crystal grain domains is less than 65 vol%.

The foregoing suggests that where the ratio of non-crystal grain domains per unit volume in the film is greater than 30 vol%, the crystal grains are electrically separated from one another and the conduction is determined by the non-crystal grain domains, which leads to a low dark conductivity. This restricts the application areas of the deposited film.

The control of valence electrons by dopants and the change of dark conductivity depending on dopants greatly differ from the crystal grain domains to the non-crystal grain domains; therefore, it is difficult to obtain the desired control of valence electrons and the desired change of dark conductivity. In the case where dopants enter the non-crystal grain domains, but not the crystal grain domains, the resulting deposited film greatly varies in its characteristics. This makes it impossible to obtain the dark conductivity as desired.

The dark conductivity greatly varies as shown in FIG. 14 if the deposited film is irradiated with intense light. This may be elucidated as follows: In the case where the ratio of the non-crystal grain domains exceeds 35 vol%, the content of hydrogen atoms in the deposited film is very high. This brings about a situation in which the hydrogen atoms are easily released from the film as the film changes with time and the boundaries change. The release of hydrogen atoms deteriorates the characteristics of the film.

The foregoing suggests the following. For the $ZnSe_{1-x}Te_x$:H film to be reproducible and stable, it is necessary that the content of hydrogen atoms (H) in the film be less than 4 atomic% and the ratio of the crystal grain domains per unit volume in the film be more than 65 vol%.

(6) The procedure (1) mentioned above was repeated to form $ZnSe_{1-x}Te_x$:H films and $ZnSe_{1-x}Te_x$:H:Li films on quartz glass substrates under varied conditions. Thus prepared samples were examined for the relation between the content of hydrogen atoms in the film and the ratio of crystal grain domains in the film, and the relation between the content of hydrogen atoms in the film and the electrical characteristics (such as the ratio of change in conductivity after irradiation with AM-1, the drift mobility of holes, and the dark conductivity) in the same manner as mentioned above. It was found that the content of hydrogen atoms in the film and the ratio of crystal grain domains in the film almost coincide with those specified in the above-mentioned experiments, and that there is a close correlation between the content of hydrogen atoms in the film and the electrical characteristics of the film. Thus it was found that the optimum content of hydrogen atoms is in the range of 1 to 4 atomic%. It was also found that the ratio of crystal grain domains in the film which satisfies the specific content of hydrogen atoms in the film is 65 to 85 vol%, preferably 70 to 80 vol%.

Experiment G: Investigation of the conductivity of $ZnSe_{1-x}Te_x$ film with p-type doping in relation to the content of hydrogen atoms in the film which is varied by controlling the amount of hydrogen introduced. (using the Se/Te ratio as the parameters) (1) Preparation of samples (i) A square quartz glass measuring 2.5 cm by 2.5 cm was used as a substrate.

(ii) The substrates were placed by side on the substrate holder 202 of the known apparatus as shown in FIG. 2. On the substrate was formed a $ZnSe_{1-x}Te_x$:H film ($0 \leq x \leq 1$) under the conditions shown in Table 5. Thus there were obtained 132 kinds of samples designated by the combination of two letters L-N, L representing the flow rate of hydrogen (12 different values) and N representing the ratio of the flow rate of DESe to the flow rate of DETe (11 different values).

(2) Determination of hydrogen in the deposited film (i) Each of samples Nos. 1-1~12-10 deposited on quartz substrates in the above-mentioned step (1)-(i) was cut in half. Each of the cut halves was placed in a vacuum chamber and heated therein from room temperature to 1000° C. During the heating period, the amount of hydrogen (H) released from the specimen was determined by means of a mass spectrometer. The resulting data were compared with those of the standard sample prepared by implanting a known amount of hydrogen into a hydrogen-free sample.

(ii) Each of the remaining cut halves of the samples was examined for the distribution of Zn atoms, Se atoms, and Te atoms by the aid of an X-ray microanalyzer ("XMA"for short), made by Shimadzu Seisakusho Ltd., and was also subjected to elemental analysis.

The data obtained from all of samples Nos. 1-1~12-10 indicate that Zn atoms, Se atoms, and Te atoms are uniformly distributed in the deposited film and that the ratio of Zn atoms to the total of Se atoms and Te atoms [Zn : (Se+Te)] is stoichiometrically about 1:1.

It was confirmed from the data that each sample contains Se and Te in the ratio intended in the manufacturing conditions. In other words, the $ZnSe_{1-x}Te_x$ film ($0 \leq x \leq 1$) can be produced when the flow rate of DESe is $1.5 \times 10^{-5} \times (1-x)$ mol/min and the flow rate of DETe is $1.0 \times 10^{-5} \times x$ mol/min. The thus formed film contains Se and Te in the approximate ratio of $(1-x)/x$.

(3) Measurement of dark conductivity of the film with p-type doping

Figure 17:
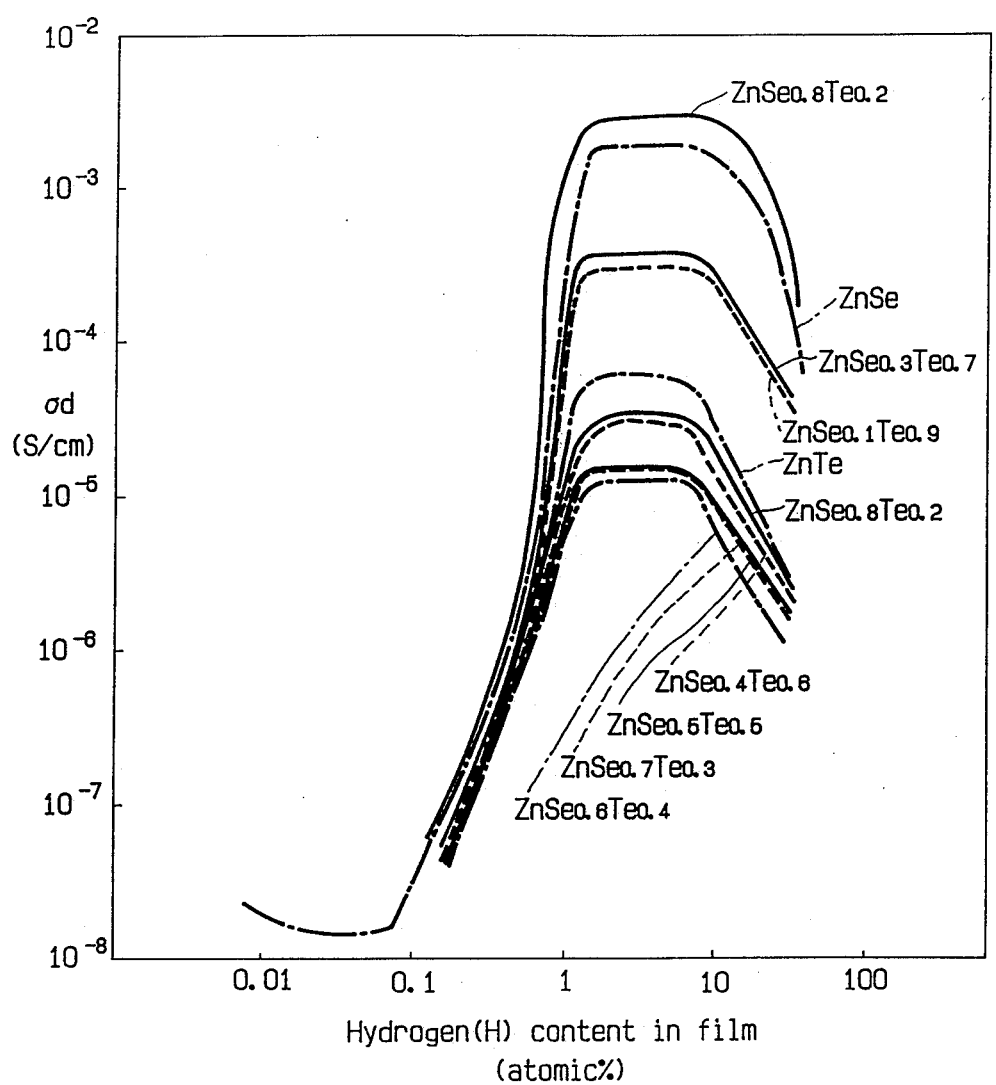
FIG. 17 is a graph showing the relation between the content of hydrogen in p-type doped films and the dark conductivity of films formed in Experiment G with the Se/Te ratio being a parameter.

The samples formed on quartz glass substrates, which were used for measurement in (2)-(ii) above, were examined for dark conductivity. Prior to measurement, a comb-shaped aluminum electrode (0.2 mm gap) was formed by vacuum deposition on each sample. With 10 volts applied, a current was measured in the dark. Thus there was measured the dark conductivity of $ZnSe_{1-x}Te_x$:H:Li film (with Li doping) formed by varying the flow rates of hydrogen, DESe, and DETe. FIG. 17 shows the ration between the relation between the content of hydrogen in the film and the dark conductivity of the film, with the Se/Te ratio being a parameter.

The specimens were examined for conductivity type by measuring the thermoelectromotive force. It was found that they exhibit p-type conductivity if they contain more than 0.25 atomic% of hydrogen, and they exhibit weak n-type conductivity if they contain less than 0.08 atomic% of hydrogen.

Figure 18:
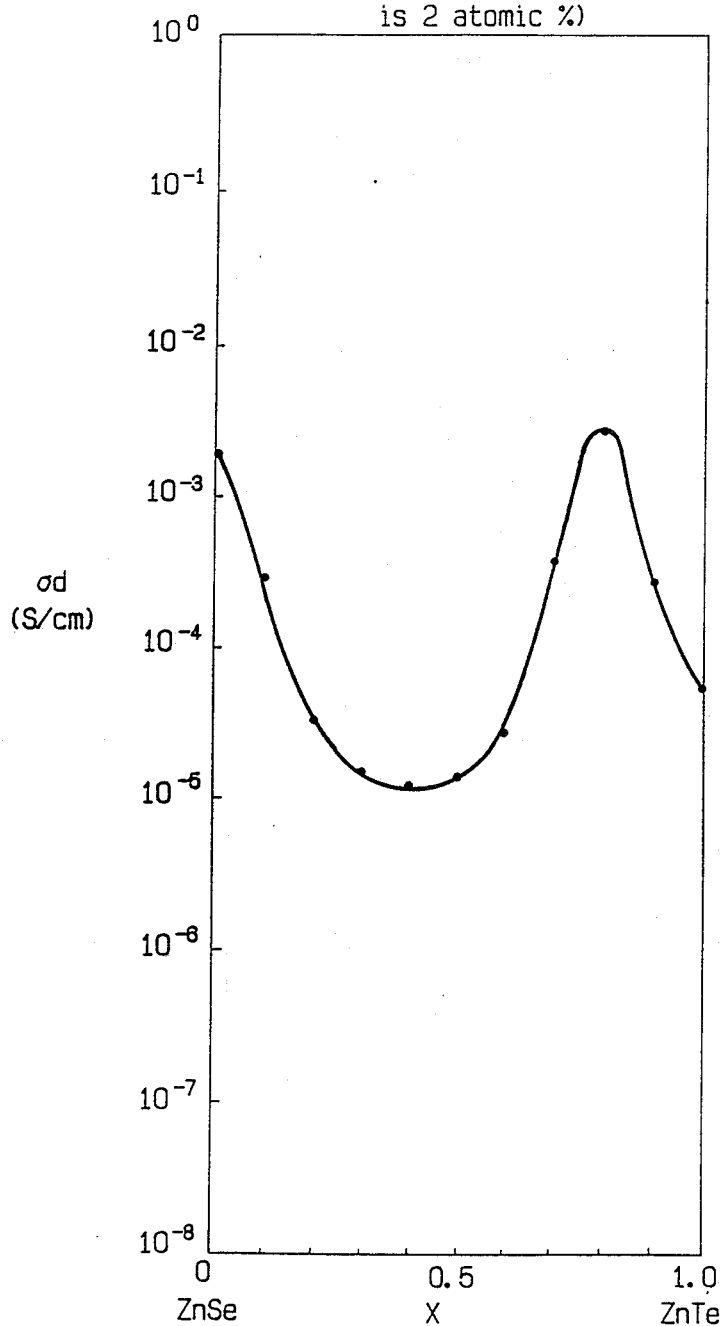
FIG. 18 is a graph showing the relation between the Se/Te ratio in p-type doped films and the dark conductivity of films formed in Experiment G.

FIG. 18 shows the relation between the dark conductivity and the Se/Te ratio in the films containing about 2 atomic% of hydrogen.

The above-mentioned experimental results indicate that the film exhibits outstanding p-type conductivity when the film contains 1 to 10 atomic% of hydrogen and also contains Se and Te in the ratio of 10:0 to 9:1 and 3:7 to 1:9.

Experiment H: Investigation of $ZnSe_{1-x}Te_x$ films with p-type doping (1) Preparation of samples An n-type $ZnSe_{1-x}Te_x$ film was prepared under almost the same conditions as in Experiment D, except that $(CH_3)_3Ga$ (TMGa) was introduced at a flow rate of $5 \times 10^{-11}$ mol/min in place of $Li(C_3H_7)$ as the p-type doping raw material gas.

(2) Measurement of hydrogen content in the film.

The film was analyzed to determine the content of hydrogen and the compositional ratio of Zn atoms, Se atoms, and Te atoms according to the method shown in Experiment A.

It was found that the ratio of Zn atoms to the total of Se atoms and Te atoms [Zn : (Se+Te)] is stoichiometrically about 1:1.

It was confirmed that all the samples contain Se and Te in the same ratio as that of DESe gas and DETe gas established in the manufacturing conditions.

(3) Measurement of dark conductivity of the films with n-type doping

The $ZnSe_{1-x}Te_x$:H:Ga film was examined for dark conductivity in the same manner as mentioned in Experiment A.

All the samples exhibited the n-type conductivity when examined by measurement of thermoelectromotive force.

As in the case of p-type $ZnSe_{1-x}Te_x$:H:Li film, all the samples exhibited the maximum dark conductivity when the hydrogen content is in the range of 1 to 10 atomic%.

Figure 19:
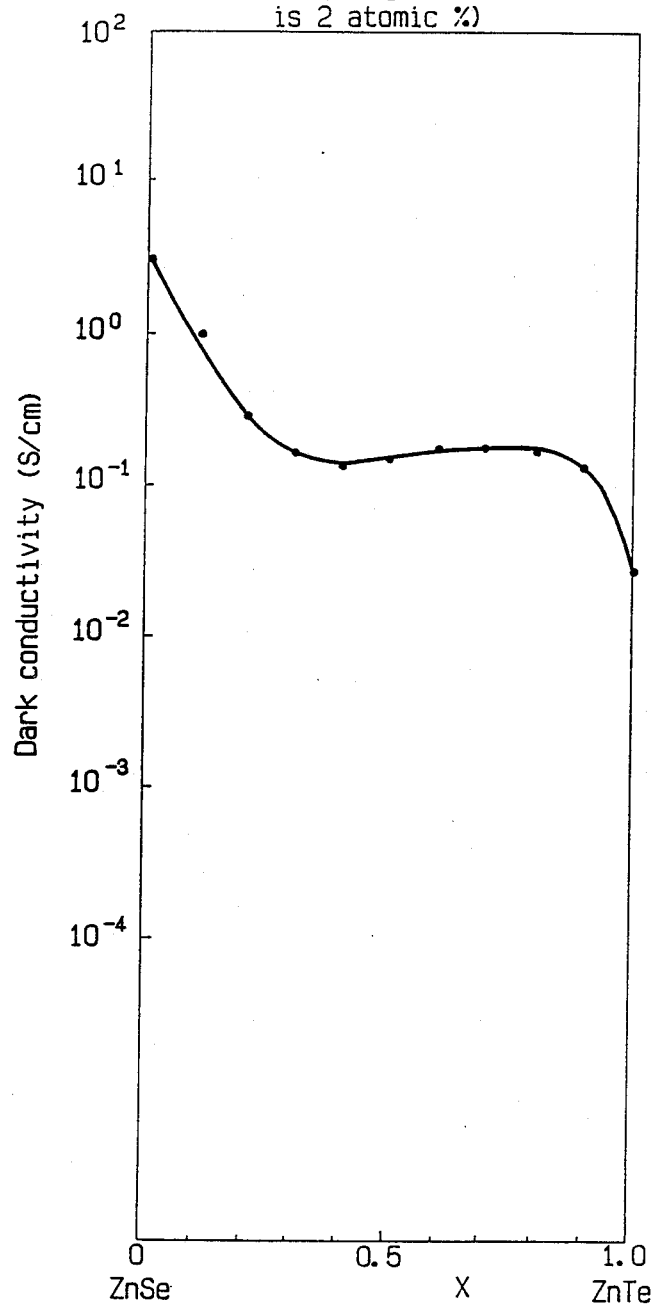
FIG. 19 is a graph showing the relation between the Se/Te ratio in n-type doped films and the dark conductivity of films formed in Experiment H.

FIG. 19 shows the dark conductivity as a function of the Se:Te ratio in the film containing 2 atomic% of hydrogen atoms. It is noted from FIG. 19 that the film exhibits good dark conductivity in any region of the Se:Te ratio.

Experiment I: Dependence of optical band gap on the Se:Te ratio in $ZnSe_{1-x}Te_x$:H film (i) Preparation of samples $ZnSe_{1-x}Te_x$:H films, with the Se:Te ratio varied, were prepared on quartz glass substrates under the same conditions as in Experiment D except that the flow rate of hydrogen gas was fixed at 15 sccm and the doping gas was not used.

(ii) Analyses of samples

The samples were analyzed according to the method mentioned in Experiment A to determine the content of hydrogen atoms and the ratio of Zn, Se, and Te. It was found that each sample contains about 2 atomic% of hydrogen and the ratio of Zn : (Se+Te) is stoichiometrically 1:1. It was confirmed that all the samples contain Se and Te in the same ratio as that of DESe gas and DETe gas established in the manufacturing conditions.

(iii) Measurement of optical band gap

The samples were examined for the absorption coefficient as a function of the wavelength of light, using a spectrophotometer. The optical band gap of each sample was obtained from the absorption edge.

Figure 20:
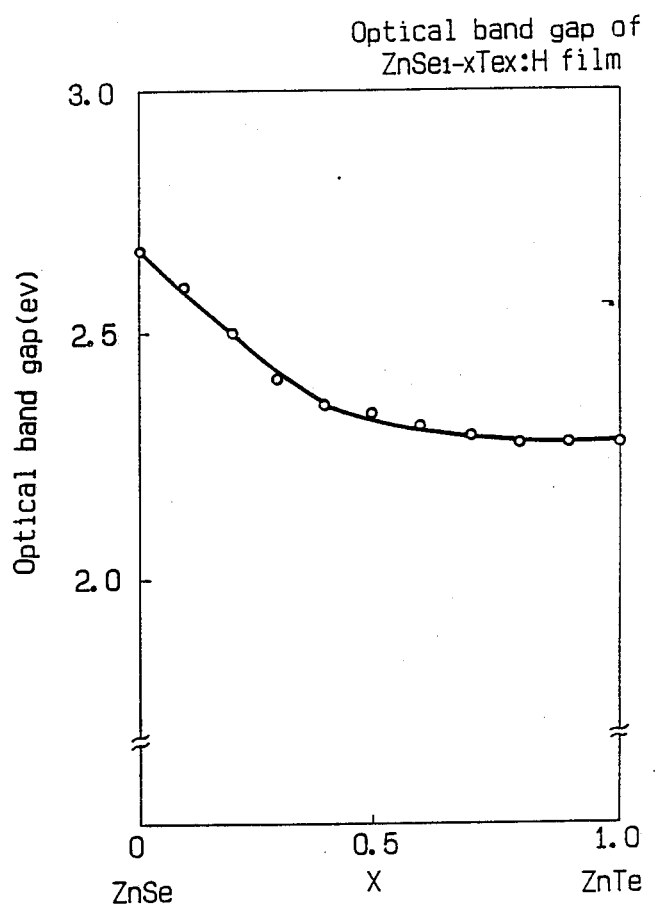
FIG. 20 is a graph showing the relation between the Se/Te ratio in films and the optical band gap of films formed in Experiment I.

FIG. 20 shows the optical band gap of $ZnSe_{1-x}Te_x$:H films (containing 2 atomic% of hydrogen) plotted against the Se:Te ratio. It is noted that in the case of films having the Se:Te ratio greater than 7:3, the optical band gap is in the range of 2.3 to 2.2 eV.

Experiment J: Investigation of the ratio of crystal grain domains formed in non-doped $ZnSe_{1-x}Te_x$:H film and doped $ZnSe_{1-x}Te_x$:H:M film (where M denotes a dopant element) (1) Preparation of samples Sample films were prepared on silicon wafers (with $SiO_2$ film formed thereon by thermal oxidation process) and also on quartz glass plates in the same manner as in Experiment A. The film-forming conditions are shown in Table 6. Thus there were obtained p-type, n-type, and non-doped $ZnSe_{1-x}Te_x$:H films each containing Se and Te in different ratios.

Incidentally, in the preparation of n-type $ZnSe_{1-x}Te_x$:H films, TMGa was introduced, and in the preparation of p-type $ZnSe_{1-x}Te_x$:H films, $LiC_3H_7$ was introduced. In the preparation of non-doped $ZnSe_{1-x}Te_x$:H films, no doping raw materials were introduced.

The amount of DESe and DETe introduced to form $ZnSe_{1-x}Te_x$:H:M films was established as follows:

DESe : $1.2 \times 10^{-5} \times (1-x)$ mol/min

DETe : $1.0 \times 10^{-5} \times x$ mol/min

The control of each raw material was accomplished by properly setting up the temperature of the water surrounding the bubbler containing a raw material.

(2) Analyses of samples

The samples formed on quartz substrates were analyzed according to the method mentioned in Experiment D to determine the content of hydrogen atoms and the ratio of Zn, Se, and Te. It was found that each sample contains about 2 atomic% of hydrogen and the ratio of Zn : (Se+Te) is stoichiometrically 1:1. It was confirmed that all the samples contain Se and Te in the same ratio as that of DESe gas and DETe gas established in the manufacturing conditions.

(3) Ratio of crystal grain domains in each sample

The ratio of crystal grain domains in each sample was measured by observing the lattice image under a TEM according to the procedure mentioned in Experiment D.

(4) Results

Figure 21:
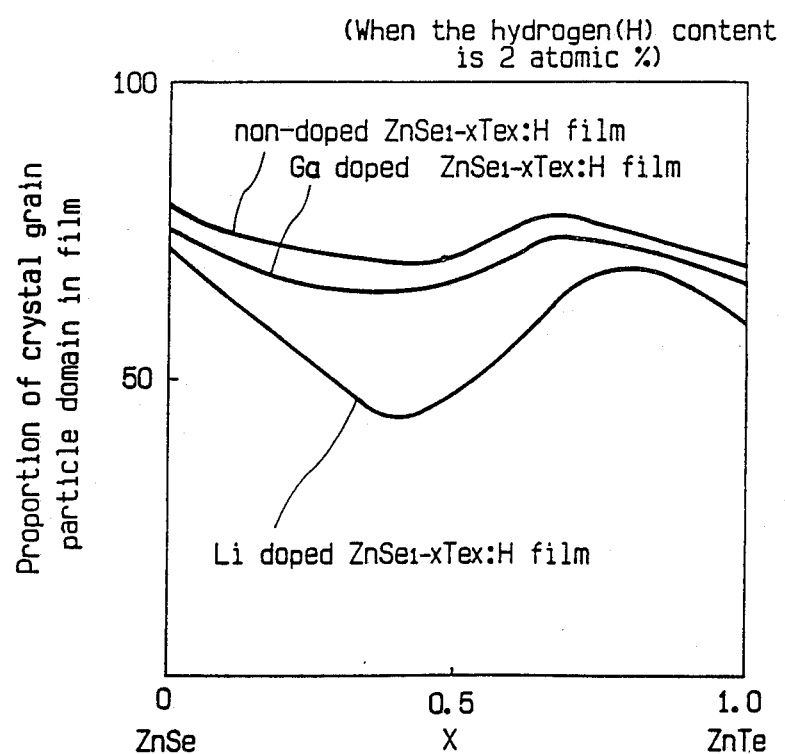
FIG. 21 is a graph showing the relation between the Se/Te ratio in films and the ratio of crystal grain domains in films formed in Experiment J.

On the basis of the results in (2) and (3), FIG. 21 shows the ratio of crystal grain domains in non-doped, Ga-doped, and Li-doped ZnSeTe:H films containing about 2 atomic% of hydrogen, as a function of the Se:Te ratio.

The present invention was completed on the basis of the above-mentioned experimental results. As mentioned above, the first aspect of the present invention relates to a photovoltaic element of pn-junction type which employs as the p-type (or n-type) semiconductor film an outstanding functional deposited film made of a material represented by ZnSe:H which is composed of zinc atoms (Zn), selenium atoms (Se), and at least hydrogen atoms (H), with the content of said hydrogen atoms being 1 to 4 atomic% and the ratio of crystal grains per unit volume being 65 to 85 vol%, and a p-type (or n-type) functional deposited film composed of a material represented by ZnSe:H:M (where M denotes a dopant) which is formed by doping said functional deposited film with a certain p-type (or n-type) dopant.

The second aspect of the present invention relates to a photovoltaic element of pn-junction type which employs as the p-type (or n-type) semiconductor film an outstanding functional deposited film made of a material represented by $ZnSe_{1-x}Te_x$:H which is composed of zinc atoms (Zn), selenium atoms (Se), tellurium atoms (Te), and at least hydrogen atoms (H), with the ratio of Se to Te being 3:7 to 1:9 (by number of atoms), the content of said hydrogen atoms being 1 to 4 atomic%, and the ratio of crystal grains per unit volume being 65 to 85 vol%, and a p-type (or n-type) functional deposited film composed of a material represented by $ZnSe_{1-x}Te_x$:H:M (where M denotes a dopant) which is formed by doping said functional deposited film with a certain p-type (or n-type) dopant.

The functional deposited films of the present invention mentioned above are expected to find use in broad application areas. The films may be deposited on a plane or cylindrical substrate according to the intended application, or may also be deposited on a film formed on such a substrate.

The ZnSe:H:M film of the present invention contains uniformly distributed Zn atoms and Se atoms in stoichiometric amounts and also contains hydrogen atoms in an amount of 1 to 4 atomic%. With the hydrogen atoms terminating the dangling bonds of Zn atoms and/or Se atoms or being present in a free state, the ZnSe:H:M film has crystal grain domains and non-crystal grain domains. The crystal grain domains are uniformly distributed in the film, and the ratio of the crystal grain domains per unit volume in the film is 65 to 85 vol%. Thus the ZnSe:H:M film has a uniform structure and composition.

The $ZnSe_{1-x}Te_x$:H film and $ZnSe_{1-x}Te_x$:H:M film of the present invention contain uniformly distributed Zn atoms, Se atoms, and Te atoms in stoichiometric amounts and also contain hydrogen atoms in an amount of 1 to 4 atomic%. The ratio of Zn atoms to (Se atoms+Te atoms) is stoichiometric and the ratio of Se atoms to Te atoms is in the range of 3:7 to 1:9 (by number of atoms). With the hydrogen atoms terminating the dangling bonds of at least one kind of Zn atoms, Se atoms, and Te atoms, or being present free, the $ZnSe_{1-x}Te_x$:H film and $ZnSe_{1-x}Te_x$:H:M film have crystal grain domains and non-crystal grain domains. The crystal grain domains are uniformly distributed in the film, and the ratio of the crystal grain domains per unit volume in the film is 65 to 85 vol%. Thus the $ZnSe_{1-x}Te_x$:H film and $ZnSe_{1-x}Te_x$:H:M film have a uniform structure and composition.

The ZnSe:H:M film, $ZnSe_{1-x}Te_x$:H film, and $ZnSe_{1-x}Te_x$:H:M film of the present invention have a desired state such that the stress that occurs in the film is relieved. Therefore, they have outstanding electrical and mechanical characteristics and they have also good adhesion to the substrate and other films.

The ZnSe:H film and $ZnSe_{1-x}Te_x$:H film of the present invention have such a state that the dangling bonds of the film constituting atoms are reduced to a desired low level. This makes it possible to introduce a p-type dopant into the film very easily and efficiently. (In the case of a conventional ZnSe film, it was difficult to impart p-type conductivity to it by the introduction of a p-type dopant.) Therefore, according to the present invention, it is possible to provide a p-type ZnSe:H:$M_p$ film and $ZnSe_{1-x}Te_x$:H:M film (where $M_p$ represents a p-type dopant). Both films have outstanding p-type semiconductor characteristics, a desired state in which the stress is relieved as mentioned above, very good electrical and mechanical characteristics, and good adhesion to the substrate and other films.

The ZnSe:H:$M_p$ film and $ZnSe_{1-x}Te_x$:H:$M_p$ film of the present invention contain a p-type dopant (represented by $M_p$) which is selected from the Group IA elements (i.e., Li, Na, K, and Rb), the Group IB elements (i.e., Cu and Ag), and the Group IA elements (i.e., P, As, and Sb). Preferable among them are Li and P. The amount of $M_p$ in the film should be 2 to $1 \times 10^4$ atomic ppm, preferably 30 to $5 \times 10^3$ atomic ppm, and most desirably 50 to $\times 10^3$ atomic ppm.

In addition, the ZnSe:H film and $ZnSe_{1-x}Te_x$:H films of the present invention permit the easy introduction of an n-type dopant as well as said p-type dopant. (An n-type dopant is represented by $M_n$ hereinafter.) Thus the present invention provides an outstanding functional deposited film of n-type conductivity. In this case, $M_n$ is selected from Group III-B elements (i.e., B, Al, Ga, and In), Group IV-B elements (i.e., Si, Ge, C, Al, Ga, and Sn), and Group VII-B elements (i.e., F, Cl, Br, and I). Preferable among them are Al, Ga, In, and B.

The amount of $M_n$ in the film should be 2 to $1 \times 10^4$ atomic ppm, preferably 30 to $5 \times 10^3$ atomic ppm, and most desirably 50 to $1 \times 10^3$ atomic ppm.

As mentioned above, the functional deposited film of the present invention is characterized by the content of hydrogen atoms in the film being in a specific range and the ratio of crystal grain domains per unit volume is also in a specific range. With a hydrogen content less than 1 atomic%, the deposited film is not satisfactory on account of an excessive amount of dangling bonds. With a hydrogen content in excess of 4 atomic%, the deposited film is not satisfactory on account of lattice disturbance, voids, and defects. On the other hand, with the ratio of crystal grain domains less than 65 vol%, the deposited film is not satisfactory because the amount of crystal grains, which is one of the factors affecting the electrical properties, is reduced. With the ratio of crystal grain domains in excess of 85 vol%, the deposited film is not satisfactory on account of the formation of grain boundary (resulting from the direct bonding of crystals) which leads to lattice defects.

The ZnSe:H:M film (where M denotes a p-type or n-type dopant) having the p-type or n-type conductivity pertaining to the present invention has a specific composition and structure. That is, it is a deposited film containing a specific amount of hydrogen atoms and having the specific ratio of crystal grains per unit volume of the film. Therefore, it has very few defects and is greatly improved in electrical conductivity over the conventional ZnSe film. The band gap of the ZnSe:H:M film having the p-type or n-type conductivity is about 2.67 eV, which is effective for the absorption of short-wavelength light. This suggests that it would be possible to produce a photovoltaic element having a high conversion efficiency for short-wavelength light if the film is made into a proper layer structure that fully utilizes the above-mentioned effect.

In the case where the $ZnSe_{1-x}Te_x$ film is used as a photovoltaic element such as solar cells in high latitudes (like Japan) where there are no sufficient ultraviolet rays of 500 nm or below, the material constituting the layer in which photoelectric charge separation occurs should preferably have a band gap of 2.4 eV or below. This requirement is met when the ratio of Se to Te is in the range of 3/7 to 0/10, as indicated by FIG. 20.

The film with p-type doping has high p-type conductivity when the ratio of Se to Te is in the range of 10:0 to 9:1 and also in the range of 3:7 to 1:9, as indicated by FIGS. 17 and 18.

The fact that the p-type conductivity is high in the case of this range may be explained in relation to the ratio of the crystal grain domains at different Se/Te ratios shown in FIG. 21.

When the ratio of Se to Te in the film is in the range of 10:0 to 9:1 and also in the range of 3:7 to 1:9, the ratio of crystal grain domains is 65 vol% and over. Therefore, the p-type dopant produces a marked doping effect.

It is noted from FIG. 21 that in the case of the non-doped $ZnSe_{1-x}Te_x$ film the ratio of crystal grain domains is high regardless of the Se/Te ratio. In the case of the film with an n-type dopant (Ga), the ratio of crystal grain domains is also sufficiently high (although with a slight decrease) regardless of the Se/Te ratio. By contrast, in the case of the film with a p-type dopant (Li), the ratio of crystal grain domains is generally low, particularly when the Se/Te ratio is in the range of 8:2 to 4:6. The foregoing suggests that the p-type doped film has good characteristics when the Se/Te ratio in the film is in the range of 3:7 to 1:9.

The $ZnSe_{1-x}Te_x$:H:M film (where M denotes a p-type or n-type dopant) having the p-type or n-type conductivity pertaining to the present invention has a specific composition and structure. That is, it is a deposited film containing a specific amount of hydrogen atoms and having the specific ratio of crystal grains per unit volume of the film. Therefore, it has very few defects and is greatly improved in electrical conductivity over the conventional $ZnSe_{1-x}Te_x$ film. The band gap of the $ZnSe_{1-x}Te_x$:H:M film having the p-type or n-type conductivity is about 2.3 to 2.4 eV, which is effective for the absorption of short-wavelength light (sunlight of AM 1.5~2). This suggests that it would be possible to produce a photovoltaic element having a high conversion efficiency for short-wavelength light (sunlight of AM 1.5~2) if the film is made into a proper layer structure that fully utilizes the above-mentioned effect.

The photovoltaic element of the present invention is that of layer structure having a pn junction. This pn junction generates a great internal electric field upon exposure to light. Therefore, if a good junction is formed for the materials having a large band gap, it will be possible to obtain a photovoltaic element that generates a high open-circuit voltage (Voc).

One embodiment of the photovoltaic element of the present invention is made up of a p-type or n-type semiconductor layer which is a ZeSe:H:M film having p-type or n-type conductivity and also having improved electrical conductivity, and another semiconductor layer of opposite conductivity type which is a semiconductive deposited film having almost the same large band gap as the semiconductor layer of said ZnSe:H:M film and also having good electrical properties.

Another embodiment of the photovoltaic element of the present invention is made up of a p-type or n-type semiconductor layer which is a $ZnSe_{1-x}Te_x$:H:M film having p-type or n-type conductivity and also having improved electrical conductivity, and another semiconductor layer of opposite conductivity type which is a semiconductive deposited film having almost the same large band gap as the semiconductor layer of said $ZnSe_{1x}Te_x$:H:M film and also having good electrical properties.

In both of the above mentioned embodiments, the semiconductor layer of opposite conductivity type is a deposited film of ZnO, ZnS, or ZnSe having n-type conductivity, or a deposited film of ZnTe or CdTe having p-type conductivity. If necessary, these deposited films are made p-type by the addition of a corresponding p-type dopant. For example, an n-type dopant for ZnS is Cl, Br, or al, and an n-type dopant for ZnSe is Br, Ga, or Al. A p-type dopant for ZnTe is Cu, Ag, or P, and a p-type dopant for CdTe is Li, Sb, or P. If the semiconductor film is to have band gap intermediate that of ZnSe and ZnTe, the stoichiometric ratio of Se and Te should be properly established with respect to Zn. For a compound represented by $ZnSe_{1-y}Te_y$, this is accomplished by establishing a proper value for y within the range of $0 < y < 1$.

Further, another embodiment of the photovoltaic element of the present invention is made up of a p-type or n-type semiconductor layer which is a ZnSe:H:M film having the p-type or n-type conductivity and also having improved electrical conductivity, and another semiconductor layer of opposite conductivity type which is a $ZnSe_{1-x}Te_x$ deposited film having almost the same large band gap as the semiconductor layer of said ZnSe:H:M film and also having good electrical properties.

The photovoltaic elements according to the present invention may be represented by the above-mentioned three types. All of them provide a high Voc as well as a high photoelectric conversion efficiency for short-wavelength light because the ZnSe:H:M film or $ZnSe_{1-x}Te_x$:H:M film is combined with the other semiconductor film.

The films have very few defects and high transmission of long-wavelength light, and consequently they provide selective absorption for short-wavelength light and a high photoelectric conversion efficiency. Because of this feature, the photovoltaic element of the present invention may be advantageously applied to solar cells which achieve more efficient photoelectric conversion than conventional ones made of A-Si under fluorescent lamps which emit comparatively short-wavelength light. In addition, the photovoltaic elements of the present invention may be used as the cell which is placed at the incident light side of a solar cell of tandem type or triple type. A solar cell of such structure, when exposed to the sun, provides a high photoelectric conversion efficiency for short-wavelength light and permits a larger amount of long-wavelength light to reach the lower cells. Thus the solar cell can convert almost all the entire sunlight spectrum into electricity. In addition, it is stable in both composition and structure to light.

The following describes a typical example of the photovoltaic element of layer structure based on the functional deposited film of the present invention. The following description, however, is not intended to restrict the photovoltaic element of the present invention.

FIGS. 1(A) and 1(B) schematically show a typical example of the photovoltaic element of layer structure which is based on the functional deposited film of the present invention.

In FIG. 1(A) there is shown a photovoltaic element 100 which is composed of a substrate 101, an electrode 102, an n-type semiconductor layer 103, a p-type semiconductor layer 104, a transparent electrode 105, and a collecting electrode 106 placed on top of the other. The transparent electrode 105 is exposed to the incident light.

In FIG. 1(B) there is shown a photovoltaic element 100 which is composed of a transparent substrate 101, a transparent electrode 105, a p-type semiconductor layer 104, an n-type semiconductor layer 103, and an electrode 102 placed on top of the other. The substrate 101 is exposed to the incident light.

It is possible to interchange the n-type semiconductor layer and the p-type semiconductor layer according to the intended use.

FIG. 1(C) schematically shows for comparison a typical example of a conventional photovoltaic element of layer structure which is based on pin type A-Si film.

In FIG. 1(C) there is shown a photovoltaic element 110 which is composed of a substrate 101, an electrode 102, an n-type A-Si semiconductor layer 107, an i-type A-Si semiconductor layer 108, a p-type semiconductor layer 109, a transparent electrode 105, and a collecting electrode 106 placed on top of the other. The transparent electrode 105 is exposed to the incident light.

The following will describe the structure of the photovoltaic element.

Substrate

The substrate 101 used in the present invention may be of single crystal material or non-single crystal material. In addition, it may be an electrically conductive material or insulating material, and it may be transparent or opaque. Examples of the substrate include Fe, Ni, Cr, Al, Mo, Au, No, Ta, V, Ti, Pt, and Pb and alloys thereof (such as brass and stainless steel). Additional examples of the substrate include synthetic resin (in the form of film or sheet) such as polyester, polyethylene, polycarbonate, cellulose acetate, polypropylene, polyvinyl chloride, polyvinylidene chloride, polystyrene, polyamide, and polyimide, and glass and ceramics.

The single crystal substrate may be formed by slicing into wafers a single crystal of Si, Ge, C, NaCl, KCl, LiF, GaSb, InAs, InSb, GaP, MgO, $CaF_2$, $BaF_2$, or $\alpha$-$Al_2O_3$. The wafer may have an epitaxially grown layer of the same substance as the wafer or of a substance having a lattice constant close to that of the wafer.

The substrate may take on any shape according to the intended object and application. It may be a flat plate, long belt, or cylinder, each having a smooth surface or irregular surface. The substrate may have a thickness suitable for the desired photovoltaic element. For a photovoltaic element which is required to be flexible, the substrate can be made as thin as possible so long as it functions satisfactorily. Usually, the substrate is thicker than 10 $\mu$m from the standpoint of manufacturing and handling properties and mechanical strength.

Electrodes

The electrodes for the photovoltaic element of the present invention may be varied according to the construction of the element. There are three kinds of electrodes: lower electrode, upper electrode (transparent electrode), and collecting electrode. (The upper electrode denotes the one which is exposed to the incident light, and the lower electrode denotes the one which is placed opposite to the upper electrode with a semiconductor layer between.) These electrodes will be explained in the following.

(i) Lower electrode

The lower electrode 102 used in the present invention is placed in a different position depending on whether the above-mentioned substrate 101 is transparent or opaque. (If the substrate 101 is made of an opaque material such as metal, the transparent electrode 105 is exposed to the incident light.)

In the case of layer structure as shown in FIGS. 1(A) and 1(C), the lower electrode is placed between the substrate 101 and the n-type semiconductor layer 103. However, in the case where the substrate 101 is electrically conductive, it may function also as the lower electrode. In the case where the substrate 101 is electrically conductive but has a high resistance, the electrode 102 may be added as a low-resistance electrode for current output or in order to increase the reflectivity at the substrate surface, thereby utilizing the incident light more efficiently.

In the case shown in FIG. 1(B), the substrate 101 is made of a transparent material, and it is exposed to the incident light. Therefore, the lower electrode 102 for current output is placed in the uppermost layer above the substrate 101.

In the case where the substrate 101 is made of an electrically insulating material, the lower electrode 102, as an electrode for current output, is placed between the substrate 101 and the n-type semiconductor layer 103.

The electrode may be made of a metal such as Ag, Au, Pt, Ni, Cr, Cu, Al, Ti, Zn, Mo, and W. One of these metals is formed into a thin film by vacuum deposition, electron beam deposition, or sputtering. The thus formed metal thin film should not constitute a resistance component for the photovoltaic element. Therefore, it should have a sheet resistance value of 50 $\Omega$ or below, preferably 10 $\Omega$ or below.

It is also possible to place a diffusion prevention layer of conductive zinc oxide or the like between the lower electrode 102 and the n-type semiconductor layer 103 or 107. The diffusion prevention layer prevents the metal elements constituting the electrode 102 from diffusing into the n-type semiconductor layer. Having a certain resistance value, it also prevents shorts which would otherwise occur across the lower electrode 102 and the transparent electrode 105, with a semiconductor layer interposed between them, on account of pinholes or other defects. It also confines the incident light in the photovoltaic element through multiple interference by thin film.

(ii) Upper electrode (transparent electrode)

The transparent electrode 105 used in the present invention should preferably have a light transmittance higher than 85% so that it permits the semiconductor layer to efficiently absorb sunlight and fluorescent light. In addition, it should have a sheet resistance lower than 100 Ω so that it does not increase the internal resistance of the photovoltaic element to impair the performance. It may be made of thin metal oxide film of $SnO_2$, $In_2O_3$, ZnO, CdO, $Cd_2SnO_4$, and ITO ($In_2O_3+SnO_2$), or thin metal film of Au, Al, and Cu. In FIG. 1(A), the transparent electrode is placed on the p-type semiconductor layer 104, and in FIG. 1(B), it is placed on the substrate 101. Therefore, it is required to have food adhesion to them. It can be formed by resistance heating deposition, electron beam heating deposition, sputtering, or spraying.

(iii) Collecting electrode

The collecting electrode used in the present invention is placed on the transparent electrode 105 to reduce its surface resistance It is a thin film made of Ag, Cr, Ni, Al, Ag, Au, Ti, Pt, Cu, Mo, or W, or alloy thereof. The thin film may be used in laminated layer. The shape and area of the thin film are designed so that the semiconductor layer receives a sufficient amount of incident light. For example, it may spread all over the light receiving surface of the photovoltaic element, and it may have an area of 15% or less, preferably 10% of less, of the light receiving surface. The sheet resistance should be 50 Ω or less, preferably 10 Ω or less.

p-type and n-type semiconductor layers

The p-type and n-type semiconductor layers used in the present invention will be described in more detail in the following.

Either of the p-type or n-type semiconductor layers used in the photovoltaic element of the present invention is prepared from the above-mentioned p-type or n-type ZnSe:H:M film or p-type or n-type $ZnSe_{1-x}Te_x$:H:M film. The reason for this is explained in detail in the following.

Heretofore, the semiconductor material capable of photoelectric conversion for short-wavelength light having high energy has been produced from the compound semiconductors, such as ZnS, ZnSe, ZnTe, CdS, CdSe, and ZnO. which have comparatively large band gaps. These semiconductors can be produced by the commonly used depositing method and they are capable of n-type doping in a comparatively easy way. However, excepting ZnTe, they are not capable of p-type doping.

The present inventors attempted to make a pn-junction between an n-type or p-type semiconductor film and one of the following semiconductor films: a p-type ZnTe semiconductor film, a p-type ZnSe:H:Li film and, an n-type ZnSe:H:Al film discussed in Experiment C mentioned above, and a p-type $ZnSe_{1-x}Te_x$:H:Li film and an n-type $ZnSe_{1-x}Te_x$:H:Al film discussed in Experiment F mentioned above. The thus prepared photovoltaic elements were evaluated from the standpoint of adhesion and open-circuit voltage (Voc).

The photovoltaic element has a layer structure as shown in FIG. 1(B). The substrate is made of quartz glass, the transparent electrode is an ITO film formed by sputtering, and the lower electrode is an Ag thin film formed by the electron beam heating method. The p-type ZnTe semiconductor film, n-type ZnS, ZnSe, CdS, CdSe, and ZnO semiconductor films, and p-type ZnTe and CdTe semiconductor films were prepared by the sputtering method. The dopants for the semiconductor films are shown in Table 7. The results of evaluation are shown in Table 7.

It is noted from Table 7 that the pn-junction type photovoltaic elements that employ the p-type ZnTe semiconductor film as the Group II-VI compound semiconductor are mostly of no practical use. By contrast, the pn-junction type photovoltaic elements according to the present invention which employ the p-type or n-type ZnSe:H film or p-type or n-type $ZnSe_{1-x}Te_x$:H film provide good adhesion and high open-circuit voltages.

It is concluded form the foregoing that the present invention provides p-type or n-type ZnSe:H films and p-type or n-type $ZnSe_{1-x}Te_x$:H films which, on account of their good electrical and mechanical properties, are suitable for the p-type or n-type semiconductor layer of the pn-junction photovoltaic element of the present invention capable of efficient photoelectric conversion for short-wavelength light.

To produce a good pn-junction in the present invention, it is desirable to form the n-type semiconductor layer and p-type semiconductor layer continuously. To be more specific, they may be formed by continuous deposition in the same apparatus. Alternatively, the may be formed in two apparatuses connected to each other through a gate valve. In the latter case, an n-type semiconductor layer is formed on a substrate in one apparatus, and then the substrate is transferred in a vacuum to the other apparatus in which a p-type semiconductor layer is formed on the n-type semiconductor layer.

In the meantime, one of the following three processes can be used to produce the above-mentioned ZnSe:H film, $ZnSe_{1-x}Te_x$:H film, p-type or n-type ZnSe:H:M film, and p-type or n-type $ZnSe_{1-x}Te_x$:H:M film.

(1) A process for producing the functional deposited film made of ZnSe:H which comprises the steps of introducing an Se-containing raw material gas and hydrogen gas ($H_2$), (and an optional Te-containing raw material gas) into an activating zone independent of the film-forming chamber, imparting activating energy to these gases, thereby forming an Se-containing precursor and hydrogen radicals in atomic state (and an optional Te-containing precursor), introducing the gas containing said precursor and hydrogen radicals i-to the film-forming chamber, simultaneously introducing a Zn-containing raw material gas into said film-forming chamber, and causing said gases to chemically react with each other in the space covering the surface of the temperature-controlled substrate arranged in said film-forming chamber.

(2) A process for producing the functional deposited film made of ZnSe:H or $ZnSe_{1-x}Te_x$:H which comprises the steps of introducing an Se-containing raw material gas, hydrogen gas ($H_2$), and a Zn-containing gas, (and an optional Te-containing raw material gas) into a film-forming chamber in which a substrate is arranged and the gases are mixed, applying a high-frequency power to a cathode installed in said film-forming chamber, thereby producing plasma in the reaction space of the film-forming chamber, and causing said gases to chemically react with one another through decomposition, polymerization, radicalization, and ionization.

(3) A process for producing the functional deposited film made of ZnSe:H or $ZnSe_{1-x}Te_x$:H which comprises the steps of introducing an Ar gas and $H_2$ gas into a film-forming chamber in which a substrate is arranged and a cathode is arranged opposite to said substrate a certain distance apart, said cathode being provided on the surface thereof with a target of polycrystal ZnSe or polycrystal $ZnSe_{1-x}Te_x$, applying a high-frequency power to said cathode, thereby sputtering said polycrystal ZnSe or polycrystal $ZnSe_{1-x}Te_x$ and also forming a plasma environment in said reaction space, and causing Se and Zn (and also Te) in the atomic state emitted from the target and hydrogen in the atomic state formed by the plasma exitation of the $H_2$ gas to chemically react with one another in the space near the surface of the substrate.

The functional deposited film produced by any of the above-mentioned three processes (1) to (3) may be given semiconductor characteristics by the introduction of a dopant. Particularly, it is possible to introduce a p-type dopant into the ZnSe:H film or $ZnSe_{1-x}Te_x$:H film. This makes it possible to provide a ZnSe:H film or $ZnSe_{1-x}Te_x$:H film having the p-type conductivity which could not be produced in the past. The doping may be accomplished by introducing a gas containing a p-type dopant, alone or in combination with hydrogen gas, into the film-forming chamber. Needless to say, it is also possible to make an n-type semiconductor from the ZnSe:H film or $ZnSe_{1-x}Te_x$:H film by using a gas containing an n-type dopant in the same manner as in the preparation of p-type semiconductor.

The above-mentioned processes (1) to (3) of the present invention will be described in more detail in the following.

Processes (1) and (2)

The raw material to introduce Zn ("raw material A" for short) should preferably be an easily gasifiable alkyl zinc represented by the formula R-Zn (where R denotes an alkyl residue having 1 to 4 carbon atoms). Typical examples of the alkyl zinc include dimethyl zinc (DMZn) and diethyl zinc (DEZn). Being liquid at normal temperature, these organozinc compounds should be gasified by bubbling with an inert gas carrier such as Ar and He at the time of use.

The raw material to introduce Se ("raw material B" for short) should preferably be a gaseous or easily gasifiable hydrogen selenide ($H_2Se$), selenium halide, or alkyl selenium compound represented by the formula R'-Se (where R' denotes an alkyl residue having 1 to 4 carbon atoms). Preferred examples of the selenium halide include selenium hexafluoride. Preferred examples of the alkyl selenium compound include dimethyl selenium (DMSe) and diethyl selenium (DESe).

The raw material to introduce Te should preferably a gaseous or easily gasifiable hydrogen telluride ($H_2Te$), tellurium halide, or alkyl tellurium compound represented by the formula R'-Te (where R' denotes an alkyl residue having 1 to 4 carbon atoms). Preferred examples of the tellurium halide include tellurium hexafluoride. Preferred examples of the alkyl tellurium compound include dimethyl tellurium (DMTe) and diethyl tellurium (DETe).

Incidentally, the raw materials to introduce Se and Te are collectively referred to as "raw material B" hereinafter.

Among the compounds of raw material B, those which are not gaseous but liquid or solid at normal temperature should be gasified at the time of use by bubbling with an inert carrier gas such as Ar and He, or by sublimation with heating.

In the production of the ZnSe:H film or $ZnSe_{1-x}Te_x$:H film by the process (1) or (2), the $H_2$ gas plays an important part.

According to a preferred embodiment of the process (1), the gaseous raw material B and $H_2$ gas in combination are introduced into the activation area, in which they are excited by activating energy. For non-gaseous raw material B, the activating zone may be constructed such that raw material B is gasified by the ad of said inert gas or $H_2$ gas and the thus formed gas is excited.

Needless to say, in the process (1) it is possible to introduce $H_2$ gas alone into an activating zone independent of said activating zone, in which the $H_2$ gas is excited.

The activating energy may be discharge energy, thermal energy, or light energy, or a combination thereof.

The excitation of raw material B may be accomplished by the aid of a proper catalyst as well as activating energy.

The above-mentioned process (1) or (2) of the present invention may be practiced in the following manner to produce the p-type or n-type ZnSe:H film or the p-type or n-type $ZnSe_{1-x}Te_x$:H film. That is, a gaseous raw material to provide a p-type dopant or n-type dopant ("p-type or n-type dopant raw material" for short) is introduced, alone, or together with gaseous raw material A or gaseous raw material B, or together with $H_2$ gas, into the film-forming chamber.

The p-type dopant raw material should preferably be gaseous or easily gasifiable compound. Examples of the p-type dopant raw material include organolithium compounds such as propyl lithium ($LiC_3H_7$) and sec-butyl lithium ($Li(sec-C_4H_9)$) which are liquid at normal temperature; and inorganic lithium compounds such as lithium sulfide ($Li_2S$) and lithium nitride ($Li_3N$) which are solid at normal temperature. Additional preferred examples include $AsH_3$, $PH_3$, $P_2H_4$, $AsF_3$, $AsCl_3$, $PF_5$, $PF_3$, $PCl_3$, $SbH_3$, and $SbF_3$.

The n-type dopant raw material, like the p-type dopant raw material, may be selected from those compound which are gaseous or easily gasifiable at normal temperature. Preferred examples of such compounds include trimethyl aluminum ($Al(CH_3)_3$), triethyl aluminum ($Al(C_2H_5)_3$), trimethyl gallium ($Ga(CH_3)_3$), triethyl gallium ($Ga(C_2H_5)_3$), trimethyl indium ($In(CH_3)_3$), triethyl indium ($In(C_2H_5)_3$), diborane ($B_2H_6$), monosilane ($SiH_4$), disilane ($Si_2H_6$), monogermane ($GeH_4$), tin hydride ($SnH_4$), methane ($CH_4$), ethane ($C_2H_6$), ethylene ($C_2H_4$), acetylene ($C_2H_2$), fluorine ($F_2$), and chlorine ($Cl_2$).

In the case where the p-type or n-type dopant raw material is liquid at normal temperature, it should be gasified at the time of use by bubbling with an inert gas such as Ar or He or $H_2$ gas as a carrier gas. In the case where the p-type or n-type dopant raw material is solid at normal temperature, it should be gasified at the time of use by sublimation with heating by the aid of a carrier gas such as Ar and He in a sublimation furnace.

In the case where the p-type or n-type ZnSe:H:M film or the p-type or n-type $ZnSe_{1-x}Te_x$:H:M film is produced by the above-mentioned process (1), the dopant raw material should preferably be introduced into the activation zone together with the gaseous raw material B and $H_2$ gas.

The above-mentioned process (1) or (2) of the present invention may be practiced in the following manner to produce the ZnSe:H film or $ZnSe_{1-x}Te_x$:H film, the p-type or n-type ZnSe:H:M film, or the p-type or n-type $ZnSe_{1-x}Te_x$:H:M film. That is, the substrate is kept at 50° to 600° C., preferably 50° to 500° C., and most desirably 100° to 400° C. during film formation. So long as the substrate temperature is in the range of 50° to 600° C., usually there is obtained a deposited film in which crystal grain domains and non-crystal grain domains coexist, if the amount of hydrogen radicals or the flow rate of $H_2$ gas is changed during film formation.

One of the important film forming factors in the above-mentioned processes (1) and (2) is the internal pressure. The internal pressure should be established at $1 \times 10^{-4}$ to 50 Torr, preferably $5 \times 10^{-3}$ to 10 Torr, and most desirably $1 \times 10^{-3}$ to 5 Torr. To maintain this internal pressure, it is necessary to properly control, according to the desired film, the flow rate of gaseous raw material A, gaseous raw material B, hydrogen gas, an gaseous p-type dopant raw material which enter and leave the film forming chamber.

In the process (1) of the present invention, gaseous raw material A and gaseous raw material B and hydrogen radicals in the atomic state are introduced into the film forming chamber at a proper ratio which is established according to the desired characteristics of the deposited film. That is, the ratio of the total amount of the fi two components to the amount of the last component should be 1:10 to $1:10^4$, preferably 1:25 to $1:10^3$.

In the process (2) of the present invention, gaseous raw material A and gaseous raw material B and hydrogen are introduced into the film forming chamber at a proper ratio which is established according to the high-frequency power to be applied, the internal pressure, and the of hydrogen to be contained in the deposited film which are related to one another. That is, the ratio of the total amount of the first two components to the amount of the last component should be 1:20 to $1:5 \times 10^4$, preferably 1:30 to $1:5 \times 10^3$.

Process (3)

This process is designed to produce the above-mentioned ZnSe:H film or $ZnSe_{1-x}Te_x$:H film, the p-type or n-type ZnSe:H:M film, or the p-type or n-type $ZnSe_{1-x}Te_x$:H:M film by means of sputtering, as mentioned above.

The target used in sputtering is typically polycrystal ZnSe or polycrystal $ZnSe_{1-x}Te_x$ containing Se and Te in desired ratio. It may also be possible to use two of Zn and Se, two targets of ZnSe and ZnTe, or three targets of Zn, Se, and Te. In the case where sputtering is performed by the application of high-frequency power to the target, it is preferable to form a gas atmosphere composed of $H_2$ gas and Ar gas and/or He gas.

In the production of the ZnSe:H film or $ZnSe_{1-x}Te_x$:H film, the p-type or n-type ZnSe:H:M film, or the p-type or n-type $ZnSe_{1-x}Te_x$:H:M film is produced according to process (3), the important film forming conditions include the target-to-substrate distance, the high-frequency power, the substrate temperature, the internal pressure, and the gas flow rate. The target-to-substrate distance may vary depending on the construction and scale of the equipment used. Usually, it is 20 to 100 mm, preferably 40 to 80 mm. The high-frequency power may vary depending on the type and size of the target. Usually, it is 0.3 to 7 W/cm$^2$, preferably 0.8 to 4 W/cm$^2$. The substrate temperature should be established in the same range as in the above-mentioned process (1) or (2). The internal pressure at the time of film forming should be $1 \times 10^{-5}$ to $1 \times 10^{-1}$ Torr, preferably $1 \times 10^{-4}$ to $1 \times 10^{-2}$ Torr. The $H_2$ gas and Ar gas and/or He gas and the p-type dopant raw material should be properly controlled in relation to the amount of Zn and Se (or also the amount of Te) in atomic state which are emitted from the target during sputtering. The flow rate of the gases should be controlled by mass flow controllers such that the gas atmosphere in the reaction zone of the film forming chamber contains a prescribed amount of hydrogen atoms (H) or a prescribed amount of hydrogen atoms (H) and dopant (M) (or H+M). In addition, the gases are introduced into the film forming chamber and then discharged from the film forming chamber such that the above-mentioned internal pressure is maintained. According to the present invention, a certain ratio should be established between the total amount of Zn and Se (and also Te) in the atomic state and the amount of hydrogen atoms (H) or the amount of hydrogen atoms (H) and dopant (M) (or H+M). The ratio should be $10^2:1$ to $1:10^3$, preferably 10:1 to $1:10^2$, and most desirably 5:1 to 1:50.

Figure 3:
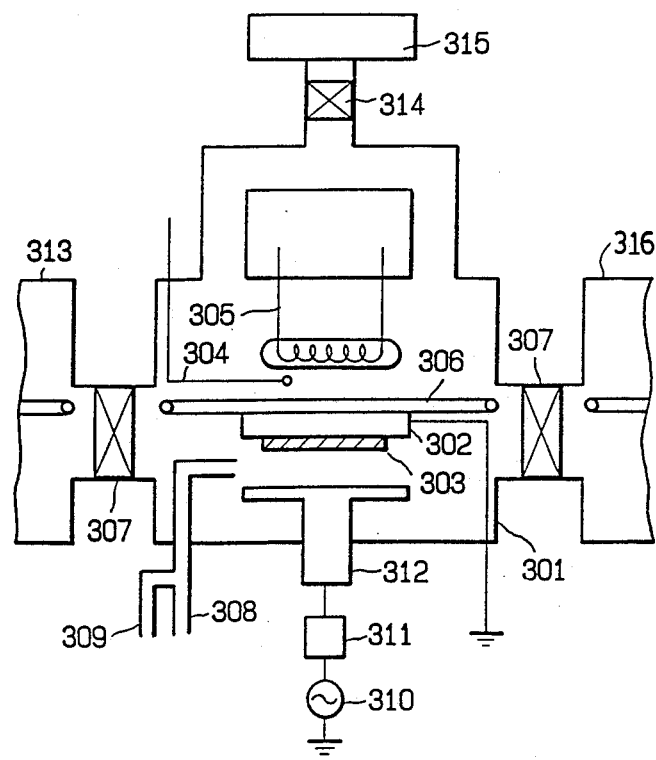
FIG. 3 is a schematic diagram showing the apparatus for forming a deposited film according to process (2) of the present invention.
Figure 4:
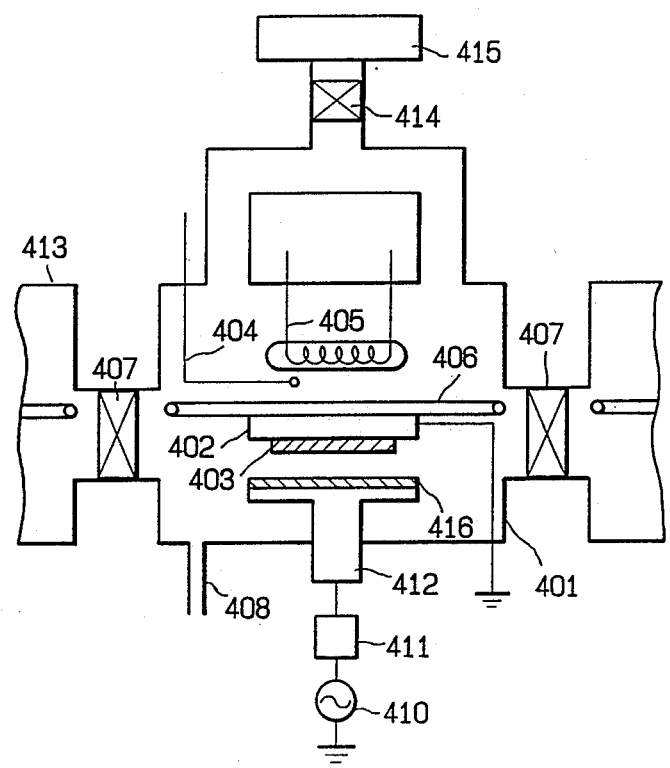
FIG. 4 is a schematic diagram showing the apparatus for forming a deposited film according to process (3) of the present invention.

As mentioned above, the process of the present invention may be practiced by using a proper apparatus. Typical examples of the apparatus are shown in FIGS. 2 to 4.

FIG. 2 schematically shows a preferred example of the apparatus used to practice process (1) of the present invention. In FIG. 2 there is shown a film forming chamber 201 in which is installed a substrate holder 202. There is shown a substrate 203 which is fixed onto the substrate holder 202. The substrate 203 is heated by radiation from an infrared heater 205, while being monitored by a temperature monitor 204. The substrate holder 202 is transferred to the other film forming chamber 213 or a load lock chamber 212 through a gate valve 207 by a substrate transfer unit 206. Raw material gas (A) is introduced into the film forming chamber 201 through the gas inlet pipe (A) 208. Raw material gas (B) and hydrogen gas are introduced through the gas inlet pipe (B) 209. The gases are activated in an activation chamber 210 by an activating means 211, and then introduced into the film forming chamber 201. The activating means is any means to decompose, polymerize, radicalize, or ionize raw material gases (A) and (B) and hydrogen gas by the aid of electric energy (such as direct current, high-frequency, and microwave), light energy, heat energy, or catalyst, thereby promoting the reaction of raw material gases and (B) and hydrogen gases and also promoting the on the substrate surface.

The gases in the film forming chamber are exhausted through a valve 214 by an evacuating pump 215, so that the pressure in the film forming chamber is kept at a prescribed level.

The following procedure is employed to produce the ZnSe:H film of the present invention by using the apparatus shown in FIG. 2.

At first, Se-containing raw material gas (B) such DESe and hydrogen gas are supplied through the gas inlet pipe 209. The gases are activated in the activating chamber 210 by activating energy provided by the activating means 211. Thus there are formed a Se-containing precursor and hydrogen radicals in atomic state.

On the other hand, the Zn-containing raw material (A) such as DEZn entering through the other gas inlet 208 is introduced into the film forming chamber 201 without being excited by the activating means because the discharge opening of the gas inlet pipe 208 is located downstream the activating chamber 210. In the film forming chamber, the Zn-containing raw material gas (A) reacts with hydrogen radicals to form a Zn-containing precursor.

Upon introduction into the film-forming chamber, the Se-containing precursor, Zn-containing precursor, and hydrogen radicals react with one another to form a ZnSe:H film containing a desired amount of hydrogen.

It is considered that hydrogen radicals take part the reaction for film deposition on the substrate surface That is, they remove unnecessary alkyl groups from the deposited film and also function as a terminator for dangling bonds in the ZeSe thin film. The activating energy in the activating chamber can be brought to the film-forming chamber if the amount of energy imparted by the activating means is increased according to need to promote the reaction of Zn-containing raw material gas with hydrogen radicals and the reaction of Zn-containing precursor with Se-containing precursor in the reaction chamber and also to increase the amount of hydrogen radicals to be supplied. The amount of hydrogen atoms contained in the ZnSe:H film can be controlled by properly establishing the flow rate of hydrogen gas introduced as a raw material gas, the amount of activating energy to be imparted, the pressure in the film-forming chamber, the distance between the activating chamber 210 and the discharge opening of the gas inlet pipe 208, and the substrate temperature. The deposited film can be made p-type or n-type by adding the above-mentioned dopant raw material to the raw material gas (A) or raw material gas (B). In the case of $ZnSe_{1-x}Te_x$, the raw material gas (B) is introduced, together with a Te-containing raw material gas such as DETe, into the system.

FIG. 3 schematically shows a preferred example of the apparatus used to practice process (2) of the present invention. When this apparatus is in operation, raw material gas (A) is introduced through the gas inlet pipe 308 and raw material gas (B) and hydrogen gas are introduced through the gas inlet pipe 309. The mixed gas is decomposed, polymerized, radicalized, and ionized in plasma generated by high-frequency power applied to cathode 312 from the high-frequency source 310 through the matching circuit 311. As a result of reactions, a ZnSe:H thin film is formed on the substrate 303. By continuing the supply of raw materials together with the above-mentioned dopant raw material, the deposited film is doped p-type or n-type. In the case of $ZnSe_{1-x}Te_x$, the raw material gas (A) is mixed with a Te-containing raw material gas.

FIG. 4 schematically shows a preferred example of the apparatus used to practice process (3) of the present invention. There is shown a cathode 412, onto which is attached a target 416 of ZnSe polycrystal. Ar gas and $H_2$ gas are introduced through the gas inlet 408 and they ionized by plasma generated by high-frequency power applied to the cathode. The resulting Ar ions and H ions bring about the sputtering of the target 416. Thus a ZnSe:H thin film is deposited on the substrate 403. By mixing the Ar gas and $H_2$ gas with the above-mentioned dopant raw material, the deposited film is doped into p-type or n-type.

DESCRIPTION OF THE PREFERRED EMBODIMENTS

The photovoltaic element of the present invention will be described in more detail with reference to the following examples, which are not intended to restrict scope of the invention.

EXAMPLE 1

A pn-junction photovoltaic element as shown in FIG. 1(A) was produced by using the deposited film forming apparatus as shown in FIG. 2, according to the above-mentioned process (1) of the present invention.

At first, a stainless steel substrate 101, measuring 50 mm by 50 mm, was placed in a sputtering apparatus (not shown). The sputtering apparatus was evacuated to $10^5$ Torr or below. On the substrate was deposited an Ag thin film (about 1000 Å thick) as the lower electrode 102 by sputtering Ag in argon. The substrate was removed from the sputtering apparatus and then fixed, with the lower electrode 102 facing downward, onto the substrate holder 202 on the substrate transfer unit 206 installed in the load lock chamber 212. The load lock chamber 212 was evacuated to $10^{-5}$ Torr or below by means of a vacuum pump (not shown). During evacuation, the film-forming chamber 201 was evacuated to $10^{-5}$ Torr or below by means of the vacuum pump 215. When the pressures in the two chambers became almost balanced, the two chambers were opened and the substrate transfer unit 206 was moved to the film forming chamber 201.

The substrate was heated to 200° C. by the infrared heater 205. Liquid DESe placed in the Dewar's bottle 223 was gasified by bubbling with argon gas supplied from the gas cylinder 217. The flow rate of argon gas was controlled to 15 sccm by means of the mass flow controller 219. The argon gas saturated with DESe was introduced into the gas inlet pipe 209. The flow rate of DESe was controlled to $1.5 \times 10^{-5}$ mol/min. The DEZn placed in the Dewar's bottle 225 and TeAl placed in the Dewar's bottle 226 were introduced into the gas inlet pipe 208 at respective flow rates of $1.0 \times 10^{-6}$ mol/min and $1.0 \times 10^{-10}$ mol/min in the same manner as above. The flow rate of the carrier argon gas was 5 sccm.

The amount of each of said DESe, DEZn and TEAl was controlled by controlling the temperature of the Dewar's bottles 223, 225, and 226 by means of the constant temperature water baths 227, 229, and 230. Reference numerals 235 to 238 respectively denote constant temperature control water baths and reference numerals 231 to 234 respectively denote heaters.

With the exhaust valve 214 properly opened, the internal pressure of the film-forming chamber 201 was kept at 0.5 Torr. Film-forming was started by applying microwave power (200 W) from the microwave (2.45 GHz) generator 211. After 6 minutes, there was obtained n-type ZnSe:Al film 103. The application of microwave power and the introduction of gases were suspended, and the film-forming chamber 201 was evacuated to $10^{-5}$ Torr or below by the vacuum pump 215.

Then, a p-type ZnSe:H:Li film 104 was formed on n-type ZnSe:Al film 103 in the same manner as above except that $LiC_3H_7$ (as a raw material gas) placed in the Dewar's bottle 224 was supplied at a flow rate of $1.0 \times 10^{-10}$ mol/min through the gas inlet pipe 208, and $H_2$ gas was introduced from the gas cylinder 216 at a flow rate of 15 sccm controlled by the mass flow controller 218. The film-forming took 30 minutes.

The substrate transfer unit 206 was moved to the load lock chamber 212 through the gate valve 207. After cooling, the substrate on which were deposited the n-type and p-type semiconductor layers was removed. The substrate was placed in a vacuum deposition apparatus, which was evacuated to $10^{-5}$ Torr or below. On the substrate was deposited an ITO thin film (about 700 Å thick) in an oxygen atmosphere at about $1 \times 10^{-3}$ Torr. The source of deposition was a 1:1 (by weight) mixture of In and Sn placed in a crucible which was heated by the resistance heating method. The substrate temperature 175° C. In this way the transparent electrode 105 was formed. After cooling, the substrate was removed. With a permalloy mask placed on the transparent electrode 105, the substrate was placed in a vacuum deposition apparatus which was evacuated to $1 \times 10^{-5}$ Torr or below. An Ag film (about 1.0 μm thick) was deposited by the resistance heating method to form the comb-shaped collecting electrode 106. Thus there was obtained Sample No. 1.

The characteristic properties of Sample No. 1 were evaluated in the following manner.

The open-circuit voltage (Voc) which is produced the transparent electrode 105 is irradiated with AM-1 light (100 mW/cm$^2$) was measured. The output which is produced when the transparent electrode 105 is irradiated with AM-1 light through a 400-nm interference filter was measured. The change $\Delta\eta$ in conversion efficiency that takes place after irradiation with AM-1 light for 10 hours was measured. The results of measurements are shown in Table 16.

Apart from the foregoing, ZnSe:H:Li films as a p-type semiconductor layer were formed alone on a silicon single crystal wafer (with an SiO$_2$ film formed thereon the thermal oxidation process) and also on a quartz glass substrate, in the same manner as mentioned above. The resulting deposited films were examined for the content of hydrogen atoms and the ratio of crystal grain domains. The results of measurements are shown in Table 16.

EXAMPLE 2

A pn-junction photovoltaic element as shown in FIG. 1(A) was produced by using the film-forming apparatus as shown in FIG. 3, according to the above-mentioned process (2) of the present invention.

On the stainless steel substrate 101 was deposited an Ag thin film as the lower electrode 102 in the same manner as in Example 1. The substrate was fixed onto the substrate holder 302. While the internal pressure in the film-forming chamber 301 was kept at $10^{-5}$ Torr or below, the substrate 303 was heated to 300° C. by means of the infrared heater 305. The raw material gas A and raw material gas B were introduced into the film-forming chamber 301 through the gas inlet pipes 308 and 309, respectively, under the conditions shown in Table 8.

With the exhaust valve 314 proper)y opened, the internal pressure of the film-forming chamber 301 was kept at 1.0 Torr. Film-forming was started by applying high-frequency power (50 W) from the high-frequency (13.56 MHz) generator 310. (The high-frequency generator 310 is connected to the cathode 312 through the matching circuit 311.) After discharging for 6 minutes, here was obtained an n-type ZnSe:Al film 103. The application of high-frequency power and the introduction of gases were suspended, and the film-forming chamber 301 was evacuated to $10^{-5}$ Torr or below. Then, raw material gases A and B as shown in Table 9 were introduced into the film-forming chamber 301.

With the internal pressure kept at 1.0 Torr, high-frequency power (50 W) was applied from the high-frequency source 310. After discharging for 30 minutes, there was obtained a p-type ZnSe:H:Li film 104 formed on the n-type ZnSe:Al film 103. The substrate with the deposited films was removed from the film-forming chamber. On the deposited films was formed an ITO film (about 700 Å thick) as the transparent electrode 105 in the same manner as in Example 1. On the ITO film was formed an Ag thin film as the collecting electrode 106. Thus there was obtained Sample No 2. The characteristic properties of Sample No. 2 as a solar cell were evaluated. The results are shown in Table 16.

Apart from the foregoing, p-type ZnSe:H:Li films were formed on a silicon wafer (with an SiO$_2$ film formed thereon) and also on a quartz substrate, in the same manner as mentioned above. The resulting deposited films were examined for the content of hydrogen atoms and the ratio of crystal grain domains in the same manner as Example 1. The results of measurements are shown in Table 16.

EXAMPLE 3

A pn-junction photovoltaic element as shown in FIG. 1(A) was produced by using the apparatus as shown in FIG. 4, according to the above-mentioned process (3) of present invention.

On the stainless steel substrate 101 was deposited the lower electrode of Ag in the same manner as in Example 1. The substrate was fixed onto the substrate holder and transferred into the film-forming chamber 401. The internal pressure in the film-forming chamber 401 was kept at $10^{-5}$ Torr or below. The ZnSe polycrystal target 416 was placed on the cathode 412. The substrate 403 was heated to 200° C. by means of the infrared heater 405. The raw material gases shown in Table 10 were introduced into the film-forming chamber 401 through the gas inlet pipe 408.

With the exhaust valve 414 properly opened, the internal pressure of the film-forming chamber 401 was at 0.05 Torr. Film-forming was started by applying high-frequency power (300 W). After discharging for 10 minutes, there was obtained an n-type ZnSe:Al film 103. The discharging and the introduction of gases were suspended.

The film-forming chamber was evacuated to $10^{-5}$ Torr or below, and raw material gases shown in Table 11 were introduced into the film-forming chamber. After discharging with a 300 W power at 0.05 Torr for 30 minutes, there was obtained a p-type ZnSe:H:Li film 104.

On the deposited films were formed an ITO film (about 700 Å thick) as the transparent electrode 105 and an Ag film as the collecting electrode 106. Thus there was obtained Sample No. 3. The characteristic properties of Sample No. 3 as a solar cell were evaluated. The results are shown in Table 16.

Apart from the foregoing, p-type ZnSe:H:Li films were formed on a silicon wafer (with an SiO$_2$ film formed thereon) and also on a quartz substrate, in the same manner as mentioned above. The resultant deposited films were examined for the content of hydrogen atoms and the ratio of crystal grain domains in the same manner as in Example 1. The results of measurements are shown in Table 16.

EXAMPLE 4

In the preparation of the photovoltaic element in Examples 1 to 3, the p-type ZnSe:H:Li film and the n-type ZnSe:Al film were produced in the same manner using the same film-forming chamber. Needless to say, however, the p-type and n-type semiconductor layers may be produced in different manners.

This example illustrates a pn-junction photovoltaic element composed of p-type and n-type semiconductor layers which were produced in different manners.

At first, on the stainless steel substrate 101 was deposited an Ag thin film (3000 Å thick) as the lower electrode 102. The substrate was fixed onto the substrate holder 302 shown in FIG. 3. On the substrate was deposited the n-type ZnSe:Al film 103 in the same manner as in Example 2. The film-forming chamber was evacuated to $10^{-5}$ Torr or below, and the substrate transfer unit 306 was moved into the second film-forming chamber 316 through the gate valve 307. The second film-forming chamber 316 is connected to the deposited film forming apparatus (shown in FIG. 2) through the gate valve 307. Subsequently, on the n-type ZnSe:Al film was formed the p-type ZnSe:H:Li film 104 in the same manner as in Example 1. On the p-type ZnSe:H:Li film were formed the transparent electrode 105 of ITO film and the collecting electrode 106 of Ag in the same manner as in Example 1. Thus there was obtained Sample No. 4. The characteristic properties of Sample No. 4 were evaluated. The results are shown in Table 17.

Apart from the foregoing, p-type ZnSe:H:Li films were formed on a silicon wafer (with an SiO$_2$ film formed thereon) and also on a quartz substrate, in the same manner as mentioned above. The resulting deposited films were examined for the content of hydrogen atoms and the ratio of crystal grain domains in the same manner as in Example 1. The results of measurements are shown in Table 17.

EXAMPLE 5

A variety of pn-junction photovoltaic elements of the structure shown in FIG. 1 were prepared from an n-type ZnS:Al film and a p-type ZnSe:H:Li film. The n-type ZnS:Al film was prepared according to the above-mentioned processes (1) to (3) for functional deposited films. The manufacturing conditions are shown in Table 12 (methods 4 to 6).

On the stainless steel substrate was deposited an Ag thin film as the lower electrode in the same manner as in Example 1. On the substrate was deposited the n-type ZnS:Al film according to the manufacturing conditions shown in Table 5 (methods 4 to 6). On the n-type ZnS:Al film was formed the p-type ZnSe:H:Li film in the same manner as in Examples 1 to 3. Thus there was obtained the pn-junction semiconductor layer composed of a p-type semiconductor layer and an n-type semiconductor layer as shown in Table 18. Subsequently, the transparent electrode 105 and the collecting electrode 106 were deposited in the same manner as in Example 1. Thus there were obtained Samples Nos. 5 to 13. The characteristic properties of Samples Nos. 5 to 13 as photovoltaic elements were evaluated. The results are shown in Table 18.

Apart from the foregoing, p-type ZnSe:H:Li films were formed on a silicon wafer (with ah SiO$_2$ film formed thereon) and also on a quartz substrate, in the same manner as mentioned above. The resultant deposited films were examined for the content of hydrogen atoms and the ratio of crystal grain domains in the same manner as in Example 1. The results of measurements are shown in Table 18.

EXAMPLE 6

A pn-junction photovoltaic eLement Of the structure shown in FIG. 1(A) was prepared from an n-type ZnO:Al film and a p-type ZnSe:H:Li film. The n-type ZnO:Al film was prepared in the same manner as in Examples 1 to 3 under the manufacturing conditions shown in Table 13.

On the stainless steel substrate was deposited an Ag electrode. On the Ag electrode was deposited the n-type ZnO:Al film according to the manufacturing conditions shown in Table 13. On the n-type ZnO:Al film 103 was formed the p-type ZnSe:H:Li film in the same manner as in Examples 1 to 3. On the p-type ZnSe:H:Li film were formed an ITO film and an Ag collecting electrode on top of the other. Thus there was obtained the pn-junction photovoltaic elements (Samples Nos. 14 to 22). The characteristic properties of Samples Nos. 14 to 22 were evaluated. The results are shown in Table 19.

Apart from the foregoing, p-type ZnSe:H:Li films were formed on a silicon wafer (with a SiO$_2$ film formed thereon) and also on a quartz substrate, in the same manner as mentioned above. The resulting deposited films were examined for the content of hydrogen atoms and the ratio of crystal grain domains in the same manner as in Example 1. The results of measurements are shown in Table 19.

EXAMPLE 7

A pn-junction photovoltaic element of the structure shown in FIG. 1(B) was prepared in a glass substrate instead of a stainless steel substrate. The characteristic properties of the photovoltaic element were evaluated in the same manner as in Example 1.

On the glass substrate 101 (product No. 7059 made by Dow Corning Co., Ltd.) was formed a transparent electrode of ITO film (500 Å thick) by sputtering. On the substrate was formed a p-type ZnSe:H:Li film in the same manner as in Example 1. Subsequently, the n-type semiconductor layer 103 was deposited according to the methods shown in Table 14.

On the n-type semiconductor layer was formed an Ag film (500 Å thick) as the lower electrode 102 by the electron beam deposition method. Thus there were obtained Samples Nos. 23 to 27. The characteristic properties of Samples Nos. 23 to 27 as photovoltaic elements were evaluated in the same manner as in Example 1. The results are shown in Table 20.

Apart from the foregoing, p-type ZnSe:H:Li films were formed on a silicon wafer (with an SiO$_2$ film formed thereon) and also on a quartz substrate, in the same manner as mentioned above. The resulting deposited films were examined for the content of hydrogen atoms and the ratio of crystal grain domains in the same manner as in Example 1. The results of measurements are shown in Table 20.

EXAMPLE 8

Two pn junction photovaltaic elements (Samples A and B) were prepared in the same manner as in Example 1, except that the n-type semiconductor layer comprising an n-type ZnSe:H:Al film was formed by repeating the procedures for forming the p-type semiconductor layer in Example 1 except for using Al(CH$_3$)$_3$ instead of the LiC$_3$H$_7$, and the p-type semiconductor layer comprising a p-type CdTe:Li film or a p-type ZnTe:Cu film was formed by using the apparatus shown in FIG. 4 wherein a polycrystal CdTe as the target and LiC$_3H$7 as the p-type doping raw material were used in the case of forming the p-type CdTe:Li film and a polycrystal ZnTe containing Cu ion-implanted was used as the target in the case of forming the p-type ZnTe:Cu film.

The characteristic properties of each of Samples A and B were evaluated in the same manner as in Example 1. They were comparable to Sample No. 1.

EXAMPLE 9

Sample C was prepared in the same manner as for Sample B in Example 8, except that the ZnTe target was replaced by a $ZnSe_{0.1}Te_{0.9}$ target. The characteristic properties of Sample C were evaluated in the same manner as in Example 1. It was almost comparable to Sample B.

EXAMPLES 10 AND 11 AND COMPARATIVE EXAMPLE 1

In order to see how the characteristic properties of the photovoltaic elements change depending on the manufacturing conditions for the ZnSe:H:Li film constituting the p-type semiconductor layer, a pn-junction photovoltaic element as shown in FIG. 1(A) and a p-type ZnSe:H:Li single layer film were prepared in the same manner as in Example 1, except that the flow rate of $H_2$ gas was changed as shown in Table 15 then the p-type ZnSe:H:Li film was prepared. They were evaluated in the same manner as in Example 1. The results are shown in Table 21 (Samples Nos. 28~30). Samples Nos. 28 and 29 correspond to Examples 10 and 11, respectively, and Sample No. 30 corresponds to Comparative Example 1.

Apart from the foregoing, p-type ZnSe:H:Li films were formed on a silicon wafer (with an $SiO_2$ film formed thereon) and also on a quartz substrate, in the same manner as in Samples Nos. 28 to 30. The resulting deposited films were examined for the content of hydrogen atoms and the ratio of crystal grain domains in the same manner as in Example 1. The results of measurements are shown in Table 21.

COMPARATIVE EXAMPLE 2

A pin-junction photovoltaic element (based on a-Si:H) as shown in FIG. 1(C) was produced as follows by using the apparatus as shown inn FIG. 3 according to the glow discharge method.

On a stainless steel substrate 101, measuring 50 mm by 50 mm, was deposited an Ag film (about 1000 Å thick), as the electrode 102, by sputtering. The substrate was fixed, with the electrode 102 facing downward, onto the substrate holder 302. The film-forming chamber 301 was evaluated to $10^{-5}$ Torr or below, and the substrate was kept at 250° C. by means of the heater 305. Into the film-forming chamber were introduced $SiH_4$ gas, $H_2$ gas, and $PH_3$ gas (diluted to 1% with $H_2$ gas) through the gas inlet 308 from gas cylinders (not shown) at respective flow rates of 30 sccm, 40 sccm, and 10 sccm. While the internal pressure of the film forming chamber 301 was kept at 0.5 Torr, discharging was performed by the application of a high-frequency power (50 W) for 3 minutes. Thus there was obtained the n-type a-Si:H film 107. The application of high-frequency power and the introduction of gasses were suspended, and the film-forming chamber 301 was evacuated to $10^{-5}$ Torr or below Into the film-forming chamber 301 were introduced $SiH_4$ gas and $H_2$ gas from gas cylinders at respective flow rates of 30 sccm and 40 sccm. Discharging was performed at 0.5 Torr, with 70 W, and for 60 minutes, in the same manner as mentioned above. Thus there was obtained the i-type a-Si:H film 108. The discharging and the introduction of gasses were suspended, and the film-forming chamber 301 was evacuated to $10^{-5}$ Torr or below. Into the film-forming chamber 301 were introduced $SiH_4$ gas, $H_2$ gas, and $B_2H_6$ gas (diluted to 1% with $H_2$ gas) from gas cylinders at respective flow rates of 30 sccm, 200 sccm, and 20 sccm. Discharging was performed at 0.6 Torr, with high-frequency 50 W, and for 2 minutes. Thus there was obtained the n-type a-Si:H film 109. The sample was removed. On the sample were formed he ITO electrode 105 and the Ag collecting electrode 106 in the same manner as in Example 1. Thus there was obtained a pin-junction a-Si photovoltaic element. The photovoltaic characteristics of this sample were evaluated. The results are shown in Table 21 (Sample No. 31).

RESULTS OF EVALUATION OF SAMPLES

Tables 16 to 21 show the results of evaluation of samples obtained in Examples 1 to 11 and Comparative Examples 1 and 2. The following items were measured to evaluate the characteristic properties required for photovoltaic elements. (1) Open-circuit voltage (Voc) which is generated when the element is irradiated with AM-1 light (100 mW/cm$^2$). (2) The relative value of the output which is generated when the element is irradiated with AM-1 light through a 400-nm interference filter. (The basis for comparison is the output which is produced when the a-Si pin-junction photovoltaic element prepared in Comparative Example 2 is irradiated through an interference filter.) (3) The change in photoelectric conversion efficiency that takes place after continuous irradiation with AM-1 light for 10 hours. (The change is expressed by $\Delta\eta/\eta_0$, where $\Delta\eta$ is the amount of change in photoelectric conversion efficiency and $t_0$ is the initial photoelectric conversion efficiency.)

Tables 16 to 21 also show the content of hydrogen atoms and the ratio of crystal grain domains in the p-type ZnSe:H:Li film, which were measured to see if the p-type ZnSe:H:Li film constituting the photovoltaic element meets the requirement for the content of hydrogen atoms and the ratio of crystal grain domains specified in the invention.

The results indicate the following. In Examples 1 to 4, the pn-junction photovoltaic element of the present invention is composed of a p-type ZnSe:H:Li film and an n-type ZnSe:Al film, formed on a stainless steel substrate. The p-type film contains a specific amount of hydrogen atoms and has a specific ratio of crystal grain domains per unit volume. Owing to the good pn-junction, the photovoltaic element generates a high open-circuit voltage, generates a higher output than the conventional a-Si pin-junction photovoltaic element were irradiated with AM-1 light through a 400-nm interference filter, and changes little in the photoelectric efficiency after continuous irradiation with AM-1 for 10 hours (in other words, becomes less deteriorated by light).

In Example 5, there was obtained a pn-junction photovoltaic element composed of a p-type ZnSe:H:Li film and an n-type ZnSe:Al film formed on a stainless steel substrate. It was comparable to those obtained in Examples 1 to 4.

In Example 6, there was obtained a photovoltaic element composed of a p-type ZnSe:H:Li film and an n-type ZnO:Al film formed on a stainless steel substrate. It was comparable to those obtained in Examples 1 to 5.

In Example 7, there was obtained a pn-junction photovoltaic element composed of a p-type ZnSe:H:Li film and an n-type ZnSe:Al film, n-type ZnS:Al, or n-type ZnO:Al film formed on a glass substrate. It was comparable to those obtained in Examples 1 to 6.

Samples prepared in Examples 8 to 11 were comparable to those prepared in Examples 1 to 7.

In Comparative Example 1, a element was prepared in the same manner as in Example 1, except that the amount of $H_2$ gas introduced was changed then the p-type ZnSe:H:Li film was made. The content of hydrogen atoms and the ratio of crystal grain domains in the p-type ZnSe:H:Li film were outside the specified range. The element was inferior in electrical properties to those prepared in Examples 1 to 11.

In Comparative Example 2, a conventional a-Si pin-junction photovoltaic element was prepared as a standard with which the photovoltaic element of the present invention is compared. It has a lower open-circuit voltage and is more liable to by to deterioration by light than the photovoltaic element of the present invention.

EXAMPLE 12

A pn-junction photovoltaic element as shown in FIG. 1(A) was produced by using the deposited film forming apparatus as shown in FIG. 2, according to the above-mentioned process (1) of the present invention.

At first, a stainless steel substrate 101, measuring 50 mm by 50 mm, was placed in a sputtering apparatus (not shown). The sputtering apparatus was evacuated to $10^{-5}$ Torr or below. On the substrate was deposited an Ag thin film (about 1000 Å thick) as the lower electrode 102 by sputtering Ag in argon. The substrate was removed from the sputtering apparatus and then fixed, with the lower electrode 102 facing downward, onto the substrate holder 202 on the substrate transfer unit 206 installed in the load lock chamber 212. The load lock chamber 212 was evacuated to $10^{-5}$ Torr or below by means of a vacuum pump (not shown). During evacuation, the film-forming chamber 201 was evacuated to $10^{-5}$ Torr or below by means of the vacuum pump 215. When the pressures in the two chambers became almost balanced, the two chambers were opened and the substrate transfer unit 206 was moved to the film forming chamber 201.

The substrate was heated to 200° C. by the infrared heater 205. Liquid DESe and liquid DETe placed in the Dewar's bottles 223 and 224, respectively, were gasified by bubbling with He gas supplied from the gas cylinder 217. The flow rate of He gas was controlled to 7.5 sccm by means of the mass flow controllers 219 and 220. The He gas saturated with DESe and DETe was introduced into the gas inlet pipe 209. The flow rate of DESe introduced was $3\times10^{-6}$ mol/min and the flow rate cf DETe introduced was $8\times10^{-6}$ mol/min. Then, DEZn placed in the Dewar's bottle 225 and TEAl placed in the Dewar's bottle 226 were introduced into the gas inlet pipe 208 at a flow rate of $1.0\times10^{-6}$ mol/min and $1\times10^{-9}$ mol/min, respectively, in the same manner as above. The flow rate of the He carrier gas was 5 sccm.

The amount of each raw material gas introduced was determined by controlling the temperature of the Dewar's bottles 223 to 226 by means of the constant temperature water baths 227 to 230. Incidentally, reference numerals 235 to 238 denote the constant temperature water baths and reference numerals 231 to 234 denote the heaters.

With the exhaust valve 214 properly opened, the internal pressure of the film-forming chamber 201 was kept at 0.5 Torr. Film-forming was started by applying microwave power (200 W) from the microwave (2.45 GHz) generator 211. After 6 minutes, there was obtained an n-type $ZnSe_{1-x}Te_x$:Al film 103. The application of microwave power and the introduction of gases were suspended, and the film-forming chamber 201 was evacuated to $10^{-5}$ Torr or below by the vacuum pump 215.

Then, a p-type $ZnSe_{1-x}Te_x$:H:Li film 104 was formed on the n-type $ZnSe_{1-x}Te_x$:Al film 103 in the same manner as above, except that $LiC_3H_7$ placed in an additional Dewar's bottle (not shown) was used instead of the TEAl and it was supplied at a flow rate of $1.0\times10^{-10}$ mol/min through the gas inlet pipe 208, and $H_2$ gas was introduced from the gas cylinder 216 at a flow rate of 15 sccm controlled the mass flow controller 218. The film-forming took 30 minutes.

The substrate transfer unit 206 was moved to the load lock chamber 212 through the gate valve 207. After cooling, the substrate on which were deposited the n-type and p-type semiconductor layers was removed. The substrate was placed in a vacuum deposited apparatus, which was evacuated to $10^{-5}$ Torr or below. On the substrate was deposited an ITO thin film (about 700 Å thick) in an oxygen atmosphere at about $1\times10^{-3}$ Torr. The source of deposition was a 1:1 (by weight) mixture of In and Sn placed in a crucible which was heated by the resistance heating method. The substrate temperature was 175° C. In this the transparent electrode 105 was formed. After cooling, the substrate removed. With a permalloy mask placed on the transparent electrode 105, the substrate was placed in a vacuum deposition apparatus, which was evacuated to $1\times10^{-5}$ Torr or below. An Ag film (about 1.0 μm thick) was deposited by the resistance heating method to form the comb-shaped collecting electrode 106. Thus there was obtained sample No. 32.

The characteristic properties of Sample No. 32 were evaluated in the following manner.

The open-circuit voltage (Voc) which is produced the transparent electrode 105 is irradiated with AM-1.5 light (100 mW/cm$^2$) was measured. The output which is produced when the transparent electrode 105 is irradiated with AM-1.5 light through a 450-nm interference filter was measured. The change $\Delta\eta$ in conversion efficiency that takes place after irradiation with AM-1.5 light for 10 hours was measured. The results of measurements are shown in Table 31.

Apart from the foregoing, $ZnSe_{1-x}Te_x$:H:Li films as a p-type semiconductor layer were formed alone on a silicon single crystal wafer (with an $SiO_2$ film formed thereon by the thermal oxidation process) and also on a quartz glass substrate, in the same manner as mentioned above. The resulting deposited films were examined for the content hydrogen atoms and the ratio of crystal grain domains. The results of measurements are shown in Table 31. The remaining half of the sample formed on the quartz substrate was examined for dark conductivity and thermoelectromotive force after the formation of a comb-shaped aluminum electrode. The dark conductivity was $4\times10^{-3}$ s/cm, and the p-type conductivity was confirmed.

EXAMPLE 13

A pn-junction photovoltaic element as shown in FIG. 1(A) was produced by using the film-forming apparatus as shown in FIG. 3, according to the above-mentioned process (2) of the present invention.

On the stainless steel substrate 101 was deposited an Ag thin film as the lower electrode 102 in the same manner as in Example 12. The substrate was fixed onto the substrate holder 302. While the internal pressure in the film-forming chamber 301 was kept at $10^{-5}$ Torr or below, the substrate 303 was heated to 300° C. by means of the infrared heater 305. The raw material gas A and raw material gas B were introduced into the film-forming chamber 301 through the gas inlet pipes 308 and 309, respectively, under the conditions shown in Table 22.

With the exhaust valve 314 properly opened, the internal pressure of the film-forming chamber 301 was kept at 1.0 Torr. Film-forming was started by applying high-frequency power (50 W) from the high-frequency (13.56 MHz) generator 310. (The high-frequency generator 310 is connected to the cathode 312 through the matching circuit 311.) After discharging for 6 minutes, there was obtained an n-type $ZnSe_{1-x}Te_x:Al$ film 103. The application of high-frequency power and the introduction of gases were suspended, and the film-forming chamber 301 was evacuated to $10^{-5}$ Torr or below. Then, raw material gases A and B as shown in Table 23 were introduced into the film-forming chamber 301.

With the internal pressure kept at 10 Torr, high-frequency power (50 W) was applied from the high-frequency source 310. After discharging for 30 minutes, there was obtained a p-type $ZnSe_{1-x}Te_x:H:Li$ film 104 formed on the n-type $ZnSe_{1-x}Te_x:Al$ film 103. The substrate with the deposited films was removed from the film-forming chamber. On the deposited films was formed an ITO film (about 700 Å thick as the transparent electrode 105 in the same manner as in Example 12. On the ITO film was formed an Ag thin film as the collecting electrode 106. Thus there was obtained Sample No. 33. The characteristic properties of Sample No. 33 as a solar cell were evaluated. The results are shown in Table 31.

Apart from the foregoing, p-type $ZnSe_{1-x}Te_x:H:Li$ films were formed on a silicon wafer (with an $SiO_2$ film formed thereon) and also on a quartz substrate, in the same manner as mentioned above. The resulting deposited films were examined for the content of hydrogen atoms and the ratio of crystal grain domains in the same manner as in Example 12. The results of measurements are shown in Table 31. The dark conductivity was $5 \times 10^{-5}$ s/cm, and the p-type conductivity was confirmed.

EXAMPLE 14

A pn-junction photovoltaic element as shown in FIG. (A) was produced by using the apparatus as shown in FIG. 4, according to the above-mentioned process (3) of the present invention.

On the stainless steel substrate 101 was deposited the lower electrode of Ag in the same manner as in Example 12. The substrate was fixed onto the substrate holder 402 and transferred into the film-forming chamber 401. The internal pressure in the film-forming chamber 401 was kept at $10^{-5}$ Torr or below. The $ZnSe_{0.2}Te_{0.8}$ polycrystal target 416 was placed on the cathode 412. The substrate 403 was heated to 200° C. by means of the infrared heater 405. The raw material gases shown in Table 24 were introduced into the film-forming chamber 401 through the gas inlet pipe 408.

With the exhaust valve 414 properly opened, the internal pressure of the film-form chamber 401 was kept at 0.05 Torr. Film-forming was started by applying high-frequency power (300 W). After discharging for 10 minutes, there was obtained an n-type $ZnSe_{1-x}Te_x:Al$ film 103. The discharging and the introduction of gases were suspended.

The film-forming chamber was evacuated to $10^{-5}$ Torr or below, and raw material gases shown in Table 25 were introduced into the film-forming chamber. After discharging with a 300 W power at 0.05 Torr for 30 minutes, there was obtained a p-type $ZnSe_{1-x}Te_x:H:Li$ film 104.

On the deposited films were formed an ITO film (about 700 Å thick) as the transparent electrode 105 and an Ag film as the collecting electrode 106. Thus there was obtained Sample No. 34. The characteristic properties of Sample No. 34 as a solar cell were evaluated. The results are shown in Table 31.

Apart from the foregoing, p-type ZnSe:H:Li films were formed on a silicon wafer (with an $SiO_2$ film formed thereon) and also on a quartz substrate, in the same manner as mentioned above. The resulting deposited films were examined for the content of hydrogen atoms and the ratio of crystal grain domains in the same manner as in Example 12. The results of measurements are shown in Table 31. The dark conductivity was $2 \times 10^{-3}$ s/cm, and the p-type conductivity was confirmed.

EXAMPLE 15

In the preparation of the photovoltaic element in Examples 12 to 14, the p-type $ZnSe_{1-x}Te_x:H:Li$ film and the n-type ZnSe:Al film were produced in the same manner using the same film-forming chamber. Needless to say, however, the p-type and n-type semiconductor layers may be produced in different manners.

This example illustrates a pn-junction photovoltaic element composed of p-type and n-type semiconductor layers which were produced in different manners.

At first, on the stainless steel substrate 101 was deposited an Ag thin film (3000 Å thick) as the lower electrode 102. The substrate was fixed onto the substrate holder 302 shown in FIG. 3. On the substrate was deposited the n-type $ZnSe_{1-x}Te_x:Al$ film 103 in the same manner as in Example 13. The film-forming chamber was evacuated to $10^{-5}$ Torr or below, and the substrate transfer unit 306 was moved into the second film-forming chamber 316 through the gate valve 307. Incidentally, the second film-forming chamber 316 is connected to the deposited film forming apparatus (shown in FIG. 2) through the gate valve 307. Subsequently, on the n-type $ZnSe_{1-x}Te_x:Al$ film was formed the p-type $ZnSe_{1-x}Te_x:H:Li$ film 104 in the same manner as in Example 12. On the p-type $ZnSe_{1-x}Te_x:H:Li$ film were formed the transparent electrode 105 of ITO film and the collecting electrode 106 of Ag in the same manner as in Example 12. Thus there was obtained Sample No. 35. The characteristic properties of Sample No. 35 were evaluated. The results are shown in Table 32.

Apart from the foregoing, p-type ZnSe:H:Li films were formed on a silicon water (with an $SiO_2$ film formed thereon) and also on a quartz substrate, in the same manner as mentioned above. The resulting deposited films were examined for the content of hydrogen atoms and the ratio of crystal grain domains in the same manner as in Example 12. The results of measurements are shown in Table 32.

EXAMPLE 16

A variety of pn-junction photovoltaic elements of the structure shown in FIG. 1 were prepared from an n-type ZnS:Al film and a p-type $ZnSe_{1-x}Te_x:H:Li$ film. The n-type ZnS:Al film was prepared according to the above-mentioned processes (10) to (12) for functional deposited films. The manufacturing conditions are shown in Table 26 (methods 13 to 15).

On the stainless steel substrate was deposited an Ag thin film as the lower electrode in the same manner as in Example 12. On the substrate was deposited the n-type ZnS:Al film according to the manufacturing conditions shown in Table 26 (methods 13 to 15). On the n-type ZnS:Al film was formed the p-type $ZnSe_{1-x}Te_x$:H:Li film in the same manner as in Examples 12 to 14. Thus there was obtained the pn-junction semiconductor layers composed of a p-type semiconductor layer and an n-type semiconductor layer as shown in Table 32. Subsequently, the transparent electrode 105 and the collecting electrode 106 were deposited in the same manner as in Example 12. Thus there were obtained Samples Nos. 36 to 44. The characteristic properties of Samples Nos. 36 to 44 as photovoltaic elements were evaluated. The results are shown in Table 33.

Apart from the foregoing, p-type $ZnSe_{1-x}Te_x$:H:Li films were formed on a silicon wafer (with an $SiO_2$ film formed thereon) and also on a quartz substrate, in the same manner as mentioned above. The resulting deposited films were examined for the content of hydrogen atoms and the ratio of crystal grain domains in the same manner as in Example 12. the results of measurements are shown in Table 33.

EXAMPLE 17

A pn-junction photovoltaic element of the structure shown in FIG. 1(A) was prepared from an n-type ZnO:Al film and a p-type $ZnSe_{1-x}Te_x$:H:Li film. The n-type ZnO:Al film was prepared in the same manner as in Examples 12 to 14 but using the manufacturing conditions shown in Table 27.

On the stainless steel substrate was deposited an Ag electrode. On the Ag electrode was deposited the n-type ZnO:Al film according to the manufacturing conditions shown in Table 27. On the n-type ZnO:H:Al film 103 was formed the p-type $ZnSe_{1-x}Te_x$:H:Li film in the same manner as in Examples 12 to 14. On the p-type ZnSe H:Li film were formed an ITO film and an Ag collecting electrode on top of the other. Thus there was obtained the pn-junction photovoltaic elements (Samples Nos. 45 to 53). The characteristic properties of Samples Nos. 45 to 53 were evaluated. The results are shown in Table 34.

Apart from the foregoing, p-type $ZnSe_{1-x}Te_x$:H:Li films were formed on a silicon wafer (with an $SiO_2$ film formed thereon) and also on a quartz substrate, in the same manner as mentioned above. The resultant deposited films were examined for the content of hydrogen atoms and the ratio of crystal grain domains in the same manner as in Example 12. The results of measurements are shown in Table 34.

EXAMPLE 18

A pn-junction photovoltaic element of the structure shown in FIG. 1(B) was prepared on a glass substrate of a stainless steel substrate. The characteristic properties of the photovoltaic element were evaluated in the same manner as in Example 12.

On the glass substrate 101 (product No. 7059 made by Dow Corning Co., Ltd.) was formed a transparent electrode of ITO film (500 Å thick) by sputtering. On the substrate was formed a p-type $ZnSe_{1-x}Te_x$:H:Li film in the same manner as in Example 12. Subsequently, the n-type semiconductor layer 103 was deposited according to the methods shown in Table 28.

On the n-type semiconductor layer was formed an Ag film (500 Å thick) as the lower electrode 102 by the electron beam deposition method. Thus there were obtained Samples Nos. 54 to 58. The characteristic properties of Samples Nos. 54 to 58 as photovoltaic elements were evacuated in the same manner as in Example 12. The results are shown in Table 35.

Apart from the foregoing, p-type $ZnSe_{1-x}T_x$:H:Li films were formed on a silicon wafer (with an $SiO_2$ film formed thereon) and also on a quartz substrate, in the same manner as mentioned above. The resulting deposited films were examined for the content of hydrogen atoms and the ratio of crystal grain domains in the same manner as in Example 12. The results of measurements are shown in Table 35.

EXAMPLE 19

Two pn junction photovoltaic elements (Samples A and B) were prepared in the same manner as in Example 12, except that the n-type semiconductor layer comprising an n-type $ZnSe_{1-x}Te_x$:H:Al film was formed by repeating the procedures for forming the p-type semiconductor layer in Example 12 except for using $Al(CH_3)_3$ in stead of the $LiC_3H_7$, and the p-type semiconductor layer comprising a p-type CdTe:Li film or a p-type ZnTe:Cu film was formed by using the apparatus shown in FIG. 4 wherein a polycrystal CdTe as the target and $LiC_3H_7$ as the p-type doping material were used in the case of forming the p-type CdTe:Li film and a polycrystal ZnTe containing Cu ion-implanted was used as the target in the case of forming the p-type ZnTe:Cu film.

The characteristic properties of each of Samples A and B were evaluated in the same manner as in Example 12. They were almost comparable to Sample No. 1.

EXAMPLE 20

Sample C was prepared in the same manner as for Sample B in Example 19, except that the ZnTe target was replaced by a $ZnSe_{0.2}Te_{0.8}$ target. The characteristic properties of Sample C were evaluated in the same manner as in Example 12. It was almost comparable to Sample B.

EXAMPLES 21 AND 22 AND COMPARATIVE EXAMPLE 3

In order to see how the characteristic properties of the photovoltaic element change depending on the manufacturing conditions for the $ZnSe_{1-x}Te_x$:H:Li film constituting the p-type semiconductor layer, pn-junction photovoltaic elements as shown in FIG. 1(A) and a p-type $ZnSe_{1-x}Te_x$:H:Li single layer film were prepared in the same manner as in Example 12, except that the flow rate of $H_2$ gas was changed as shown in Table 29 when the p-type $ZnSe_{1-x}Te_x$:H:Li film w]s prepared. They were evaluated in the same manner as in Example 12. The results are shown in Table 36 (Samples Nos. 59~61). Samples No. 61 corresponds to Examples 21 and 22.

Apart from the foregoing, a p-type $ZnSe_{1-x}Te_x$:H:Li films were formed on a silicon wafer (with an $SiO_2$ film formed thereon) and also on a quartz substrate, in the same manner as in Samples Nos. 59 to 61. The resulting deposited films were examined for the content of hydrogen atoms and the ratio of crystal grain domains in the same manner as in Example 12. The results of measurements are shown in Table 36.

COMPARATIVE EXAMPLE 4

A pin-junction type photovoltaic element (based on a-Si:H) as shown in FIG. 1(C) was produced as follows by using the apparatus as shown in FIG. 3 according to the glow discharge method.

On a stainless steel substrate 101, measuring 50 mm by 50 mm, was deposited an Ag film (about 1000 Å thick), as the electrode 102, by sputtering. The substrate was fixed, with the electrode 102 facing downward, onto the substrate holder 302. The film-forming chamber 301 was evacuated to $10^{-5}$ Torr or below, and the substrate was kept at 250° C. by means of the heater 305. Into the film-forming chamber were introduced $SiH_4$ gas, $H_2$ gas, and $PH_3$ gas (diluted to 1% with $H_2$ gas) through the gas inlet 308 from gas cylinders (not shown) at respective flow rates of 30 sccm, 40 sccm, and 10 sccm. While the internal pressure of the film-forming chamber 301 was kept at 0.5 Torr, discharging was performed by the application of a high-frequency power (50 W) for 3 minutes. Thus there was obtained the n-type a-Si:H film 107. The application of high-frequency power and the introduction of gasses were suspended, and the film-forming chamber 301 was evacuated to $10^{-5}$ Torr or below. Into the film-forming chamber 301 were introduced $SiH_4$ gas and $H_2$ gas from gas cylinders at respective flow rates of 30 sccm and 40 sccm. Discharging was performed at 0.5 Torr, with 70 W, and for 60 minutes, in the same manner as mentioned above. Thus there was obtained the i-type a-Si:H film 108. The discharging and the introduction of gasses were suspended, and the film-forming chamber 301 was evacuated to $10^{-5}$ Torr or below. Into the film-forming chamber 301 were introduced $SiH_4$ gas and $B_2H_6$ gas (diluted to 1% with $H_2$ gas) from gas cylinders at respective flow rates of 30 sccm, 200 sccm, 20 sccm. Discharging was performed at 0.6 Torr, with high-frequency 50 W, and for 2 minutes. Thus there was obtained the n-type a-Si:H film 109. The sample was removed. On the sample were formed the ITO electrode 105 and the collecting electrode 106 in the same manner as in Example 1. Thus there was obtained a pin-junction a-Si photovoltaic element. The photovoltaic characteristics of this sample were evaluated. The results are shown in Table No. 36 (62).

COMPARATIVE EXAMPLE 5

In order to see how the characteristic properties of the photovoltaic element change depending on the manufacturing conditions for the p-type $ZnSe_{1-x}T_x$:H:Li film as in Comparative Example 4, a pn-junction photovoltaic element in FIG. 1(A) and a p-type $ZnSe_{1-x}Te_x$:H:Li single layer were prepared in the same manner as in Example 12, that the flow rate of DESe and DETe was changed as shown in Table 30 when the p-type $ZnSe_{1-x}Te_x$:H:Li film was prepared. They were evaluated in the same manner as in Example 12. the results are shown in Table 37 (Samples Nos. 63 to 65).

RESULTS OF EVALUATION OF SAMPLES

Tables 31 to 37 show the results of evaluation of samples obtained in Examples 12 to 22 and Comparative Examples 3 to 5. the following items were measured to evaluate the characteristic properties required for photovoltaic elements. (1) Open-circuit voltage (Voc) which is generated when the element is irradiated with AM-1.5 light (100 mW/cm²). (2) the relative value of the output which is generated when the element is irradiated with AM-1.5 light the through a 450-nm interference filter. (The basis for comparison is the output which is produced when the a-Si pin-junction photovoltaic element prepared in Comparative Example 2 is irradiated through an interference filter.) (3) The change in photoelectric conversion efficiency that takes place after continuous irradiation with AM-1.5 light for 10 hours. (The change is expressed by $\Delta\eta/\eta_0$, where $\Delta\eta$ is the amount of change in photoelectric conversion efficiency and $\eta_0$ is the initial photoelectric conversion efficiency.)

Tables 31 to 37 also show the content of hydrogen atoms and the ratio of crystal grain domains p-type $ZnSe_{1-x}Te_x$:H:Li film, which were measured to see if the p-type $ZnSe_{1-x}Te_x$:H:Li film constituting the photovoltaic element meets the requirement for the content of hydrogen atoms and the ratio f crystal grain domains specified in the invention.

The results indicate the following. In Examples 12 to 15, the pn-junction photovoltaic element of the present invention is composed of a p-type $ZnSe_{1-x}Te_x$:H:Li film and an n-type $ZnSe_{1-x}Te_x$:Al film, formed on a stainless steel substrate. The film contains a specific amount of hydrogen atoms and has a specific ratio of crystal grain domains per unit volume. Owing to the good pn-junction the photovoltaic element generates a high open-circuit voltage, generates a higher output than the conventional a-Si pin-junction photovoltaic element when irradiated AM-1.5 light through a 450-nm interference filter, and changes little in the photoelectric conversion efficiency after continuous irradiation with AM-1.5 light for 10 hours (in other words, becomes little deteriorated by light).

In Example 16, there was obtained a pn-junction photovoltaic element composed of a p-type $ZnSe_{1-x}Te_x$:H:Li film and an n-type ZnSe:Al film formed on a stainless steel substrate. It was comparable to those obtained in Examples 12 to 15.

In Example 17, there was obtained a pn-junction photovoltaic element composed of a p-type $Zn_{1-x}Te_x$:H:Li film and an n-type ZnO:Al film formed on a stainless steel substrate. It was comparable to those obtained in Examples 12 to 16.

In Example 18, there was obtained a pn-junction photovoltaic element composed of a p-type $ZnSe_{1-x}Te_x$:H:Li film and an n-type ZnSe:Al film, n-type ZnS:Al, or n-type ZnO:Al film formed on a glass substrate. It was comparable to those obtained in Examples 12 to 17.

Samples prepared in Examples 19 to 22 were comparable to hose prepared in Examples 12 to 18.

In Comparative Example 3, a photovoltaic element was prepared in the same manner as in Example 12, except that the amount of $H_2$ gas introduced was changed when the p-type $ZnS_{1-x}Te_x$:H:Li film was made. The content of hydrogen atoms and the ratio of crystal grain domains in the p-type $ZnSe_{1-x}Te_x$:H:Li film were outside the specified range. The element was inferior in electrical properties to those prepared in Examples 12 to 22.

In Comparative Example 4, a conventional a-Si pin-junction photovoltaic element was prepared as a standard with which the photovoltaic element of the present invention is compared. It has a lower open-circuit voltage and is more liable to deterioration by light than the photovoltaic element of the present invention.

In Comparative Example 5, a photovoltaic element was prepared in the same manner as in Example 12, except that the flow rate of DESe and DETe was changed when the p-type $ZnSe_{1-x}Te_x$:H:Li film was prepared, so that p-type $ZnSe_{1-x}Te_x$:H:Li films were obtained which are different in Se/Te ratio. The content of hydrogen atoms and the ratio of crystal grain domains in the p-type $ZnSe_{1-x}Te_x$:H:Li film were outside the specified range. Thus the element was inferior in electrical properties to those prepared in Examples 12 to 22.

EXAMPLE 23

A pn-junction photovoltaic element as shown in FIG. 1(A) was produced by using the deposited film forming apparatus as shown in FIG. 2, according to the above-mentioned process (1) of the present invention.

At first a stainless steel substrate 101, measuring 50 mm by 50 mm, was placed in a sputtering apparatus (not shown). The sputtering apparatus was evacuated to $10^{-5}$ Torr or below. On the substrate was deposited an Ag thin film (about 1000 Å thick) as the lower electrode 102 by sputtering Ag in argon. The substrate was removed from the sputtering apparatus and then fixed, with the lower electrode 102 facing downward, onto the substrate holder 202 on the substrate transfer unit 206 installed in the load lock chamber 212. The load lock chamber 212 was evacuated to $10^{-5}$ Torr or below by means of a vacuum pump (not shown). During evacuation, the film-forming chamber 201 was evacuated to $10^{-5}$ Torr or below by means of the vacuum pump 215. When the pressures in the two chambers became almost balanced, the two chambers were opened and the substrate transfer unit 206 was moved to the film forming chamber 201.

The substrate was heated to 200° C. by the infrared heater 205. Liquid DESe and liquid DETe placed in the Dewar's bottles 223 and 24, respectively, were gasified by bubbling with He was supplied from the gas cylinder 217. The flow rate of He gas was controlled to 7.5 sccm by means of the mass flow controllers 219 and 220. The He gas saturated with DESe and DETe was introduced into the gas inlet pipe 209. The flow rate of DESe introduced was $3 \times 10^{-6}$ mol/min and the flow rate of DETe introduced was $8 \times 10^{-6}$ mol/min. Simultaneously, $H_2$ gas was introduced from the gas cylinder 216 into the gas inlet pipe 209 at a flow rate of 15 sccm controlled by the mass flow controlled 218. Then, DEZn placed in the Dewar's bottle 225 and TEAl placed in the Dewar's bottle 226 were introduced into the gas inlet pipe 208 at a flow rate of $1.0 \times 10^{-6}$ mol/min and $1 \times 10^{-9}$ mol/min, respectively, in the same manner as above. The flow rate of the carrier He gas was 5 sccm.

The amount of each raw material gas introduced was set up by controlling the temperature of the Dewar's bottles 223 to 226 by means of the constant temperature water baths 227 to 230. Incidentally, reference numerals 235 to 238 denote the constant temperature water baths and reference numerals 231 to 234 denote the heaters.

With the exhaust valve 214 properly opened, the internal pressure of the film-forming chamber 201 was kept at 0.5 Torr. Film-forming was started by applying microwave power (200 W) from the microwave (2.45 GHz) generator 211. After 6 minutes, there was obtained an n-type $ZnSe_{1-x}Te_x$:H:Al film 103. The application of microwave power and the introduction of gases were suspended, and the film-forming chamber 201 was evacuated to $10^{-5}$ Torr or below by the vacuum pump 215.

Then, a p-type ZnSe:H:Li film 104 was formed on the n-type $ZnSe_{1-x}Te_xAl$ film 103 in the same manner as above, except that $LiC_3H_7$ (as a raw material gas in place of TEAl) placed in the Dewar's bottle 226 was supplied at a flow rate of $1.0 \times 10^{-10}$ mol/min through the gas inlet pipe 208, DESe was introduced at a flow rate of $1.5 \times 10^{-5}$ mol/min, and DETe was not introduced.

The substrate transfer unit 206 was moved to the load lock chamber 212 through the gate valve 207. After cooling, the substrate on which were deposited the n-type and p-type semiconductor layers was removed. The substrate was placed in a vacuum deposition apparatus, which was evacuated to $10^{-5}$ Torr or below. On the substrate was deposited an ITO thin film (about 700 Å thick) in an oxygen atmosphere at about $1 \times 10^{-3}$ Torr. The source of deposition was a 1:1 (by weight) mixture of In and Sn placed in a crucible which was heated by the resistance heating method. The substrate temperature was 175° C. In this way the transparent electrode 105 was formed. After cooling, the substrate was removed. With a permalloy mask placed on the transparent electrode 105, the substrate was placed in a vacuum deposition apparatus, which was evacuated to $1 \times 10^{-5}$ Torr or below. An Ag film (about 1.0 μm thick) was deposited by the resistance heating method to form the comb-shaped collecting electrode 106. Thus there was obtained sample No. 66.

The characteristic properties of Sample No. 66 were evaluated in the following manner.

The open-circuit voltage (Voc) which is produced when the transparent electrode 105 is irradiated with AM-1.5 light (100 mW/cm²) was measured. The output which is produced when the transparent electrode 105 is irradiated with AM-1.5 light through a 450-nm interference filter was measured. The change $\Delta\eta$ in conversion efficiency that takes place after irradiation with AM-1.5 light for 10 hours was measured. The results of measurements are shown in Table 52.

Apart from the foregoing, a $ZnSe_{1-x}Te_x$:H:Al film as a n-type semiconductor layer and a ZnSe:H:Li film as a p-type semiconductor layer were formed individually on a silicon single crystal wafer (with an $SiO_2$ film formed thereon by the thermal oxidation process) and also on a quartz glass substrate, in the same manner as mentioned above. The resulting deposited films were examined for the content of hydrogen atoms and the ratio of crystal grain domains. The results of measurements are shown in Table 52.

EXAMPLE 24

A pn-junction photovoltaic element as shown in FIG. 1(A) was produced by using the film-forming apparatus as shown in FIG. 3, according to the above-mentioned process (2) of the present invention.

On the stainless steel substrate 101 was deposited an Ag thin film as the lower electrode 102 in the same manner as in Example 23. The substrate was fixed onto the substrate holder 302. While the internal pressure in the film-forming chamber 301 was kept at $10^{-5}$ Torr or below, the substrate 303 was heated to 300° C. by means of the infrared heater 305. The raw material gas A and raw material gas B were introduced into the film-forming chamber 301 through the gas inlet pipes 308 and 309, respectively, under the conditions shown in Table 38.

With the exhaust valve 314 properly opened, the internal pressure of the film-forming chamber 301 was kept at 1.0 Torr. Film-forming was started by applying high-frequency power (50 W) from the high-frequency (13.56 MHz) generator 310. (The high-frequency generator 310 is connected to the cathode 312 through the matching circuit 311.) After discharging for 6 minutes, there was obtained an n-type $ZnSe_{1-x}Te_x$:H:Al film 103. The application of high-frequency power and the introduction of gases were suspended, and the film-forming chamber 301 was evacuated to $10^{-5}$ Torr or below. Then, raw material gases A and B as shown in Table 39 were introduced into the film-forming chamber 301.

With the internal pressure kept at 1.0 Torr, high-frequency power (50 W) was applied from the high-frequency source 310. After discharging for 30 minutes, there was obtained a p-type ZnSe:H:Li film 104 formed on the n-type $ZnSe_{1-x}Te_x$:H:Al film 103. The substrate with the deposited films was removed from the film-forming chamber. On the deposited films was formed an ITO film (about 700 Å thick) as the transparent electrode 105 in the same manner as in Example 1. On the ITO film was formed an Ag thin film as the collecting electrode 106. Thus there was obtained Sample No. 67. The characteristic properties of Sample No. 67 as a solar cell were evaluated. The results are shown in Table 45.

Apart from the foregoing, an n-type $ZnSe_{1-x}Te_x$:H:Al film and a p-type ZnSe:H:Li film were formed individually on a silicon wafer (with an $SiO_2$ film formed thereon) and also on a quartz substrate, in the same manner as mentioned above. The resulting deposited films were examined for the content of hydrogen atoms and the ratio of crystal grain domains in the same manner as in Example 23. The results of measurements are shown in Table 45.

EXAMPLE 25

A pn-junction photovoltaic element as shown in FIG. (A) was produced by using the apparatus as shown in FIG. 4, according to the above-mentioned process (3) of the present invention.

On the stainless steel substrate 101 was deposited the lower electrode of Ag in the same manner as in Example 23. The substrate was fixed onto the substrate holder 402 and transferred into the film-forming chamber 401. The internal pressure in the film-forming chamber 401 was kept at $10^{-5}$ Torr or below. The $ZnSe_{0.2}Te_{0.8}$ polycrystal target 416 was placed on the cathode 412. The substrate 403 was heated to 200° C. by means of the infrared heater 405. The raw material gases shown in Table 40 were introduced into the film-forming chamber 401 through the gas inlet pipe 408.

With the discharge valve 414 properly opened, the internal pressure of the film-forming chamber 401 was kept at 0.05 Torr. Film-forming was started by applying high-frequency power (300 W). After discharging for 10 minutes, there was obtained an n-type $ZnSe_{1-x}Te_x$:H:Al film 103. The discharging and the introduction of gases were suspended.

The film-forming chamber was evacuated to $10^{-5}$ Torr or below, and raw material gases shown in Table 41 were introduced into the film-forming chamber. After discharging with a 300 W power at 0.05 Torr for 30 minutes, there was obtained a p-type ZnSe:H:Li film 104.

On the deposited films were formed an ITO film (about 700 Å thick) as the transparent electrode 105 and an Ag film as the collecting electrode 106. Thus there was obtained Sample No. 68. The characteristic properties of Sample No. 68 as a solar cell were evaluated. The results are shown in Table 45.

Apart from the foregoing, an n-type $ZnSe_{1-x}Te_x$:H:Al film and a p-type ZnSe:H:Li film were formed individually on a silicon wafer (with an $SiO_2$ film formed thereon) and also on a quartz substrate, in the same manner as mentioned above. The resultant deposited films were examined for the content of hydrogen atoms and the ratio of crystal grain domains in the same manner as in Example 23. The results of measurements are shown in Table 45.

EXAMPLE 26

In the preparation of the photovoltaic element in Examples 23 to 25, the n-type $ZnSe_{1-x}Te_x$:H:Al film and the p-type ZnSe:H:Li film were produced in the same manner using the same film-forming chamber. Needless to say, however, the p type and n-type semiconductor layers may be produced in different manners.

This example illustrates a pn-junction photovoltaic element composed of p-type and n-type semiconductor layers which were produced in different manners.

At first, on the stainless steel substrate 101 was deposited an Ag thin film (3000 Å thick) as the lower electrode 102. The substrate was fixed onto the substrate holder 302 shown in FIG. 3. On the substrate was deposited the n-type $ZnSe_{1-x}Te_x$:H:Al film 103 in the same manner as in Example 24. The film-forming chamber was evacuated to $10^{-5}$ Torr or below, and the substrate transfer unit 306 was moved into the second film-forming chamber 316 through the gate valve 307. Incidentally, the second film-forming chamber 316 is connected to the deposited film forming apparatus (shown in FIG. 2) through the gate valve 307. Subsequently, on the n-type $ZnSe_{1-x}Te_x$:Al film was formed the p-type ZnSe:H:Li film 104 in the same manner as in Example 23. On the p-type ZnSe:H:Li film were formed the transparent electrode 105 of ITO film and the collecting electrode 106 of Ag in the same manner as in Example 23. Thus there was obtained Sample No. 69. The characteristic properties of Sample No. 69 were evaluated. The results are shown in Table 46.

Apart from the foregoing, an n-type $ZnSe_{1-x}Te_x$:H:Al film and a p-type ZnSe:H:Li film were formed on a silicon wafer (with an $SiO_2$ film formed thereon) and also on a quartz substrate, in the same manner as mentioned above. The resultant deposited films were examined for the content of hydrogen atoms and the ratio of crystal grain domains in the same manner as in Example 23. The results of measurements are shown in Table 46.

EXAMPLE 27

A pn-junction photovoltaic element of the structure shown in FIG. 1(B) was prepared on a glass substrate instead of a stainless steel substrate. The characteristic properties of the photovoltaic element were evaluated in the same manner as in Example 23.

On the glass substrate 101 (product No. 7059 made by Dow Corning Co., Ltd.) was formed a transparent electrode of ITO film (500 Å thick) by sputtering. On the substrate was formed a p-type ZnSe:H:Li film and an n-type ZnSe$_{1-x}$Te$_x$:H:Al film on top of the other in the same manner as in Example 23.

On the n-type ZnSe$_{1-x}$Te$_x$ layer was formed an Ag film (500 Å thick) as the lower electrode 102 by the electron beam deposition method. Thus there was obtained Sample No. 70. The characteristic properties of this sample as a photovoltaic element were evaluated in the same manner as in Example 1. The results are shown in Table 46.

Apart from the foregoing, a p-type ZnSe:H:Li film and an n-type ZnSe$_{1-x}$Te$_x$:H:Al film were formed on a silicon wafer (with an SiO$_2$ film formed thereon) and also on a quartz substrate, in the same manner as mentioned above. The resulting deposited films were examined for the content of hydrogen atoms and the ratio of crystal grain domains in the same manner as in Example 23. The results of measurements are shown in Table 46.

EXAMPLE 28

A p-type ZnSe$_{1-x}$Te$_x$:H:Li film was formed on a stainless steel substrate (with an Ag film formed thereon) in the same manner as in Example 23, except that LiC$_3$H$_7$ (as a raw material gas in place of TEAl) was introduced at a flow rate of $1.0 \times 10^{-10}$ mol/min for 15 minutes. Subsequently, an n-type ZnSe:H:Al layer was formed by introducing TEAl (in place of LiC$_3$H$_7$) at a flow rate of $1.0 \times 10^{-9}$ mol/min.

Subsequently, electrodes were formed in the same manner as in Example 23. Thus there was obtained Sample No. 71. The characteristic properties of Sample No. 71 were evaluated. The results are shown in Table 46.

Apart from the foregoing, a p-type ZnSe$_{1-x}$Te$_x$:H:Li film and an n-type ZnSe:H:Al film were formed individually on a silicon wafer (with an SiO$_2$ film formed thereon) and also on a quartz substrate, in the same manner as mentioned above. The resultant deposited films were examined for the content of hydrogen atoms and the ratio of crystal grain domains in the same manner as in Example 23. The results of measurements are shown in Table 46.

COMPARATIVE EXAMPLE 6

In order to see how the characteristic properties of the photovoltaic element change depending on the manufacturing conditions for the ZnSe:H:Li film constituting the p-type semiconductor layer, a pn-junction photovoltaic element as shown in FIG. 1(A) and a p-type ZnSe:H:Li single layer film were prepared in the same manner as in Example 1, except that the flow rate of H$_2$ gas was changed as shown in Table 12 when the p-type ZnSe:H:Li film was prepared. They were evaluated in the same manner as in Example 1. The results are shown in Table 47 (Samples Nos. 72 to 74).

Apart from the foregoing, a p-type ZnSe:H:Li film was formed on a silicon wafer (with an SiO$_2$ film formed thereon) and also on a quartz substrate, in the same manner as in Samples Nos. 72 to 74. The resulting deposited films were examined for the content of hydrogen atoms and the ratio of crystal grain domains in the same manner as in Example 23. The results of measurements are shown in Table 47.

COMPARATIVE EXAMPLE 7

A pin-junction photovoltaic element (based on a-Si:H) as shown in FIG. 1(C) was produced as follows by using the apparatus as shown in FIG. 3 according to the glow discharge method.

On a stainless steel substrate 101, measuring 50 mm by 50 mm, was deposited an Ag film (about 1000 Å thick), as the electrode 102, by sputtering. The substrate was fixed, with the electrode 102 facing downward, onto the substrate holder 302. The film-forming chamber 301 was evacuated to $10^{-5}$ Torr or below, and the substrate was kept at 250° C. by means of the heater 305. Into the film-forming chamber were introduced SiH$_4$ gas, H$_2$ gas, and PH$_3$ gas (diluted to 1% with H$_2$ gas) through the gas inlet 308 from gas cylinders (not shown) at respective flow rates of 30 sccm, 40 sccm, and 10 sccm. While the internal pressure of the film-forming chamber 301 was kept at 0.5 Torr, discharging was performed by the application of a high-frequency power (50 W) for 3 minutes. Thus there was obtained the n-type a-Si:H film 107. The application of high-frequency power and the introduction of gasses were suspended, and the film-forming chamber 301 was evacuated to $10^{-5}$ Torr or below. Into the film-forming chamber 301 were introduced SiH$_4$ gas and H$_2$ gas from gas cylinders at respective flow rates of 30 sccm and 40 sccm. Discharging was performed at 0.5 Torr, with 70 W, and for 60 minutes, in the same manner as mentioned above. Thus there was obtained the i-type a-Si:H film 108. The discharging and the introduction of gasses were suspended, and the film-forming chamber 301 was evacuated to $10^{-5}$ Torr or below. Into the film-forming chamber 301 were introduced SiH$_4$ gas, H$_2$ gas, and B$_2$H$_6$ gas (diluted to 1% with H$_2$ gas) from gas cylinders at respective flow rates of 30 sccm, 200 sccm, and 20 sccm. Discharging was performed at 0.6 Torr, with high-frequency 50 W, and for 2 minutes. Thus there was obtained the n-type a-Si:H film 109. The sample was removed. On the sample were formed the ITO electrode 105 and the Ag collecting electrode 106 in the same manner as in Example 1. Thus there was obtained a pin-junction a-Si photovoltaic element. The photovoltaic characteristics of this sample were evaluated. The results are shown in Table 47 (Sample No. 75).

COMPARATIVE EXAMPLE 8

In order to see how the characteristic properties of the photovoltaic element change depending on the manufacturing conditions for the p-type ZnSe$_{1-x}$Te$_x$:H:Li film in the sample (Example 23) composed of a stainless steel substrate, p-type ZnSe$_{1-x}$Te$_x$ layer, n-type ZnSe layer, and ITO layer, a pn-junction photovoltaic element as shown in FIG. 1(A) and a p-type ZnSe$_{1-x}$Te$_x$:H:Li single layer film were prepared in the same manner as in Example 24, except that the flow rate of H$_2$ gas was changed as shown in Table 42 when the p-type ZnSe:H:Li film was prepared. They were evaluated in the same manner as in Example 23. The results are shown in Table 48 (Samples Nos. 76 to 78).

Apart from the foregoing, a p-type ZnSe$_{1-x}$Te$_x$:H:Li layer was formed on a silicon wafer (with an SiO$_2$ film formed thereon) and also on a quartz substrate, in the same manner as in Samples Nos. 76 to 78. The resulting deposited films were examined for the content of hydrogen atoms and the ratio of crystal grain domains in the same manner as in Example 23. The results of measurements are shown in Table 48.

COMPARATIVE EXAMPLE 9

In order to see how the characteristic properties of the photovoltaic element change depending on the manufacturing conditions for the p-type ZnSe$_{1-x}$Te$_x$:H:Li film, a pn-junction photovoltaic element as shown in FIG. 1(A) and a p-type $ZnSe_{1-x}Te_x$:H:Li single layer film were prepared in the same manner as in Example 24, except that the amount of DESe and DETe introduced was changed as shown in Table 38. The thus obtained samples (Nos. 79 to 81) were evaluated in the same manner as in Example 23. The results, together with the Se/Te ratios, are shown in Table 48.

RESULTS OF EVALUATION OF SAMPLES

Tables 45 to 48 show the results of evaluation of samples obtained in Examples 23 to 28 and Comparative Examples 6 to 9. The following items were measured to evaluate the characteristic properties required for photovoltaic elements (1) Open-circuit voltage (Voc) which is generated when the element is irradiated with AM-1.5 light (100 mW/cm$^2$). (2) The relative value of the output which is generated when the element is irradiated with AM-1.5 light through a 450-nm interference filter. (The basis for comparison is the output which is produced when the a-Si pin-type photovoltaic element prepared in Comparative Example 2 is irradiated through an interference filter.) (3) The change in photoelectric conversion efficiency that takes place after continuous irradiation with AM-1.5 light for 10 hours. (The change is expressed by $\Delta\eta/\eta_0$, where $\Delta\eta$ is the amount of change in photoelectric conversion efficiency and $\eta_0$ is the initial photoelectric conversion efficiency.)

Tables 45 to 48 also show the content of hydrogen atoms and the ratio of crystal grain domains in the p-type ZnSe:H:Li film, n-type $ZnSe_{1-x}Te_x$:H:Al film, or n-type ZnSe:H:Al film, and p-type $ZnSe_{1-x}Te_x$H:Li film, which were measured to see if these films constituting the photovoltaic element meet the requirement for the content of hydrogen atoms and the ratio of crystal grain domains specified in the invention.

The results indicate the following. In Examples 23 to 26, the pn-junction photovoltaic element of the present invention is composed of a p-type ZnSe:H:Li film and an n-type $ZnSe_{1-x}Te_x$Al film, formed on a stainless steel substrate. The film contains a specific amount of hydrogen atoms and has a specific ratio of crystal grain domains per unit volume. Owing to the good pn-junction, the photovoltaic element generates a high open-circuit voltage, generates a higher output than the conventional a-Si pin-type photovoltaic element when irradiated with AM-1.5 light through a 450-nm interference filter, and changes little in the photoelectric conversion efficiency after continuous irradiation with AM-1 light for 10 hours (in other words becomes less deteriorated by light).

In Example 27, there was obtained a pn-junction photovoltaic element composed of a p-type $ZnSe_{1-x}Te_x$:H:Li film and an n-type $ZnSe_{1-x}Te_x$:H:Al film formed on a stainless steel substrate. It was comparable to those obtained in Examples 23 to 26.

In Example 28, there was obtained a pn-junction photovoltaic element composed of an n-type ZnSe:H:Al film and a p-type $ZnSe_{1-x}Te_x$:Li film formed on a stainless steel substrate. It was comparable to those obtained in Examples 23 to 27.

In Comparative Example 6, a photovoltaic element was prepared in the same manner as in Example 23, except that the amount of H$_2$ gas introduced was changed when the p-type $ZnSe_{1-x}Te_x$:H:Li film was made. The content of hydrogen atoms and the ratio of crystal grain domains in the p-type $ZnSe_{1-x}Te_x$:H:Li film were outside the specified range. The element was inferior in electrical properties to those prepared in Examples 23 to 28.

In Comparative Example 7, a conventional a-Si pin-type photovoltaic element was prepared as a standard with which the photovoltaic element of the present invention is compared. It has a lower open-circuit voltage and is more liable to deterioration by light than the photovoltaic element of the present invention.

In Comparative Example 8, a photovoltaic element was prepared in the same manner as in Example 28, except that the amount of H$_2$ gas introduced was changed when the p-type $ZnSe_{1-x}Te_x$:H:Li film was made. The content of hydrogen atoms and the ratio of crystal grain domains in the p-type $ZnSe_{1-x}Te_x$H:Li film were outside the specified range. The element was inferior in electrical properties to those prepared in Examples 23 to 28.

In Comparative Example 9, a photovoltaic element was prepared in the same manner as in Example 28, except that the flow rate or DESe and DETe was changed when the p-type $ZnSe_{1-x}Te_x$:H:Li film was prepared, so that the p-type $ZnSe_{1-x}Te_x$:H:Li films were obtained which are different in Se/Te ratio. The content of hydrogen atoms and the ratio of crystal grain domains in the p-type $ZnSe_{1-x}Te_x$:H:Li film were outside the specified range. Thus the element was inferior in electrical properties to those prepared in Examples 23 to 28.

TABLE 1

| | |
|---|---|
| substrate temperature | 200° C. |
| raw material gas (A) | DEZn  $10 \times 10^{-6}$ mol/min |
| | He  10 sccm |
| raw material gas (B) | DESe  $1.5 \times 10^{-5}$ mol/min |
| | He  15 sccm |
| | H$_2$*  1.5 sccm ~ 1 slm |
| inner pressure | 0.5 Torr |
| power of activation energy | 200 W (microwave 2.45 GHz) |
| distance between activation chamber and liberation opening for gas from gas feed pipe | 5 cm |

*flow rate of the H$_2$ gas

| Sample | |
|---|---|
| No. 1 | 0.1 sccm |
| No. 2 | 0.3 sccm |
| No. 3 | 1 sccm |
| No. 4 | 3 sccm |
| No. 5 | 5 sccm |
| No. 6 | 10 sccm |
| No. 7 | 15 sccm |
| No. 8 | 20 sccm |
| No. 9 | 30 sccm |
| No. 10 | 100 sccm |
| No. 11 | 300 sccm |
| No. 12 | 1 slm |

Note:
DEZn: Zn(C$_2$H$_5$)$_2$
DESe: Se(C$_2$H$_5$)$_2$

TABLE 2

| Sample No. | composition (atomic %) | |
|---|---|---|
| | Zn | Se |
| 1 | 47 | 52 |
| 2 | 51 | 48 |
| 3 | 48 | 50 |
| 4 | 45 | 53 |
| 5 | 51 | 46 |
| 6 | 51 | 46 |
| 7 | 49 | 48 |
| 8 | 50 | 47 |
| 9 | 48 | 48 |

TABLE 2-continued

| Sample No. | composition (atomic %) Zn | Se |
|---|---|---|
| 10 | 46 | 50 |
| 11 | 51 | 47 |
| 12 | 49 | 48 |

TABLE 3

| | |
|---|---|
| substrate temperature | 200° C. |
| raw material gas (A) | DEZn 10 × 10$^{-6}$ mol/min |
| | He 10 sccm |
| raw material gas (B) | DESe 3.0 × 10$^{-6}$ mol/min |
| | DETe 8.0 × 10$^{-6}$ mol/min |
| | He 15 sccm |
| | H$_2$* 1.5 sccm~1 slm |
| inner pressure | 0.5 Torr |
| power of activation energy | 200 W (microwave 2.45 GHz) |
| distance between activation chamber and liberation opening for gas from gas feed pipe | 5 cm |

*flow rate of the H$_2$ gas

| Sample | |
|---|---|
| No. 1 | 0.1 sccm |
| No. 2 | 0.3 sccm |
| No. 3 | 1 sccm |
| No. 4 | 3 sccm |
| No. 5 | 5 sccm |
| No. 6 | 10 sccm |
| No. 7 | 15 sccm |
| No. 8 | 20 sccm |
| No. 9 | 30 sccm |
| No. 10 | 100 sccm |
| No. 11 | 300 sccm |
| No. 12 | 1 slm |

Note:
DEZn: (C$_2$H$_4$)$_2$Zn
DESe: (C$_2$H$_4$)$_2$Se
DETe: (C$_2$H$_4$)$_2$Te

TABLE 4

| Sample No. | composition (atomic %) | | |
|---|---|---|---|
| | Zn | Se | Te |
| 1 | 48 | 10 | 42 |
| 2 | 52 | 9 | 39 |
| 3 | 50 | 11 | 39 |
| 4 | 47 | 11 | 42 |
| 5 | 54 | 10 | 36 |
| 6 | 53 | 9 | 37 |
| 7 | 52 | 9 | 39 |
| 8 | 53 | 10 | 37 |
| 9 | 52 | 10 | 38 |
| 10 | 49 | 11 | 40 |
| 11 | 53 | 9 | 38 |
| 12 | 51 | 10 | 39 |

TABLE 5

| | |
|---|---|
| substrate temperature | 200° C. |
| raw material gas (A) | DEZn 1.0 × 10$^{-6}$ mol/min |
| | He 10 sccm |
| | LiC$_3$H$_7$ 1.0 × 10$^{-10}$ mol/min |
| raw material gas (B) | DESe** 0~1.5 × 10$^{-5}$ mol/min |
| | DETe** 0~1.0 × 10$^{-5}$ mol/min |
| | He 15 sccm |
| | H$_2$* 1.5 sccm~1 slm |
| inner pressure | 0.5 Torr |
| power of activation energy | 200 W (microwave 2.45 GHz) |
| distance between activation chamber and liberation opening for gas from gas feed pipe | 5 cm |

*flow rate of the H$_2$ gas

| Sample | |
|---|---|
| No. 1-N | 0.1 sccm |
| No. 2-N | 0.3 sccm |
| No. 3-N | 1 sccm |
| No. 4-N | 3 sccm |
| No. 5-N | 5 sccm |
| No. 6-N | 10 sccm |
| No. 7-N | 15 sccm |
| No. 8-N | 20 sccm |
| No. 9-N | 30 sccm |
| No. 10-N | 100 sccm |
| No. 11-N | 300 sccm |
| No. 12-N | 1 slm |

**adjustments of the amounts of DESe and DETe to be introduced were made by changing respective set temperatures of the corresponding bubblers

| sample No. | DESe (mol/min) | DETe (mol/min) |
|---|---|---|
| L-1 | 1.5 × 10$^{-5}$ | 0 |
| L-2 | 1.35 × 10$^{-5}$ | 1 × 10$^{-6}$ |
| L-3 | 1.2 × 10$^{-5}$ | 1 × 10$^{-6}$ |
| L-4 | 1.05 × 10$^{-5}$ | 1 × 10$^{-6}$ |
| L-5 | 9.0 × 10$^{-6}$ | 1 × 10$^{-6}$ |
| L-6 | 7.5 × 10$^{-6}$ | 1 × 10$^{-6}$ |
| L-7 | 6.0 × 10$^{-6}$ | 1 × 10$^{-6}$ |
| L-8 | 4.5 × 10$^{-6}$ | 1 × 10$^{-6}$ |
| L-9 | 3.0 × 10$^{-6}$ | 1 × 10$^{-6}$ |
| L-10 | 1.5 × 10$^{-6}$ | 1 × 10$^{-6}$ |
| L-11 | 0 | 1 × 10$^{-5}$ |

TABLE 6

| | |
|---|---|
| substrate temperature | 200° C. |
| raw material gas (A) | DEZn 1.0 × 10$^{-6}$ mol/min |
| | He 10 sccm |
| | doping raw material |
| | TMGa 5 × 10$^{-11}$ mol/min |
| | or |
| | LiC$_3$H$_7$ 1.0 × 10$^{-10}$ mol/min |
| raw material gas (B) | DESe 0~1.2 × 10$^{-5}$ mol/min |
| | DETe 0~1.0 × 10$^{-5}$ mol/min |
| | He 15 sccm |
| | H$_2$ 15 sccm |
| inner pressure | 0.5 Torr |
| power of activation energy | 200 W (microwave 2.45 GHz) |
| distance between activation chamber and liberation opening for gas from gas feed pipe | 5 cm |

TABLE 7

| | semiconductor film (1) | semiconductor film (2) (dopant) | adhesion | open-circuit voltage [Voc] | total evaluation |
|---|---|---|---|---|---|
| present invention | p-type ZnSe:H:Li | n-type ZnS(Al) | ⊚ | ⊚ | ⊚ |
| | | n-type ZnSe(Br) | ⊚ | ⊚ | ⊚ |
| | | n-type ZnO(In) | ⊚ | ⊚ | ⊚ |
| | n-type ZnSe:H:Al | p-type ZnTe(Cu) | ⊚ | ⊚ | ⊚ |
| | | p-type CdTe(Li) | ⊚ | ⊚ | ⊚ |
| | p-type ZnSe$_{1-x}$Te$_x$:H:Li | n-type ZnS(Al) | ⊚ | ⊚ | ⊚ |
| | | n-type ZnSe(Br) | ⊚ | ⊚ | ⊚ |

TABLE 7-continued

| | semiconductor film (1) | semiconductor film (2) (dopant) | adhesion | open-circuit voltage [Voc] | total evaluation |
|---|---|---|---|---|---|
| comparison | n-type ZnSe$_{1-x}$Te$_x$:H:Al p-type ZnTe(P) | n-type ZnO(In) | ◎ | ◎ | ◎ |
| | | p-type ZnTe(Cu) | ◎ | ◎ | ◎ |
| | | p-type CdTe(Li) | ◎ | ◎ | ◎ |
| | | n-type ZnS(Al) | ○ | x | Δ |
| | | n-type ZnSe(Br) | ○ | x | Δ |
| | | n-type ZnO(In) | Δ | x | x |

Note:
◎: excellent
○: good
Δ: practically acceptable
x: practically not acceptable

TABLE 8

Conditions for the preparation of n-type ZnSe:Al film (hereinafter referred to as "preparation method 1")

| A | DEZn | $1.0 \times 10^{-6}$ mol/min |
|---|---|---|
| | Ar | 10 sccm |
| | TEAl | $1.0 \times 10^{-9}$ mol/min |
| B | DESe | $1.5 \times 10^{-5}$ mol/min |
| | Ar | 15 sccm |

TABLE 9

Conditions for the preparation of p-type ZnSe:H:Li film (hereinafter referred to as "preparation method 2")

| A | DEZn | $1.0 \times 10^{-6}$ mol/min |
|---|---|---|
| | Ar | 10 sccm |
| | LiC$_3$H$_7$ | $1.2 \times 10^{-10}$ mol/min |
| B | DESe | $1.5 \times 10^{-5}$ mol/min |
| | Ar | 15 sccm |

TABLE 9-continued

Conditions for the preparation of p-type ZnSe:H:Li film (hereinafter referred to as "preparation method 2")

| | H$_2$ | 15 sccm |
|---|---|---|

TABLE 10

Conditions for the Preparation of n-type ZnSe:Al Film

| Ar | 10 sccm |
|---|---|
| TEAl | $1.0 \times 10^{-9}$ mol/min |

TABLE 11

Conditions for the preparation of p-type ZnSe:H:Li film (hereinafter referred to as "preparation method 3")

| Ar | 10 sccm |
|---|---|
| H$_2$ | 10 sccm |
| LiC$_3$H$_7$ | $1.3 \times 10^{-10}$ mol/min |

TABLE 12

Conditions for the preparation of n-type ZnS:Al film

| preparation method | raw material gas | | flow rate | inner pressure of film forming chamber | discharging power | film formation period |
|---|---|---|---|---|---|---|
| 4 | A | DEZn | $1.0 \times 10^{-6}$ mol/min | 0.5 Torr | 200 W | 10 minutes |
| | | Ar | 10 sccm | | | |
| | | TEAl | $1.2 \times 10^{-9}$ mol/min | | | |
| | B | H$_2$S | $5.0 \times 10^{-6}$ mol/min | | | |
| | | Ar | 15 sccm | | | |
| 5 | A | DEZn | $1.0 \times 10^{-6}$ mol/min | 1.0 Torr | 50 W | 10 minutes |
| | | Ar | 10 sccm | | | |
| | | TEAl | $1.1 \times 10^{-9}$ mol/min | | | |
| | B | H$_2$S | $5.0 \times 10^{-6}$ mol/min | | | |
| | | Ar | 15 sccm | | | |
| 6 | | Target: ZnS | — | 0.05 Torr | 300 W | 7 minutes |
| | A | TEAl | $1.0 \times 10^{-9}$ mol/min | | | |
| | | Ar | 10 sccm | | | |

TABLE 13

Conditions for the preparation of n-type ZnO:Al film

| preparation method | raw material gas | | flow rate | inner pressure of film forming chamber | discharging power | film formation period |
|---|---|---|---|---|---|---|
| 7 | A | DEZn | $1.0 \times 10^{-6}$ mol/min | 0.5 Torr | 200 W | 15 minutes |
| | | Ar | 10 sccm | | | |
| | | TEAl | $1.0 \times 10^{-9}$ mol/min | | | |
| | B | H$_2$O | $5.0 \times 10^{-6}$ mol/min | | | |
| | | Ar | 15 sccm | | | |
| 8 | A | DEZn | $1.0 \times 10^{-6}$ mol/min | 1.0 Torr | 50 W | 15 minutes |
| | | Ar | 10 sccm | | | |
| | | TEAl | $1.0 \times 10^{-9}$ mol/min | | | |
| | B | H$_2$O | $5.0 \times 10^{-6}$ mol/min | | | |
| | | Ar | 15 sccm | | | |
| 9 | | Target: ZnO | — | 0.05 Torr | 300 W | 10 minutes |
| | A | TEAl | $1.0 \times 10^{-9}$ mol/min | | | |

TABLE 13-continued

Conditions for the preparation of n-type ZnO:Al film

| preparation method | raw material gas | flow rate | inner pressure of film forming chamber | discharging power | film formation period |
|---|---|---|---|---|---|
| | Ar | 10 sccm | | | |

TABLE 14

| Sample No. | preparation method* | n-type semiconductor layer |
|---|---|---|
| 23 | 1 | ZnSe |
| 24 | 2 | ZnSe |
| 25 | 3 | ZnSe |
| 26 | 4 | ZnS |
| 27 | 7 | ZnO |

*No. of Example upon which the method depended

TABLE 15

Conditions for the preparation of p-type ZnSe:H:Li film

| | raw material gas | Sample No. 28 flow rate | Sample No. 29 flow rate | Sample No. 30 flow rate |
|---|---|---|---|---|
| A | DEZn | $1.0 \times 10^{-6}$ mol/min | $1.0 \times 10^{-6}$ mol/min | $1.0 \times 10^{-6}$ mol/min |
| | Ar | 10 sccm | 10 sccm | 10 sccm |
| | LiC$_3$H$_7$ | $1.1 \times 10^{-9}$ mol/min | $1.1 \times 10^{-9}$ mol/min | $1.2 \times 10^{-9}$ mol/min |
| B | DESe | $1.5 \times 10^{-5}$ mol/min | $1.5 \times 10^{-5}$ mol/min | $1.5 \times 10^{-5}$ mol/min |
| | Ar | 15 sccm | 15 sccm | 15 sccm |
| | H$_2$ | 1 sccm | 3 sccm | 300 sccm |

TABLE 16

| | | | characteristics | | | |
|---|---|---|---|---|---|---|
| Sample No. | semiconductor layer | preparation method | hydrogen (H) content in p-type ZnSe film [atomic %] | volume percentage of crystal grain [%] | open-circuit voltage under irradiation of AM-1 [volt] | output value under irradiation of AM-1 (using 400 mm interference filter) [relative value] | rate of change in conversion efficiency after irradiation of AM-1 for 10 hours [Δη/η0%] |
| 1 | p-type layer | 1 | 2.3 | 75 | 1.3 | 4.5 | 2 |
|   | n-type layer | 1 | | | | | |
| 2 | p-type layer | 2 | 3.0 | 70 | 1.2 | 4.3 | 4 |
|   | n-type layer | 2 | | | | | |
| 3 | p-type layer | 3 | 2.8 | 73 | 1.15 | 4.1 | 3 |
|   | n-type layer | 3 | | | | | |

TABLE 17

| | | | characteristics | | | | |
|---|---|---|---|---|---|---|---|
| Sample No. | semiconductor layer | preparation method | hydrogen (H) content in p-type ZnSe film [atomic %] | volume percentage of crystal grain [%] | open-circuit voltage under irradiation of AM-1 [volt] | output value under irradiation of AM-1 (using 400 mm interference filter) [relative value] | rate of change in conversion efficiency after irradiation of AM-1 for 10 hours [Δη/η0%] |
| 3 | p-type layer | 1 | 2.3 | 75 | 1.3 | 4.4 | 3 |
|   | n-type layer | 2 | | | | | |

TABLE 18

| | | | characteristics | | | | |
|---|---|---|---|---|---|---|---|
| Sample No. | semiconductor layer | preparation method | hydrogen (H) content in p-type ZnSe film [atomic %] | volume percentage of crystal grain [%] | open-circuit voltage under irradiation of AM-1 [volt] | output value under irradiation of AM-1 (using 400 mm interference filter) [relative value] | rate of change in conversion efficiency after irradiation of AM-1 for 10 hours [Δη/η0%] |
| 5 | p-type layer | 1 | 2.3 | 75 | 1.3 | 3.7 | 3 |
|   | n-type layer | 4 | | | | | |
| 6 | p-type layer | 1 | 2.3 | 75 | 1.15 | 2.9 | 4 |
|   | n-type layer | 5 | | | | | |
| 7 | p-type layer | 1 | 2.3 | 75 | 1.2 | 3.2 | 3 |
|   | n-type layer | 6 | | | | | |
| 8 | p-type layer | 2 | 3.0 | 70 | 1.1 | 2.4 | 4 |

TABLE 18-continued

| Sample No. | semiconductor layer | preparation method | hydrogen (H) content in p-type ZnSe film [atomic %] | volume percentage of crystal grain [%] | open-circuit voltage under irradiation of AM-1 [volt] | output value under irradiation of AM-1 (using 400 mm interference filter) [relative value] | rate of change in conversion efficiency after irradiation of AM-1 for 10 hours [$\Delta\eta/\eta 0\%$] |
|---|---|---|---|---|---|---|---|
| | n-type layer | 4 | | | | | |
| 9 | p-type layer | 2 | 3.0 | 70 | 1.15 | 2.6 | 4 |
| | n-type layer | 5 | | | | | |
| 10 | p-type layer | 2 | 3.0 | 70 | 1.1 | 2.5 | 4 |
| | n-type layer | 6 | | | | | |
| 11 | p-type layer | 3 | 2.8 | 73 | 1.2 | 2.7 | 4 |
| | n-type layer | 4 | | | | | |
| 12 | p-type layer | 3 | 2.8 | 73 | 1.1 | 2.4 | 4 |
| | n-type layer | 5 | | | | | |
| 13 | p-type layer | 3 | 2.8 | 73 | 1.1 | 2.5 | 4 |
| | n-type layer | 6 | | | | | |

TABLE 19

| Sample No. | semiconductor layer | preparation method | hydrogen (H) content in p-type ZnSe film [atomic %] | volume percentage of crystal grain [%] | open-circuit voltage under irradiation of AM-1 [volt] | output value under irradiation of AM-1 (using 400 mm interference filter) [relative value] | rate of change in conversion efficiency after irradiation of AM-1 for 10 hours [$\Delta\eta/\eta 0\%$] |
|---|---|---|---|---|---|---|---|
| 14 | p-type layer | 1 | 2.3 | 75 | 1.3 | 3.5 | 3 |
| | n-type layer | 7 | | | | | |
| 15 | p-type layer | 1 | 2.3 | 75 | 1.2 | 3.1 | 2 |
| | n-type layer | 8 | | | | | |
| 16 | p-type layer | 1 | 2.3 | 75 | 1.1 | 2.7 | 2 |
| | n-type layer | 9 | | | | | |
| 17 | p-type layer | 2 | 3.0 | 70 | 1.25 | 3.0 | 3 |
| | n-type layer | 7 | | | | | |
| 18 | p-type layer | 2 | 3.0 | 70 | 1.15 | 2.9 | 3 |
| | n-type layer | 8 | | | | | |
| 19 | p-type layer | 2 | 3.0 | 70 | 1.2 | 2.8 | 3 |
| | n-type layer | 9 | | | | | |
| 20 | p-type layer | 3 | 2.8 | 73 | 1.2 | 2.9 | 2 |
| | n-type layer | 7 | | | | | |
| 21 | p-type layer | 3 | 2.8 | 73 | 1.1 | 2.8 | 3 |
| | n-type layer | 8 | | | | | |
| 22 | p-type layer | 3 | 2.8 | 73 | 1.1 | 2.5 | 3 |
| | n-type layer | 9 | | | | | |

TABLE 20

| Sample No. | semiconductor layer | preparation method | hydrogen (H) content in p-type ZnSe film [atomic %] | volume percentage of crystal grain [%] | open-circuit voltage under irradiation of AM-1 [volt] | output value under irradiation of AM-1 (using 400 mm interference filter) [relative value] | rate of change in conversion efficiency after irradiation of AM-1 for 10 hours [$\Delta\eta/\eta 0\%$] |
|---|---|---|---|---|---|---|---|
| 23 | n-type layer | 1 | 2.3 | 75 | 1.3 | 4.0 | 1 |
| | p-type layer | 1 | | | | | |
| 24 | n-type layer | 2 | 3.0 | 70 | 1.2 | 3.5 | 4 |
| | p-type layer | 1 | | | | | |
| 25 | n-type layer | 3 | 2.8 | 73 | 1.15 | 3.3 | 4 |
| | p-type layer | 1 | | | | | |
| 26 | n-type layer | 4 | 2.3 | 75 | 1.2 | 3.4 | 4 |
| | p-type layer | 1 | | | | | |
| 27 | n-type layer | 7 | 2.3 | 75 | 1.2 | 3.5 | 4 |
| | p-type layer | 1 | | | | | |

TABLE 21

| Sample No. | semiconductor layer | preparation method | hydrogen (H) content in p-type ZnSe film [atomic %] | volume percentage of crystal grain [%] | open-circuit voltage under irradiation of AM-1 [volt] | output value under irradiation of AM-1 (using 400 mm interference filter) [relative value] | rate of change in conversion efficiency after irradiation of AM-1 for 10 hours [$\Delta\eta/\eta 0\%$] |
|---|---|---|---|---|---|---|---|
| 28 | p-type layer | 1 | 0.25 | 90 | 0.2 | 0.1 | 0 |
|    | n-type layer | 1 |      |    |     |     |    |
| 29 | p-type layer | 1 | 0.6  | 87 | 0.5 | 0.5 | 1 |
|    | n-type layer | 1 |      |    |     |     |    |
| 30 | p-type layer | 1 | 2.0  | 30 | 1.2 | 1.8 | 10 |
|    | n-type layer | 1 |      |    |     |     |    |
| 31 | p-type layer |   |      |    | 0.75| 1   | 40 |
|    | i-type layer |   |      |    |     |     |    |
|    | n-type layer |   |      |    |     |     |    |

TABLE 22

Conditions for the preparation of n-type ZnSe$_{1-x}$Te$_x$:Al film (hereinafter referred to as "preparation method 10")

| A | DEZn | $1.0 \times 10^{-6}$ mol/min |
|---|------|------|
|   | He   | 10 sccm |
|   | TEAl | $1.0 \times 10^{-9}$ mol/min |
| B | DESe | $3 \times 10^{-6}$ mol/min |
|   | DETe | $8 \times 10^{-6}$ mol/min |
|   | 15 sccm |  |

TABLE 23

Conditions for the preparation of p-type ZnSe$_{1-x}$Te$_x$:H:Li film (hereinafter referred to as "preparation method 11")

| A | DEZn | $1.0 \times 10^{-6}$ mol/min |
|---|------|------|
|   | He   | 10 sccm |
|   | LiC$_3$H$_7$ | $1.2 \times 10^{-10}$ mol/min |
| B | DESe | $3 \times 10^{-6}$ mol/min |
|   | DETe | $8 \times 10^{-6}$ mol/min |
|   | He   | 15 sccm |

TABLE 23-continued

Conditions for the preparation of p-type ZnSe$_{1-x}$Te$_x$:H:Li film (hereinafter referred to as "preparation method 11")

| H$_2$ | 15 sccm |
|---|---|

TABLE 24

Conditions for the preparation of n-type ZnSe$_{1-x}$Te$_x$:Al Film

| Ar | 10 sccm |
|---|---|
| TEAl | $1.0 \times 10^{-9}$ mol/min |

TABLE 25

Conditions for the preparation of p-type ZnSe:H:Li film (hereinafter referred to as "preparation method 12")

| Ar | 10 sccm |
|---|---|
| H$_2$ | 10 sccm |
| LiC$_3$H$_7$ | $1.3 \times 10^{-10}$ mol/min |

TABLE 26

Conditions for the preparation of n-type ZnS:Al film

| preparation method | raw material gas | | flow rate | inner pressure of film forming chamber | discharging power | film formation period |
|---|---|---|---|---|---|---|
| 13 | A | DEZn | $1.0 \times 10^{-6}$ mol/min | 0.5 Torr | 200 W | 10 minutes |
|    |   | Ar   | 10 sccm |  |  |  |
|    |   | TEAl | $1.2 \times 10^{-9}$ mol/min |  |  |  |
|    | B | H$_2$S | $5.0 \times 10^{-6}$ mol/min |  |  |  |
|    |   | Ar   | 15 sccm |  |  |  |
| 14 | A | DEZn | $1.0 \times 10^{-6}$ mol/min | 1.0 Torr | 50 W | 10 minutes |
|    |   | Ar   | 10 sccm |  |  |  |
|    |   | TEAl | $1.1 \times 10^{-9}$ mol/min |  |  |  |
|    | B | H$_2$S | $5.0 \times 10^{-6}$ mol/min |  |  |  |
|    |   | Ar   | 15 sccm |  |  |  |
| 15 | Target: ZnS | — |  | 0.05 Torr | 300 W | 7 minutes |
|    | A | TEAl | $1.0 \times 10^{-9}$ mol/min |  |  |  |
|    |   | Ar   | 10 sccm |  |  |  |

TABLE 27

Conditions for the preparation of n-type ZnO:Al film

| preparation method | raw material gas | | flow rate | inner pressure of film forming chamber | discharging power | film formation period |
|---|---|---|---|---|---|---|
| 16 | A | DEZn | $1.0 \times 10^{-6}$ mol/min | 0.5 Torr | 200 W | 15 minutes |
|    |   | Ar   | 10 sccm |  |  |  |
|    |   | TEAl | $1.0 \times 10^{-9}$ mol/min |  |  |  |
|    | B | H$_2$O | $5.0 \times 10^{-6}$ mol/min |  |  |  |
|    |   | Ar   | 15 sccm |  |  |  |
| 17 | A | DEZn | $1.0 \times 10^{-6}$ mol/min | 1.0 Torr | 50 W | 15 minutes |
|    |   | Ar   | 10 sccm |  |  |  |
|    |   | TEAl | $1.0 \times 10^{-9}$ mol/min |  |  |  |
|    | B | H$_2$O | $5.0 \times 10^{-6}$ mol/min |  |  |  |
|    |   | Ar   | 15 sccm |  |  |  |

TABLE 27-continued

| | Conditions for the preparation of n-type ZnO:Al film | | | | |
|---|---|---|---|---|---|
| preparation method | raw material gas | flow rate | inner pressure of film forming chamber | discharging power | film formation period |
| 18 | Target: ZnO<br>A TEAl<br>  Ar | —<br>$1.0 \times 10^{-9}$ mol/min<br>10 sccm | 0.05 Torr | 300 W | 10 minutes |

TABLE 28

| Sample No. | preparation method(*) | n-type semiconductor layer |
|---|---|---|
| 54 | 10 | ZnSe |
| 55 | 11 | ZnSe |
| 56 | 12 | ZnSe |
| 57 | 13 | ZnS |
| 58 | 18 | ZnO |

(*)No. of Example upon which the method depended

TABLE 29

| | Conditions for the preparation of p-type ZnSe:H:Li film | | |
|---|---|---|---|
| | | flow rate | |
| raw material gas | Sample No. 28 | Sample No. 29 | Sample No. 30 |
| A DEZn | $1.0 \times 10^{-6}$ mol/min | $1.0 \times 10^{-6}$ mol/min | $1.0 \times 10^{-6}$ mol/min |
|   Ar | 10 sccm | 10 sccm | 10 sccm |
|   $LiC_3H_7$ | $1.1 \times 10^{-9}$ mol/min | $1.1 \times 10^{-9}$ mol/min | $1.2 \times 10^{-9}$ mol/min |
| B DESe | $1.3 \times 10^{-6}$ mol/min | $1.3 \times 10^{-6}$ mol/min | $1.3 \times 10^{-6}$ mol/min |
|   DETe | $8 \times 10^{-6}$ mol/min | $8 \times 10^{-6}$ mol/min | $8 \times 10^{-6}$ mol/min |
|   Ar | 15 sccm | 15 sccm | 15 sccm |
|   $H_2$ | 1 sccm | 3 sccm | 300 sccm |

TABLE 30

| | Amounts of raw material gases to be introduced at the time of forming p-type $ZnSe_{1-x}Te_x$ film | | |
|---|---|---|---|
| | | flow rate | |
| raw material gas | Sample No. 63<br>$ZnSe_{0.8}Te_{0.2}$ | Sample No. 64<br>$ZnSe_{0.5}Te_{0.5}$ | Sample No. 65<br>ZnTe |
| A DEZn | $1.0 \times 10^{-6}$ mol/min | $1.0 \times 10^{-6}$ mol/min | $1.0 \times 10^{-6}$ mol/min |
|   He | 10 sccm | 10 sccm | 10 sccm |
|   $LiC_3H_7$ | $1.0 \times 10^{-9}$ mol/min | $1.0 \times 10^{-9}$ mol/min | $1.0 \times 10^{-9}$ mol/min |
| B DESe | $1.2 \times 10^{-5}$ mol/min | $1.5 \times 10^{-6}$ mol/min | 0 |
|   DETe | $2 \times 10^{-6}$ mol/min | $5 \times 10^{-6}$ mol/min | $1.0 \times 10^{-5}$ mol/min |
|   He | 15 sccm | 15 sccm | 15 sccm |
|   $H_2$ | 15 sccm | 15 sccm | 15 sccm |

TABLE 31

| Sample No. | semiconductor layer | preparation method | hydrogen (H) content in p-type $ZnSe_{1-x}Te_x$ film [atomic %] | volume percentage of crystal grain [%] | open-circuit voltage under irradiation of AM-1.5 [volt] | output value under irradiation of AM-1.5 (using 450 mm interference filter) [relative value] | rate of change in conversion efficiency after irradiation of AM-1.5 for 10 hours [Δη/ηo%] |
|---|---|---|---|---|---|---|---|
| 32 | p-type layer<br>n-type layer | 10<br>10 | 2.3 | 70 | 1.4 | 4.8 | 2 |
| 33 | p-type layer<br>n-type layer | 11<br>11 | 3.6 | 67 | 1.2 | 4.0 | 3 |
| 34 | p-type layer<br>n-type layer | 12<br>12 | 1.7 | 74 | 1.1 | 3.9 | 3 |

TABLE 32

| Sample No. | semiconductor layer | preparation method | hydrogen (H) content in p-type $ZnSe_{1-x}Te_x$ film [atomic %] | volume percentage of crystal grain [%] | open-circuit voltage under irradiation of AM-1.5 [volt] | output value under irradiation of AM-1.5 (using 450 mm interference filter) [relative value] | rate of change in conversion efficiency after irradiation of AM-1.5 for 10 hours [Δη/ηo%] |
|---|---|---|---|---|---|---|---|
| 35 | p-type layer | 10 | 2.3 | 70 | 1.4 | 4.0 | 2 |

TABLE 32-continued

| | | characteristics | | | | |
|---|---|---|---|---|---|---|
| Sample No. | semiconductor layer | preparation method | hydrogen (H) content in p-type $ZnSe_{1-x}Te_x$ film [atomic %] | volume percentage of crystal grain [%] | open-circuit voltage under irradiation of AM-1.5 [volt] | output value under irradiation of AM-1.5 (using 450 mm interference filter) [relative value] | rate of change in conversion efficiency after irradiation of AM-1.5 for 10 hours [Δη/ηo%] |
| | n-type layer | 11 | | | | | |

TABLE 33

| | | characteristics | | | | |
|---|---|---|---|---|---|---|
| Sample No. | semiconductor layer | preparation method | hydrogen (H) content in p-type $ZnSe_{1-x}Te_x$ film [atomic %] | volume percentage of crystal grain [%] | open-circuit voltage under irradiation of AM-1.5 [volt] | output value under irradiation of AM-1.5 (using 450 mm interference filter) [relative value] | rate of change in conversion efficiency after irradiation of AM-1.5 for 10 hours [Δη/ηo%] |
| 36 | p-type layer n-type layer | 10 13 | 2.3 | 70 | 1.4 | 3.5 | 3 |
| 37 | p-type layer n-type layer | 10 14 | 2.3 | 70 | 1.2 | 2.8 | 3 |
| 38 | p-type layer n-type layer | 10 15 | 2.3 | 70 | 1.2 | 3.0 | 3 |
| 39 | p-type layer n-type layer | 11 13 | 3.6 | 67 | 1.3 | 2.1 | 4 |
| 40 | p-type layer n-type layer | 11 14 | 3.6 | 67 | 1.2 | 2.3 | 3 |
| 41 | p-type layer n-type layer | 11 15 | 3.6 | 67 | 1.2 | 2.2 | 3 |
| 42 | p-type layer n-type layer | 12 13 | 1.7 | 74 | 1.2 | 2.6 | 4 |
| 43 | p-type layer n-type layer | 12 14 | 1.7 | 74 | 1.2 | 2.5 | 4 |
| 44 | p-type layer n-type layer | 12 15 | 1.7 | 74 | 1.1 | 2.0 | 4 |

TABLE 34

| | | characteristics | | | | |
|---|---|---|---|---|---|---|
| Sample No. | semiconductor layer | preparation method | hydrogen (H) content in p-type $ZnSe_{1-x}Te_x$ film [atomic %] | volume percentage of crystal grain [%] | open-circuit voltage under irradiation of AM-1.5 [volt] | output value under irradiation of AM-1.5 (using 450 mm interference filter) [relative value] | rate of change in conversion efficiency after irradiation of AM-1.5 for 10 hours [Δη/ηo%] |
| 45 | p-type layer n-type layer | 10 16 | 2.3 | 70 | 1.2 | 3.4 | 3 |
| 46 | p-type layer n-type layer | 10 17 | 2.3 | 70 | 1.2 | 4.1 | 4 |
| 47 | p-type layer n-type layer | 10 18 | 2.3 | 70 | 1.0 | 3.0 | 4 |
| 48 | p-type layer n-type layer | 11 16 | 3.6 | 67 | 1.3 | 3.5 | 4 |
| 49 | p-type layer n-type layer | 11 17 | 3.6 | 67 | 1.1 | 2.6 | 4 |
| 50 | p-type layer n-type layer | 11 18 | 3.6 | 67 | 1.2 | 3.0 | 3 |
| 51 | p-type layer n-type layer | 12 16 | 1.7 | 74 | 1.1 | 3.3 | 4 |
| 52 | p-type layer n-type layer | 12 17 | 1.7 | 74 | 1.2 | 3.4 | 3 |
| 53 | p-type layer n-type layer | 12 18 | 2.7 | 74 | 1.1 | 3.3 | 4 |

TABLE 35

| Sample No. | semiconductor layer | preparation method | hydrogen (H) content in p-type ZnSe$_{1-x}$Te$_x$ film [atomic %] | volume percentage of crystal grain [%] | open-circuit voltage under irradiation of AM-1.5 [volt] | output value under irradiation of AM-1.5 (using 450 mm interference filter) [relative value] | rate of change in conversion efficiency after irradiation of AM-1.5 for 10 hours [Δη/η₀%] |
|---|---|---|---|---|---|---|---|
| 54 | n-type layer | 10 | 2.3 | 70 | 1.4 | 4.1 | 4 |
|    | p-type layer | 10 |  |  |  |  |  |
| 55 | n-type layer | 11 | 2.3 | 70 | 1.1 | 4.2 | 3 |
|    | p-type layer | 11 |  |  |  |  |  |
| 56 | n-type layer | 12 | 1.7 | 74 | 1.2 | 3.6 | 4 |
|    | p-type layer | 12 |  |  |  |  |  |
| 57 | n-type layer | ·13 | 2.3 | 70 | 1.1 | 3.5 | 5 |
|    | p-type layer | 10 |  |  |  |  |  |
| 58 | n-type layer | 16 | 2.3 | 70 | 1.0 | 3.8 | 4 |
|    | p-type layer | 10 |  |  |  |  |  |

TABLE 36

| Sample No. | semiconductor layer | preparation method | hydrogen (H) content in p-type ZnSe$_{1-x}$Te$_x$ film [atomic %] | volume percentage of crystal grain [%] | open-circuit voltage under irradiation of AM-1.5 [volt] | output value under irradiation of AM-1.5 (using 450 mm interference filter) [relative value] | rate of change in conversion efficiency after irradiation of AM-1.5 for 10 hours [Δη/η₀%] |
|---|---|---|---|---|---|---|---|
| 59 | p-type layer | 10 | 0.2 | 90 | 0.2 | 0.1 | 0 |
|    | n-type layer | 10 |  |  |  |  |  |
| 60 | p-type layer | 10 | 0.5 | 86 | 0.6 | 0.6 | 1 |
|    | n-type layer | 10 |  |  |  |  |  |
| 61 | p-type layer | 10 | 10 | 30 | 1.1 | 1.7 | 15 |
|    | n-type layer | 10 |  |  |  |  |  |
| 62 | p-type layer |  |  |  | 0.8 | 1 | 39 |
|    | i-type layer |  |  |  |  |  |  |
|    | n-type layer |  |  |  |  |  |  |

TABLE 37

| Sample No. | semiconductor layer | preparation method | hydrogen (H) content in p-type ZnSe$_{1-x}$Te$_x$ film [atomic %] | volume percentage of crystal grain [%] | open-circuit voltage under irradiation of AM-1.5 [volt] | output value under irradiation of AM-1.5 (using 450 mm interference filter) [relative value] | rate of change in conversion efficiency after irradiation of AM-1.5 for 10 hours [Δη/η₀%] |
|---|---|---|---|---|---|---|---|
| 63 | p-type layer ZnSe$_{0.8}$Te$_{0.2}$ | 1 | 2.0 | 58 | 1.2 | 0.8 | 20 |
|    | n-type layer ZnSe$_{0.2}$Te$_{0.8}$ | 1 |  |  |  |  |  |
| 64 | p-type layer ZnSe$_{0.5}$Te$_{0.5}$ | 1 | 2.1 | 46 | 0.8 | 0.7 | 25 |
|    | n-type layer ZnSe$_{0.2}$Te$_{0.8}$ | 1 |  |  |  |  |  |
| 65 | p-type layer ZnTe | 1 | 2.0 | 58 | 0.7 | 0.8 | 20 |
|    | n-type layer ZnSe$_{0.2}$Te$_{0.8}$ | 1 |  |  |  |  |  |

TABLE 38

Conditions for the preparation of n-type ZnSe$_{1-x}$Te$_x$:Al film (hereinafter referred to as "preparation method 19")

| A | DEZn | $1.0 \times 10^{-6}$ mol/min |
|---|---|---|
|   | He | 10 sccm |
|   | TEAl | $1.0 \times 10^{-9}$ mol/min |
| B | DESe | $3 \times 10^{-6}$ mol/min |
|   | DETe | $8 \times 10^{-6}$ mol/min |
|   | He | 15 sccm |
|   | H$_2$ | 15 sccm |

TABLE 39

Conditions for the preparation of p-type ZnSe:H:Li film (hereinafter referred to as "preparation method 20")

| A | DEZn | $1.0 \times 10^{-6}$ mol/min |
|---|---|---|
|   | He | 10 sccm |
|   | TEAl | $1.2 \times 10^{-10}$ mol/min |
| B | DESe | $1.5 \times 10^{-5}$ mol/min |
|   | He | 15 sccm |
|   | H$_2$ | 15 sccm |

TABLE 40

Conditions for the preparation of n-type $ZnSe_{1-x}H{:}Al$ film

| | |
|---|---|
| Ar | 10 sccm |
| $H_2$ | 10 sccm |
| TEAl | $1.0 \times 10^{-9}$ mol/min |

TABLE 41

Conditions for the preparation of p-type ZnSe:H:Li film

| | |
|---|---|
| Ar | 10 sccm |
| $H_2$ | 10 sccm |
| $LiC_3H_7$ | $1.3 \times 10^{-10}$ mol/min |

TABLE 42

Conditions for the preparation of p-type ZnSe:H:Li film

| raw material gas | | Sample No. 72 | Sample No. 73 | Sample No. 74 |
|---|---|---|---|---|
| A | DEZn | $1.0 \times 10^{-6}$ mol/min | $1.0 \times 10^{-6}$ mol/min | $1.0 \times 10^{-6}$ mol/min |
| | Ar | 10 sccm | 10 sccm | 10 sccm |
| | $LiC_3H_7$ | $1.1 \times 10^{-9}$ mol/min | $1.1 \times 10^{-9}$ mol/min | $1.2 \times 10^{-9}$ mol/min |
| B | DESe | $1.5 \times 10^{-5}$ mol/min | $1.5 \times 10^{-5}$ mol/min | $1.5 \times 10^{-5}$ mol/min |
| | Ar | 15 sccm | 15 sccm | 15 sccm |
| | $H_2$ | 1 sccm | 3 sccm | 300 sccm |

TABLE 43

Conditions for the preparation of p-type $ZnSe_{1-x}Te_x{:}H{:}Li$ film

| raw material gas | | Sample No. 76 | Sample No. 77 | Sample No. 78 |
|---|---|---|---|---|
| A | DEZn | $1.0 \times 10^{-6}$ mol/min | $1.0 \times 10^{-6}$ mol/min | $1.0 \times 10^{-6}$ mol/min |
| | Ar | 10 sccm | 10 sccm | 10 sccm |
| | $LiC_3H_7$ | $1.1 \times 10^{-9}$ mol/min | $1.1 \times 10^{-9}$ mol/min | $1.2 \times 10^{-9}$ mol/min |
| B | DESe | $3 \times 10^{-6}$ mol/min | $3 \times 10^{-6}$ mol/min | $3 \times 10^{-6}$ mol/min |
| | DETe | $8 \times 10^{-6}$ mol/min | $8 \times 10^{-6}$ mol/min | $8 \times 10^{-6}$ mol/min |
| | Ar | 15 sccm | 15 sccm | 15 sccm |
| | $H_2$ | 1 sccm | 3 sccm | 300 scm |

TABLE 44

Amounts of raw material gases to be introduced at the time of forming p-type $ZnSe_{1-x}Te_x$ film

| raw material gas | | Sample No. 79 $ZnSe_{0.8}Te_{0.2}$ | Sample No. 80 $ZnSe_{0.5}Te_{0.5}$ | Sample No. 81 ZnTe |
|---|---|---|---|---|
| A | DEZn | $1.0 \times 10^{-6}$ mol/min | $1.0 \times 10^{-6}$ mol/min | $1.0 \times 10^{-6}$ mol/min |
| | He | 10 sccm | 10 sccm | 10 sccm |
| | $LiC_3H_7$ | $1.0 \times 10^{-9}$ mol/min | $1.0 \times 10^{-9}$ mol/min | $1.0 \times 10^{-9}$ mol/min |
| B | DESe | $1.2 \times 10^{-5}$ mol/min | $7.5 \times 10^{-6}$ mol/min | 0 |
| | DETe | $2 \times 10^{-6}$ mil/min | $5 \times 10^{-6}$ mol/min | $1.0 \times 10^{-5}$ mol/min |
| | He | 15 sccm | 15 sccm | 15 sccm |
| | $H_2$ | 15 sccm | 15 sccm | 15 sccm |

TABLE 45

| Sample No. | semiconductor layer | preparation method | hydrogen (H) content in p-type $ZnSe_{1-x}Te_x$ film [atomic %] | volume percentage of crystal grain [%] | open-circuit voltage under irradiation of AM-1.5 [volt] | output value under irradiation of AM-1.5 (using) 450 mm interference filter) [relative value] | rate of change in conversion efficiency after irradiation of AM-1.5 for 10 hours [$\Delta\eta/\eta o\%$] |
|---|---|---|---|---|---|---|---|
| 66 | p-type layer | 19 | 2.3 | 75 | 1.4 | 5.2 | 3 |
| | n-type layer | 19 | 2.0 | 80 | | | |
| 67 | p-type layer | 20 | 3.0 | 70 | 1.3 | 5.0 | 2 |
| | n-type layer | 20 | 3.0 | 75 | | | |
| 68 | p-type layer | 21 | 2.8 | 73 | 1.3 | 4.9 | 4 |
| | n-type layer | 21 | 2.0 | 80 | | | |

TABLE 46

| Sample No. | semiconductor layer | preparation method | hydrogen (H) content in p-type $ZnSe_{1-x}Te_x$ film [atomic %] | volume percentage of crystal grain [%] | open-circuit voltage under irradiation of AM-1.5 [volt] | output value under irradiation of AM-1.5 (using) 450 mm interference filter) [relative value] | rate of change in conversion efficiency after irradiation of AM-1.5 for 10 hours [$\Delta\eta/\eta o\%$] |
|---|---|---|---|---|---|---|---|
| 69 | p-type layer | 19 | 2.3 | 75 | 1.4 | 5.1 | 3 |

TABLE 46-continued

| | | | characteristics | | | | |
|---|---|---|---|---|---|---|---|
| Sample No. | semiconductor layer | preparation method | hydrogen (H) content in p-type $ZnSe_{1-x}Te_x$ film [atomic %] | volume percentage of crystal grain [%] | open-circuit voltage under irradiation of AM-1.5 [volt] | output value under irradiation of AM-1.5 (using 450 mm interference filter) [relative value] | rate of change in conversion efficiency after irradiation of AM-1.5 for 10 hours [$\Delta\eta/\eta_0\%$] |
| | n-type layer | 20 | 3.0 | 75 | | | |
| 70 | n-type layer | 19 | 2.0 | 80 | 1.5 | 5.3 | 3 |
| | p-type layer | 19 | 2.3 | 75 | | | |
| 71 | n-type layer | 19 | 2.2 | 85 | 1.4 | 5.2 | 3 |
| | p-type layer | 19 | 2.3 | 70 | | | |

TABLE 47

| | | | characteristics | | | | |
|---|---|---|---|---|---|---|---|
| Sample No. | semiconductor layer | preparation method | hydrogen (H) content in p-type $ZnSe_{1-x}Te_x$ film [atomic %] | volume percentage of crystal grain [%] | open-circuit voltage under irradiation of AM-1.5 [volt] | output value under irradiation of AM-1.5 (using 450 mm interference filter) [relative value] | rate of change in conversion efficiency after irradiation of AM-1.5 for 10 hours [$\Delta\eta/\eta_0\%$] |
| 72 | p-type layer | 19 | 0.25 | 90 | 0.3 | 0.1 | 0 |
| | n-type layer | 19 | 2.0 | 80 | | | |
| 73 | p-type layer | 19 | 0.6 | 87 | 0.4 | 0.3 | 1 |
| | n-type layer | 19 | 2.0 | 80 | | | |
| 74 | p-type layer | 19 | 2.0 | 30 | 1.3 | 2.0 | 10 |
| | n-type layer | 19 | 2.0 | 80 | | | |
| 75 | p-type layer i-type layer n-type layer | | | | 0.75 | 1 | 40 |

TABLE 48

| | | | characteristics | | | | |
|---|---|---|---|---|---|---|---|
| Sample No. | semiconductor layer | preparation method | hydrogen (H) content in p-type $ZnSe_{1-x}Te_x$ film [atomic %] | volume percentage of crystal grain [%] | open-cirucit voltage under irradiation of AM-1.5 [volt] | output value under irradiation of AM-1.5 (using 450 mm interference filter) [relative value] | rate of change in conversion efficiency after irradiation of AM-1.5 for 10 hours [$\Delta\eta/\eta_0\%$] |
| 76 | n-type layer | 19 | 2.0 | 80 | 0.2 | 0.2 | 2 |
| | p-type layer | 19 | 0.2 | 90 | | | |
| 77 | n-type layer | 19 | 2.0 | 80 | 0.5 | 0.5 | 2 |
| | p-type layer | 19 | 0.5 | 86 | | | |
| 78 | n-type layer | 19 | 2.0 | 80 | 1.1 | 1.6 | 12 |
| | p-type layer | 19 | 1.0 | 30 | | | |
| 79 | n-type layer | 19 | 2.0 | 80 | 1.2 | 0.9 | 20 |
| | p-type layer $ZnSe_{0.5}Te_{0.2}$ | 19 | 2.0 | 58 | | | |
| 80 | n-type layer | 19 | 2.0 | 80 | 0.9 | 0.6 | 20 |
| | p-type layer $ZnSe_{0.5}Te_{0.5}$ | 19 | 2.1 | 46 | | | |
| 81 | n-type layer p-type layer $Zne_{0.2}Te_{0.8}$ | 19 | 2.0 | 80 | 0.8 | 0.8 | 20 |

What is claimed is:

1. A photovoltaic element which generates photoelectromotive force by the contact of a p-type semiconductor layer with an n-type semiconductor layer, characterized in that one of said semiconductor layers is a film composed of zinc atoms, selenium atoms, and at least hydrogen atoms, said film containing a p-type or n-type doping agent, containing 1 to 4 atomic% of hydrogen atoms, and also containing crystal grains in a ratio of 65 to 85 vol% per unit volume, and the other of said semiconductor layers is film represented by the general formula ZnA, where A denotes an oxygen atom, sulfur atom, or selenium atom, or any one of the general formulas ZnTe, $ZnSe_{1-y}Te_y$ (where $0<y<1$), and CdTe.

2. A photovoltaic element set forth in claim 1, wherein said p-type doping agent is an element belonging to Group I or Group VA of the periodic table.

3. A photovoltaic element set forth in claim 2, wherein said p-type doping agent is lithium.

4. A photovoltaic element which generates photoelectromotive force by the contact of a p-type semiconductor layer with an n-type semiconductor layer, characterized in that one of said semiconductor layers is a film composed of zinc atoms, selenium atoms, tellurium atoms, and at least hydrogen atoms, said film containing a p-type or n-type doping agent, containing selenium atoms and tellurium atoms in a ratio of 1:9 to 3:7 in terms of number of atoms, containing 1 to 4 atomic% of hydrogen atoms, and also containing crystal grains in a ratio of 65 to 85 vol% per unit volume, and the other of said semiconductor layers is a film represented by the general formula ZnA, where A denotes an oxygen atom, sulfur atom, or selenium atom, or any one of the general formulas ZnTe, $ZnSe_{1-y}Te_y$ (where $0<y<1$), and CdTe.

5. A photovoltaic element set forth in claim 4, wherein said p-type doping agent is an element belonging to Group I or Group VA of the periodic table.

6. A photovoltaic element set forth in claim 5, wherein said p-type doping agent is lithium.

7. A photovoltaic element which generates photo-electromotive force by the contact of a p-type semiconductor layer and an n-type semiconductor layer, characterized in that one of said semiconductor layers is a film composed of zinc atoms, selenium atoms, and at least hydrogen atoms, said film containing a p-type or n-type doping agent, containing 1 to 4 atomic% of hydrogen atoms, and also containing crystal grains in a ratio of 65 to 85 vol% per unit volume, and the other of said semiconductor layers is a film composed of zinc atoms, selenium atoms, tellurium atoms, and at least hydrogen atoms, said film containing selenium atoms and tellurium atoms in a ratio of 1:9 to 3:7 in terms of number of atoms, and also containing crystal grains in a ratio of 65 to 85 vol% per unit volume.

8. A photovoltaic element set forth in claim 7, wherein said p-type doping agent is an element belonging to Group I or Group VA of the periodic table.

9. A photovoltaic element set forth in claim 8, wherein said p-type doping agent is lithium.

* * * * *

UNITED STATES PATENT AND TRADEMARK OFFICE
CERTIFICATE OF CORRECTION

PATENT NO. : 4,959,106

DATED : September 25, 1990

INVENTOR(S) : KATSUMI NAKAGAWA, ET AL.

Page 1 of 13

It is certified that error appears in the above-identified patent and that said Letters Patent is hereby corrected as shown below:

COLUMN 2

Line 53, "as grown" should read --as-grown--.
    Line 65, "resin These" should read --resin.  These--.

COLUMN 6

Line 8, "Group V" should read --Group VA--.
    Line 24, "Group V" should read --Group VA--.
    Line 33, "$ZbSe_{1-y}Te_y$" should read --$ZnSe_{1-y}Te_y$--.
    Line 59, "$10^{-1}$ $\Omega$-cm)," should read --$10^{-1}$ $\Omega$-cm,--.

COLUMN 7

Line 51, "these" should read --those--.

COLUMN 9

Line 14, "$LiCH_3H_7$," should read --$LiC_3H_7$--.

COLUMN 11

Line 27, "$10^{-1}$ $\Omega$-cm)," should read --$10^{-1}$ $\Omega$-cm,--.

COLUMN 12

Line 53, "deposited" should read --deposited.--.

COLUMN 13

Line 32, "of more," should read --or more--.

UNITED STATES PATENT AND TRADEMARK OFFICE
CERTIFICATE OF CORRECTION

PATENT NO. : 4,959,106
DATED : September 25, 1990
INVENTOR(S) : KATSUMI NAKAGAWA, ET AL.

It is certified that error appears in the above-identified patent and that said Letters Patent is hereby corrected as shown below:

COLUMN 14

Line 35, "bond." should read --bonds.--.

COLUMN 15

Line 43, "the-film" should read --the film--.

COLUMN 16

Line 10, "by side" should read --side by side--.
    Line 60, "ration between the" should be deleted.

COLUMN 18

Line 39, "setting up" should read --setting--.

COLUMN 20

Line 10, "$ZnSe_{1-x}Te_x:H:M$ film" should read --$ZnSe_{1-x}Te_x:H:Mp$ film--.
    Line 20, "Group IA" should read --Group VA--.
    Line 24, "50 to X $10^3$" should read --50 to 1 X $10^3$--.

COLUMN 22

Line 11, "$ZnSe_{1x}Te_x:H:M$" should read --$ZnSe_{1-x}Te_x:H:M$--.
    Line 13, "above mentioned" should read --above-mentioned--.
    Line 20, "al," should read --Al,--.
    Line 23, "band gap" should read --a band gap--.

UNITED STATES PATENT AND TRADEMARK OFFICE
CERTIFICATE OF CORRECTION

PATENT NO. : 4,959,106
DATED : September 25, 1990
INVENTOR(S) : KATSUMI NAKAGAWA, ET AL.

It is certified that error appears in the above-identified patent and that said Letters Patent is hereby corrected as shown below:

COLUMN 23

Line 44, "No," should read --Nb,--.

COLUMN 25

Line 8, "food" should read --good--.
    Line 23, "of less," should read --or less,--.

COLUMN 26

Line 22, "the" (second occurrence) should read --they--.
    Line 43, "i-to" should read --into--.

COLUMN 27

Line 8, "exitation" should read --excitation--.

COLUMN 28

Line 6, "ad" should read --aid--.
    Line 27, "gaseous" should read --a gaseous--.
    Line 37, "compound" should read --compounds--.

COLUMN 29

Line 14, "an" should read --and--.
    Line 22, "fi" should read --first--.
    Lines 25-26, "hydrogen are" should read
            --hydrogen gas are--.

UNITED STATES PATENT AND TRADEMARK OFFICE
CERTIFICATE OF CORRECTION

PATENT NO. : 4,959,106
DATED : September 25, 1990
INVENTOR(S) : KATSUMI NAKAGAWA, ET AL.

It is certified that error appears in the above-identified patent and that said Letters Patent is hereby corrected as shown below:

COLUMN 29

Line 29, "the of" should read --the amount of--.
Line 43, "in desired" should read --in a desired-- and "two of" should read --two targets of--.

COLUMN 30

Line 43, "raw material gases and (B)" should read --raw material gases (A) and (B)--.
Line 44, "the on" should read --the reaction on--.
Line 52, "such" should read --such as--.

COLUMN 31

Line 3, "part the" should read --part in the--.
Line 7, "ZeSe" should read --ZnSe--.
Line 16, "atoms" should read --atoms (H)--.
Line 51, "ionized" should read --are ionized--.
Line 64, "scope" should read --the scope--.

COLUMN 32

Line 47, "n-type" should read --an n-type--.
Line 52, "n-type" should read --the n-type--.

COLUMN 33

Line 2, "175° C." should read --was 175° C.--.
Line 13, "produced" should read --produced when--.

UNITED STATES PATENT AND TRADEMARK OFFICE
CERTIFICATE OF CORRECTION

PATENT NO. : 4,959,106
DATED : September 25, 1990
INVENTOR(S) : KATSUMI NAKAGAWA, ET AL.

It is certified that error appears in the above-identified patent and that said Letters Patent is hereby corrected as shown below:

COLUMN 33

Line 25, "thereon the" should read --thereon by the--.
    Line 48, "proper)y" should read --properly--.
    Line 55, "here" should read --there--.

COLUMN 34

Line 9, "resulting" should read --resultant--.
    Line 22, "holder" should read --holder 402--.
    Line 32, "was" should read --was kept--.

COLUMN 35

Line 23, "resulting" should read --resultant--.
    Line 54, "ah" should read --an--.
    Line 63, "eLement Of" should read --element of--.

COLUMN 36

Line 15, "resulting" should read --resultant--.
    Line 45, "resulting" should read --resultant--.
    Line 52, "photovaltaic" should read --photovoltaic--.
    Line 61, "$LiC_{3H}7$" should read --$LiC_3H_7$--.

COLUMN 37

Line 19, "then" should read --when--.
    Line 45, "evaluated" should read --evacuated--.
    Line 58, "below Into" should read --below. Into--.

UNITED STATES PATENT AND TRADEMARK OFFICE
CERTIFICATE OF CORRECTION

PATENT NO. : 4,959,106
DATED : September 25, 1990
INVENTOR(S) : KATSUMI NAKAGAWA, ET AL.

It is certified that error appears in the above-identified patent and that said Letters Patent is hereby corrected as shown below:

COLUMN 38

Line 5, "he ITO" should read --the ITO--.
Line 30, "$\nu_0$" should read --$\eta_0$--.
Line 49, "were" should read --when--.

COLUMN 39

Line 3, "element" should read --photovoltaic element--.
Line 5, "then" should read --when--.
Line 15, "by to" should be deleted.

COLUMN 40

Line 18, "deposited" should read --deposition--.
Line 25, "this the" should read --this way the--.
Line 26, "substrate re-" should read --substrate was--.
Line 51, "content" should read --content of--.

COLUMN 41

Line 21, "10 Torr," should read --1.0 Torr,--.
Line 28, "700 Å thick" should read --700 Å thick)--.
Line 38, "resulting" should read --resultant--.
Line 43, "$5 \times 10^{-5}$" should read -- $5 \times 10^{-3}$ --.
Line 56, "$ZnSe_{0.2}T_{0.8}$" should read --$ZnSe_{0.2}Te_{0.8}$--.
Line 63, "film-form" should read --film-forming--.

UNITED STATES PATENT AND TRADEMARK OFFICE
CERTIFICATE OF CORRECTION

PATENT NO. : 4,959,106

DATED : September 25, 1990

INVENTOR(S) : KATSUMI NAKAGAWA, ET AL.

It is certified that error appears in the above-identified patent and that said Letters Patent is hereby corrected as shown below:

COLUMN 42

Line 13, "ZnSe:H:Li" should read --$ZnSe_{1-x}Te_x$:H:Li--.
    Line 16, "resulting" should read --resultant--.
    Line 54, "ZnSe:H:Li" should read --$ZnSe_{1-x}Te_x$:H:Li--.
    Line 55, "silicon water" should read --silicon wafer--.
    Line 57, "resulting" should read --resultant--.

COLUMN 43

Line 10, "was obtained" should read --were obtained--.
    Line 25, "the" should read --The--.
    Line 58, "substrate of" should read --substrate instead of--.

COLUMN 44

Line 6, "evacuated" should read --evaluated--.
    Line 11, "resulting" should read --resultant--.
    Line 24, "in stead" should read --instead--.
    Line 56, "w]s" should read --was--.
    Line 59, "Samples No. 61" should read --Sample No. 61--.

COLUMN 45

Line 34, "$SiH_4$ gas and" should read --$SiH_4$ gas, $H_2$ gas, and--.
    Line 41, "collecting electrode 106" should read --Ag collecting electrode 106--.

UNITED STATES PATENT AND TRADEMARK OFFICE
CERTIFICATE OF CORRECTION

PATENT NO. : 4,959,106

DATED : September 25, 1990

INVENTOR(S) : KATSUMI NAKAGAWA, ET AL.

Page 8 of 13

It is certified that error appears in the above-identified patent and that said Letters Patent is hereby corrected as shown below:

COLUMN 45

Line 52, "element in" should read --element as shown in--.
    Line 54, "Example 12, that" should read --Example 12, except that--.
    Line 58, "the" should read --The--.
    Line 64, "the" should read --The--.
    Line 68, "the" should read --The--.

COLUMN 46

Line 2, "the" should be deleted.
    Line 14, "domains p-type" should read --domains in the p-type--.
    Line 18, "f" should read --of--.
    Line 27, "pn-junction" should read --pn-junction,--.
    Line 42, "$Zn_{1-x}Te_x:H:Li$" should read --$ZnSe_{1-x}Te_x:H:Li$--.
    Line 53, "hose" should read --those--.
    Line 57, "$Zn_{1-x}Te_x:H:Li$" should read --$ZnSe_{1-x}Te_x:H:Li$--.

COLUMN 47

Line 18, "first a" should read --first, a--.
    Line 38, "223 and 24," should read --223 and 224,--.
    Line 39, "He was" should read --He gas--.
    Line 49, "controlled" should read --controller--.

UNITED STATES PATENT AND TRADEMARK OFFICE
CERTIFICATE OF CORRECTION

PATENT NO. : 4,959,106
DATED : September 25, 1990
INVENTOR(S) : KATSUMI NAKAGAWA, ET AL.

It is certified that error appears in the above-identified patent and that said Letters Patent is hereby corrected as shown below:

COLUMN 48

Line 4, "$ZnSe_{1-x}:Te_xAl$" should read --$ZnSe_{1-x}:Te_x:H:Al$--.
    Line 6, "226" should read --224--.
    Line 62, Close up right margin.
    Line 63, Close up left margin.

COLUMN 49

Line 10, "$ZnSe_{1-x}Te_xH:Al$" should read --$ZnSe_{1-x}Te_x:H:Al$--.
    Line 42, "FIG." should read --FIG. 1(A)--.
    Line 43, "(A)" should be deleted.

COLUMN 50

Line 24, "p type" should read --p-type--.

COLUMN 51

Line 14, "resulting" should read --resultant--.

COLUMN 53

Line 14, "elements (1)" should read --elements. (1)--.
    Line 50, "words becomes" should read --words, becomes--.

COLUMN 54

Line 20, "or" should read --of--.

UNITED STATES PATENT AND TRADEMARK OFFICE
CERTIFICATE OF CORRECTION

PATENT NO. : 4,959,106
DATED : September 25, 1990
INVENTOR(S) : KATSUMI NAKAGAWA, ET AL.

It is certified that error appears in the above-identified patent and that said Letters Patent is hereby corrected as shown below:

COLUMN 60

TABLE 16, "mm interference" should read --nm interference-- and "$[\Delta\eta/\eta 0\%]$" should read --$[\Delta\eta/\eta_0\%]$--.

TABLE 17, "mm interference" should read --nm interference-- and "$[\Delta\eta/\eta 0\%]$" should read --$[\Delta\eta/\eta_0\%]$--.

TABLE 18, "mm interference" should read --nm interference-- and "$[\Delta\eta/\eta 0\%]$" should read --$[\Delta\eta/\eta_0\%]$--.

COLUMN 62

TABLE 18-continued, "mm interference" should read --nm interference-- and "$[\Delta\eta/\eta 0\%]$" should read --$[\Delta\eta/\eta_0\%]$--.

TABLE 19, "mm interference" should read --nm interference-- and "$[\Delta\eta/\eta 0\%]$" should read --$[\Delta\eta/\eta_0\%]$--.

TABLE 20, "mm interference" should read --nm interference-- and "$[\Delta\eta/\eta 0\%]$" should read --$[\Delta\eta/\eta_0\%]$--.

COLUMN 63

TABLE 22, "DETe     8 X $10^{-6}$ mol/min
          15 sccm"

should read --DETe     8 X $10^{-6}$ mol/min
             He       15 sccm--.

UNITED STATES PATENT AND TRADEMARK OFFICE
CERTIFICATE OF CORRECTION

PATENT NO. : 4,959,106
DATED : September 25, 1990
INVENTOR(S) : KATSUMI NAKAGAWA, ET AL.

It is certified that error appears in the above-identified patent and that said Letters Patent is hereby corrected as shown below:

COLUMN 64

TABLE 21, "mm interference" should read --nm interference-- and "$[\Delta\eta/\eta 0\%]$" should read --$[\Delta\eta/\eta_0\%]$--.

COLUMN 66

TABLE 31, "450 mm inter-" should read --450 nm inter- --.
TABLE 32, "450 mm inter-" should read --450 nm inter- --.

COLUMN 68

TABLE 32-continued, "450 mm inter-" should read --450 nm inter- --.
TABLE 33, "450 mm inter-" should read --450 nm inter- --.
TABLE 34, "450 mm inter-" should read --450 nm inter- --.

COLUMN 70

TABLE 35, "450 mm inter-" should read --450 nm inter- --.
TABLE 36, "450 mm inter-" should read --450 nm inter- --.
TABLE 37, "450 mm inter-" should read --450 nm inter- --.

COLUMN 72

TABLE 43, "Sample No. 76   Sample No. 77   Sample No. 78"

should read

| flow rate | | |
| --- | --- | --- |
| --Sample No. 76 | Sample No. 77 | Sample No. 78-- |

.

UNITED STATES PATENT AND TRADEMARK OFFICE
CERTIFICATE OF CORRECTION

PATENT NO. : 4,959,106

DATED : September 25, 1990

INVENTOR(S) : KATSUMI NAKAGAWA, ET AL.

It is certified that error appears in the above-identified patent and that said Letters Patent is hereby corrected as shown below:

COLUMN 72

TABLE 45, "450 mm inter-" should read --450 nm inter- --.
    TABLE 46, "450 mm inter-" should read --450 nm inter- --.

COLUMN 73

TABLE 48, "81    n-type layer    19    2.0    80
                          p-type layer
                          $Zne_{0.2}Te_{0.8}$  "        should read --81    n-type layer    19    2.0    80
                p-type layer    19    2.0    58
                $ZnSe_{0.2}Te_{0.8}$ --.

Line 66, "film" should read --a film--.

COLUMN 74

TABLE 46-continued, "450 mm inter-" should read
                        --450 nm inter- --.
    TABLE 47, "450 mm inter-" should read --450 nm inter- --.

UNITED STATES PATENT AND TRADEMARK OFFICE
CERTIFICATE OF CORRECTION

PATENT NO. : 4,959,106

DATED : September 25, 1990

INVENTOR(S) : KATSUMI NAKAGAWA, ET AL.

It is certified that error appears in the above-identified patent and that said Letters Patent is hereby corrected as shown below:

COLUMN 74

TABLE 48, "450 mm inter-" should read --450 nm inter- --.

Signed and Sealed this

Ninth Day of March, 1993

Attest:

STEPHEN G. KUNIN

Attesting Officer

Acting Commissioner of Patents and Trademarks